US006800173B2

(12) United States Patent
Chiang et al.

(10) Patent No.: US 6,800,173 B2
(45) Date of Patent: Oct. 5, 2004

(54) VARIABLE GAS CONDUCTANCE CONTROL FOR A PROCESS CHAMBER

(75) Inventors: Tony P. Chiang, Santa Clara, CA (US); Karl F. Leeser, San Jose, CA (US); Jeffrey A. Brown, San Francisco, CA (US); Jason E. Babcoke, Menlo Park, CA (US)

(73) Assignee: Novellus Systems, Inc., San Jose, CA (US)

( * ) Notice: Subject to any disclaimer, the term of this patent is extended or adjusted under 35 U.S.C. 154(b) by 206 days.

(21) Appl. No.: 09/902,080

(22) Filed: Jul. 9, 2001

(65) Prior Publication Data

US 2002/0076490 A1 Jun. 20, 2002

Related U.S. Application Data

(60) Provisional application No. 60/281,628, filed on Apr. 5, 2001, and provisional application No. 60/255,812, filed on Dec. 15, 2000.

(51) Int. Cl.[7] .......................... H05H 1/00; C23C 16/00
(52) U.S. Cl. ............................ 156/345.33; 156/345.51; 118/715; 118/728
(58) Field of Search ...................... 156/345.33, 345.51; 118/715, 728

(56) References Cited

U.S. PATENT DOCUMENTS

| | | | |
|---|---|---|---|
| 4,058,430 A | 11/1977 | Suntola et al. | |
| 4,389,973 A | 6/1983 | Suntola et al. | |
| 4,413,022 A | 11/1983 | Suntola et al. | |
| 5,091,207 A | 2/1992 | Tanaka | |
| 5,855,675 A | 1/1999 | Doering et al. | 118/719 |
| 5,879,459 A | 3/1999 | Gadgil et al. | 118/715 |
| 5,916,365 A | 6/1999 | Sherman | 117/92 |
| 5,972,430 A | 10/1999 | DiMeo, Jr. et al. | |
| 6,015,590 A | 1/2000 | Suntola et al. | |
| 6,174,377 B1 | 1/2001 | Doering et al. | 118/729 |
| 6,200,893 B1 | 3/2001 | Sneh | 438/685 |
| 6,210,486 B1 * | 4/2001 | Mizukami et al. | 118/728 |
| 6,342,277 B1 | 1/2002 | Sherman | |
| 6,383,955 B1 | 5/2002 | Matsuki et al. | |
| 2001/0048981 A1 | 12/2001 | Suzuki | |
| 2001/0050039 A1 | 12/2001 | Park | |

FOREIGN PATENT DOCUMENTS

| | | | |
|---|---|---|---|
| EP | 1 052 309 A2 | 10/2000 | |
| WO | 00/16377 | 3/2000 | |
| WO | WO 00/79576 A1 | 12/2000 | H01L/21/205 |

OTHER PUBLICATIONS

Peter Singer, Editor–in–chief, "Atomic Layer Deposition Targets Thin Films", Semiconductor International, Sep. 1999, (pp. 40).

(List continued on next page.)

*Primary Examiner*—Parviz Hassanzadeh
(74) *Attorney, Agent, or Firm*—Patent Law Group LLP; Brian D. Ogonowsky

(57) ABSTRACT

A deposition system in accordance with one embodiment of the present invention includes a process chamber, a stationary pedestal for supporting a substrate in the process chamber, and a moveable shield forming at least a portion of an enclosure defining the process chamber. Motion of the shield with respect to the stationary pedestal controls a variable gas conductance path for gases flowing through the process chamber thereby modulating the pressure of the process chamber with respect to an external volume. The moveable shield in accordance with an embodiment of the present invention may include several gas channel openings for introducing various process gases into the process chamber. In some embodiments, the moveable shield may alternatively or additionally include an interior cooling or heating channel for temperature control.

15 Claims, 40 Drawing Sheets

OTHER PUBLICATIONS

"Untra-thin films by atomic layer deposition", American Xtal Technology, Oct. 1999 (pp. 37).

S. M. Rossnagel, IBM Research, A. Sherman and F. Turner, Sherman and Associates, Plasma-enchanced atomic layer deposition of Ta and Ti for interconnect diffusion barriers, J. Vac. Sci. Technol. B 18(4), Jul./Aug. 2000, (pp. 2016–2020).

T. P. Chiang et al., "Ion-induced chemical vapor deposition of high purity Cu films at room temperature using a microwave discharge H atom beam source", *J.Vac.Sci.Technol. A* 15(5), Sep./Oct. 1997, pp 2677–2686.

T. P. Chiang et al. "Surfaced kinetic study of ion-induced chemical vapor deposition of copper for focused ion beam applications", *J.Vac.Sci.Technol. A* 15(6), Nov./Dec. 1997, pp 3104–3114.

K. A. Ashtiani et al., "A New Hollow-Cathode Magnetron Source for 0.10 μm Copper Applications", *Novellus Systems, Inc.*, San Jose, CA, date unknown, 3 pgs.

X. Chen et al., "Low temperature plasma-promoted chemical vapor deposition of tantalum from tantalum pentabromide for copper metallization", *J.Vac.Sci.Technol. B* 16(5), Sep./Oct. 1998, pp 2887–2980.

X. Chen et al., "Low temperature plasma-assisted chemical vapor deposition of tantalum nitride from tantalum pentabromide for copper metallization", *J.Vac.Sci.Technol. B* 17(1), Jan./Feb. 1999, pp 182–185.

P. Mårtensson, "Atomic Layer Epitaxy of Copper", *Comprehensive Summaries of Uppsala Dissertations from the Faculty of Science and Technology 421*, 1999, pp. 1–45, Acta Universitis Upsaliensis, Uppsala, Sweden.

P. Mårtensson et al., "Atomic Layer Epitaxy of Copper Tantalum", *Chemical Vapor Deposition*, 1997, pp. 45–50, vol. 3, No. 1.

M. Ritala et al., "Controlled Growth of TaN, $Ta_3N_5$, and $TaO_xN_y$ Thin Films by Atomic Layer Deposition", *Chemical Materials*, vol. 11, No. 7, 1999, American Chemical Society, pp 1712–1718.

Goto et al., "Atomic Layer Controlled Deposition of Silicon Nitride With Self-Limiting Mechanism", Appl. Phys. Lett (23) (Jun. 3, 1996) pp 3257–3259.

\* cited by examiner

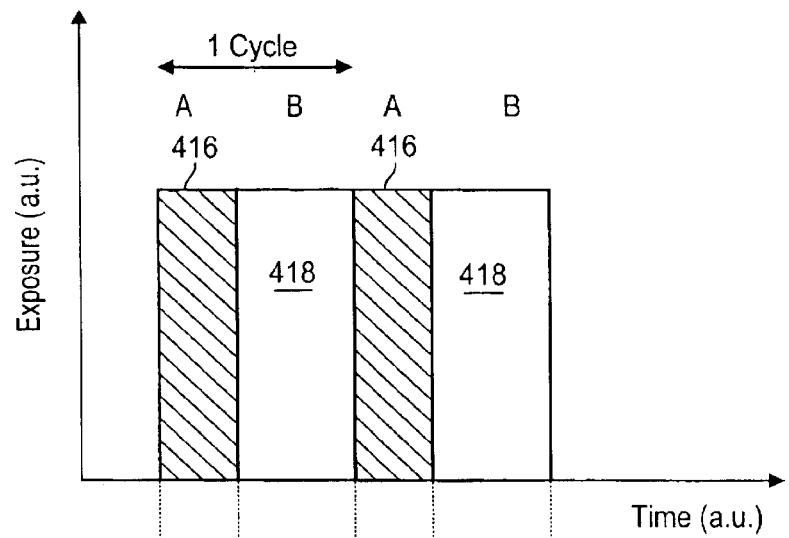
FIG. 37(a)
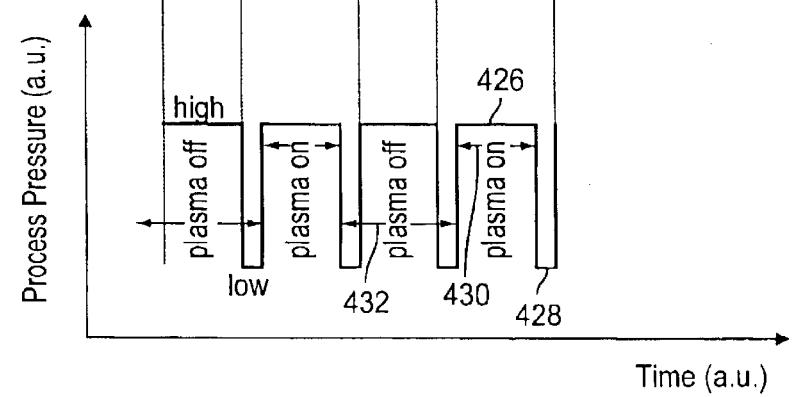
FIG. 37(b)
FIG. 37(c)

VARIABLE GAS CONDUCTANCE CONTROL FOR A PROCESS CHAMBER

CROSS-REFERENCE TO RELATED APPLICATIONS

This application claims priority from Provisional Application Ser. No. 60/281,628, entitled "A Reactor For Atomic Layer Deposition," filed Apr. 5, 2001 and claims benefit of Ser. No. 60/255,812 filed Dec. 15, 2000, incorporated herein by reference.

This application is also related to the following co-pending applications, which are incorporated herein by reference:

U.S. application Ser. No. 09/812,352, entitled "System And Method For Modulated Ion-Induced Atomic Layer Deposition (MII-ALD)," filed Mar. 19, 2001.

U.S. application Ser. No. 09/812,486, entitled "Continuous Method For Depositing A Film By Modulated Ion-Induced Atomic Layer Deposition (MII-ALD)," filed Mar. 19, 2001.

U.S. application Ser. No. 09/812,285, entitled "Sequential Method For Depositing A Film By Modulated Ion-Induced Atomic Layer Deposition (MII-ALD)," filed Mar. 19, 2001.

U.S. application Ser. No. 09/854,092, entitled "Method And Apparatus for Improved Temperature Control In Atomic Layer Deposition," filed May 10, 2001.

U.S. Provisional Application Ser. No. 60/255,812, entitled "Method For Integrated In-Situ Cleaning And Subsequent Atomic Layer Deposition Within A Single Processing Chamber," filed Dec. 15, 2000.

FIELD OF THE INVENTION

The present invention relates to advanced thin film deposition apparatus and methods used in semiconductor processing and related technologies.

BACKGROUND

As integrated circuit (IC) dimensions shrink, the ability to deposit conformal thin film layers with excellent step coverage at low deposition temperatures is becoming increasingly important. Thin film layers are used, for example, as MOSFET gate dielectrics, DRAM capacitor dielectrics, adhesion promoting layers, diffusion barrier layers, and seed layers for subsequent deposition steps. Low temperature processing is desired, for example, to prevent unwanted diffusion of shallow junctions, to better control certain reactions, and to prevent degradation of previously deposited materials and their interfaces.

The need for conformal thin film layers with excellent step coverage is especially important for high aspect ratio trenches and vias, such as those used in metallization layers of semiconductor chips. For example, copper interconnect technology requires a continuous thin film barrier layer and a continuous thin film copper seed layer to coat the surfaces of trenches and vias patterned in an insulating dielectric prior to filling the features with copper by electrochemical deposition (ECD or electroplating).

A highly conformal, continuous barrier layer is required to prevent copper diffusion into the adjacent semiconductor (i.e., silicon) material or dielectric. The barrier layer also often acts as an adhesion layer to promote adhesion between the dielectric and the copper seed layer. Low dielectric constant (i.e., low-k) dielectrics are typically used to reduce inter- and intra-line capacitance and cross-talk, but often suffer from poorer adhesion and lower thermal stability than traditional oxide dielectrics, making the choice of a suitable adhesion layer more critical. A non-conformal barrier layer, or one with poor step coverage or discontinuous step coverage, can lead to copper diffusion and current leakage between adjacent metal lines or to delamination at either the barrier-to-dielectric or barrier-to-seed layer interfaces, both of which adversely affect product lifetime and performance. The barrier layer should also be uniformly thin, to most accurately transfer the underlying trench and via sidewall profile to the subsequent seed layer, and have a low film resistivity (e.g., $\rho<500$ $\mu\Omega$-cm) to lessen its impact on the overall conductance of the copper interconnect structures.

A highly conformal, uniformly thin, continuous seed layer with low defect density is required to prevent void formation in the copper wires. The seed layer carries the plating current and acts as a nucleation layer. Voids can form from discontinuities or other defects in the seed layer, or they can form from pinch-off due to gross overhang of the seed layer at the top of features, both trenches and vias. Voids adversely impact the resistance, electromigration, and reliability of the copper lines, which ultimately affects the product lifetime and performance.

Traditional thin film deposition techniques, for example, physical vapor deposition (PVD) and chemical vapor deposition (CVD), are increasingly unable to meet the requirements of advanced thin films. PVD, such as sputtering, has been used for depositing conductive thin films at low cost and at relatively low substrate temperature. Unfortunately, PVD is inherently a line of sight process, resulting in poor step coverage in high aspect ratio trenches and vias. Advances in PVD technology to address this issue have resulted in high cost, complexity, and reliability issues. CVD processes can be tailored to provide conformal films with improved step coverage. Unfortunately, CVD processes often require high processing temperatures, result in the incorporation of high impurity concentrations, and have poor precursor (or reactant) utilization efficiency, leading to a high cost of ownership.

Atomic layer deposition (ALD), or atomic layer chemical vapor deposition (AL-CVD), is an alternative to traditional CVD methods to deposit very thin films. ALD has several advantages over PVD and traditional CVD. ALD can be performed at comparatively lower temperatures (which is compatible with the industry's trend toward lower temperatures), has high precursor utilization efficiency, can produce conformal thin film layers (i.e., 100% step coverage is theoretically possible), can control film thickness on an atomic scale, and can be used to "nano-engineer" complex thin films.

A typical ALD process differs significantly from traditional CVD processes. In a typical CVD process, two or more reactant gases are mixed together in the deposition chamber where either they react in the gas phase and deposit on the substrate surface, or they react on the substrate surface directly. Deposition by CVD occurs for a specified length of time, based on the desired thickness of the deposited film. Since this specified time is a function of the flux of reactants into the chamber, the required time may vary from chamber to chamber.

In a typical ALD process deposition cycle, each reactant gas is introduced sequentially into the chamber, so that no gas phase intermixing occurs. A monolayer of a first reactant is physi- or chemisorbed onto the substrate surface. Excess first reactant is pumped out, possibly with the aid of an inert purge gas. A second reactant is introduced to the deposition chamber and reacts with the first reactant to form a monolayer of the desired thin film via a self-limiting surface reaction. The self-limiting reaction halts once the initially adsorbed first reactant fully reacts with the second reactant. Excess second reactant is pumped out, again possibly with the aid of an inert purge gas. A desired film thickness is obtained by repeating the deposition cycle as necessary. The film thickness can be controlled to atomic layer (i.e., angstrom scale) accuracy by simply counting the number of deposition cycles.

Physisorbed precursors are only weakly attached to the substrate. Chemisorption results in a stronger, more desirable bond. Chemisorption occurs when adsorbed precursor molecules chemically react with active surface sites. Generally, chemisorption involves cleaving a weakly bonded ligand (a portion of the precursor) from the precursor, leaving an unsatisfied bond available for reaction with an active surface site.

The substrate material can influence chemisorption. In current dual damascene copper interconnect structures, a barrier layer such as tantalum (Ta) or tantalum nitride (TaN) must often simultaneously cover silicon dioxide ($SiO_2$), low-k dielectrics, nitride etch stops, and any underlying metals such as copper. Materials often exhibit different chemical behavior, especially oxides versus metals. In addition, surface cleanliness is important for proper chemisorption, since impurities can occupy surface bonding sites. Incomplete chemisorption can lead to porous films, incomplete step coverage, poor adhesion between the deposited films and the underlying substrate, and low film density.

The ALD process temperature must be selected carefully so that the first reactant is sufficiently adsorbed (e.g., chemisorbed) on the substrate surface, and the deposition reaction occurs with adequate growth rate and film purity. A temperature that is too high can result in desorption or decomposition (causing impurity incorporation) of the first reactant. A temperature that is too low may result in incomplete chemisorption of the first precursor, a slow or incomplete deposition reaction, no deposition reaction, or poor film quality (e.g., high resistivity, low density, poor adhesion, and/or high impurity content).

Traditional ALD processes have several disadvantages. First, since the process is entirely thermal, selection of an appropriate process temperature is often confined to a narrow temperature window. Second, the small temperature window limits the selection of available precursors. Third, metal precursors that fit the temperature window are often halides (e.g., compounds that include chlorine, flourine, or bromine), which are corrosive and can create reliability issues in metal interconnects. Fourth, either gaseous hydrogen ($H_2$) or elemental zinc (Zn) is often used as the second reactant to act as a reducing agent to bring a metal compound in the first reactant to the desired oxidation state of the final film. Unfortunately, $H_2$ is an inefficient reducing agent due to its chemical stability, and Zn has a low volatility and is generally incompatible with IC manufacturing. Thus, although conventional ALD reactors are suitable for elevated-temperature ALD, they limit the advancement of ALD processing technology.

Plasma-enhanced ALD, also called radical enhanced atomic layer deposition (REALD), was proposed to address the temperature limitations of traditional thermal ALD. For example, in U.S. Pat. No. 5,916,365, the second reactant passes through a radio frequency (RF) glow discharge, or plasma, to dissociate the second reactant and to form reactive radical species to drive deposition reactions at lower process temperatures. More information on plasma-enhanced ALD is included in "Plasma-enhanced atomic layer deposition of Ta and Ti for interconnect diffusion barriers," by S. M. Rossnagel, et al., Journal of Vacuum Science and Technology B 18(4) July/August 2000 pp. 2016–2020.

Plasma enhanced ALD, however, still has several disadvantages. First, it remains a thermal process similar to traditional ALD since the substrate temperature provides the required activation energy, and therefore the primary control, for the deposition reaction. Second, although processing at lower temperatures is feasible, higher temperatures must still be used to generate reasonable growth rates for acceptable throughput. Such temperatures are still too high for some films of interest in IC manufacturing, particularly polymer-based low-k dielectrics that are stable up to temperatures of only 200° C. or less. Third, metal precursors, particularly for tantalum (Ta), often still contain chlorine as well as oxygen impurities, which results in low density or porous films with poor barrier behavior and chemical instability. Fourth, the plasma enhanced ALD process, like the conventional sequential ALD process described above, is fundamentally slow since it includes at least two reactant gases and at least two purge or evacuation steps, which can take up to several minutes with conventional valve and chamber technology.

Conventional ALD reactors, including plasma enhanced ALD reactors, include a vertically-translatable pedestal to achieve a small process volume, which is important for ALD. A small volume is more easily and quickly evacuated (e.g., of excess reactants) than a large volume, enabling fast switching of process gases. Also, less precursor is needed for complete chemisorption during deposition. For example, the reactors of U.S. Pat. No. 6,174,377 and European Patent No. 1,052,309 A2 feature a reduced process volume located above a larger substrate transfer volume. In practice, a typical transfer sequence includes transporting a substrate into the transfer volume and placing it on top of a moveable pedestal. The pedestal is then elevated vertically to form the bottom of the process volume and thereby move the substrate into the process volume. Thus, the moveable pedestal has at least a vertical translational and possibly a second rotational degree of freedom (for high temperature process uniformity).

Typical ALD reactors have significant disadvantages. First, conventional ALD reactors suffer from complex pedestal requirements, since the numerous facilities (e.g., heater power lines, temperature monitor lines, and coolant channels) must be connected to and housed within a pedestal that moves. Second, in the case of plasma enhanced ALD, the efficiency of radical delivery for deposition of conductive thin films is significantly decreased in downstream configurations in which the radical generating plasma is contained in a separate vessel remote from the main process chamber (see U.S. Pat. No. 5,916,365). Both gas phase and wall recombinations reduce the flux of useful radicals to the substrate. In the case of atomic hydrogen (H), recombination results in diatomic $H_2$, a far less effective reducing agent. Other disadvantages of known ALD reactors exist.

Accordingly, improved ALD reactors are desirable to make ALD better suited for commercial IC manufacturing. Desirable characteristics of such reactors might include higher throughput, improved deposited film characteristics, better temperature control for narrow process temperature windows, and wider processing windows (e.g., in particular with respect to process temperature and reactant species).

SUMMARY

A deposition system in accordance with one embodiment of the present invention includes a process chamber, a stationary pedestal for supporting a substrate in the process chamber, and a moveable shield forming at least a portion of an enclosure defining the process chamber. Motion of the shield with respect to the stationary pedestal controls a variable gas conductance path for gases flowing through the process chamber thereby modulating the pressure of the process chamber with respect to an external volume. The moveable shield in accordance with an embodiment of the present invention may include several gas channel openings for introducing various process gases into the process chamber. In some embodiments, the moveable shield may alternatively or additionally include an interior cooling or heating channel for temperature control.

The stationary pedestal in accordance with an embodiment of the present invention may include an electrostatic chuck for improved coupling of RF power to the substrate, enabling improved ion generation, ion energy control, and uniform delivery of ions. Additionally, the use of an electrostatic chuck in conjunction with a suitable gas medium inserted in the region between the electrostatic chuck and the substrate provides improved temperature control and uniformity.

The deposition system may be a portion of a reactor for atomic layer deposition of barrier layers, adhesion layers, seed layers, low dielectric constant (low-k) films, high dielectric constant (high-k) films, and other thin films used in advanced integrated circuit fabrication technologies.

A deposition system in accordance with an embodiment of the present invention provides several advantages. The system allows triggering of the deposition reaction by a non-thermal mechanism, leading to higher quality films deposited at lower temperatures. The deposition process parameters, including pressure during processing, can be modulated quickly and more efficiently than is conventionally possible, leading to self-synchronization of the deposition and higher throughput. By coupling RF power to the stationary pedestal, the system allows improved ion generation, ion energy control, ion spatial uniformity, and uniform ion delivery for modulated, ion-induced deposition. The stationary pedestal/moveable shield configuration simplifies the overall system design. Compared to conventional, heavy, moveable pedestals, a shield in one embodiment of the present invention can be quickly and precisely positioned by a linear motor for improved performance. The system allows gas introduction through multiple points, possibly including through the shield, which increases the flexibility of deposition process design. In addition, a smaller total system volume is achievable with the stationary pedestal/moveable shield configuration.

These and other aspects and features of the disclosed embodiments will be better understood in view of the following detailed description of the exemplary embodiments and the drawings thereof.

BRIEF DESCRIPTION OF THE DRAWINGS

FIG. 37 shows timing diagrams for an alternative embodiment of a novel ALD process.

In the drawings, like or similar features are typically labeled with the same reference numbers.

DETAILED DESCRIPTION OF THE EMBODIMENTS

Basic ALD Reactor Design

Figure 1:
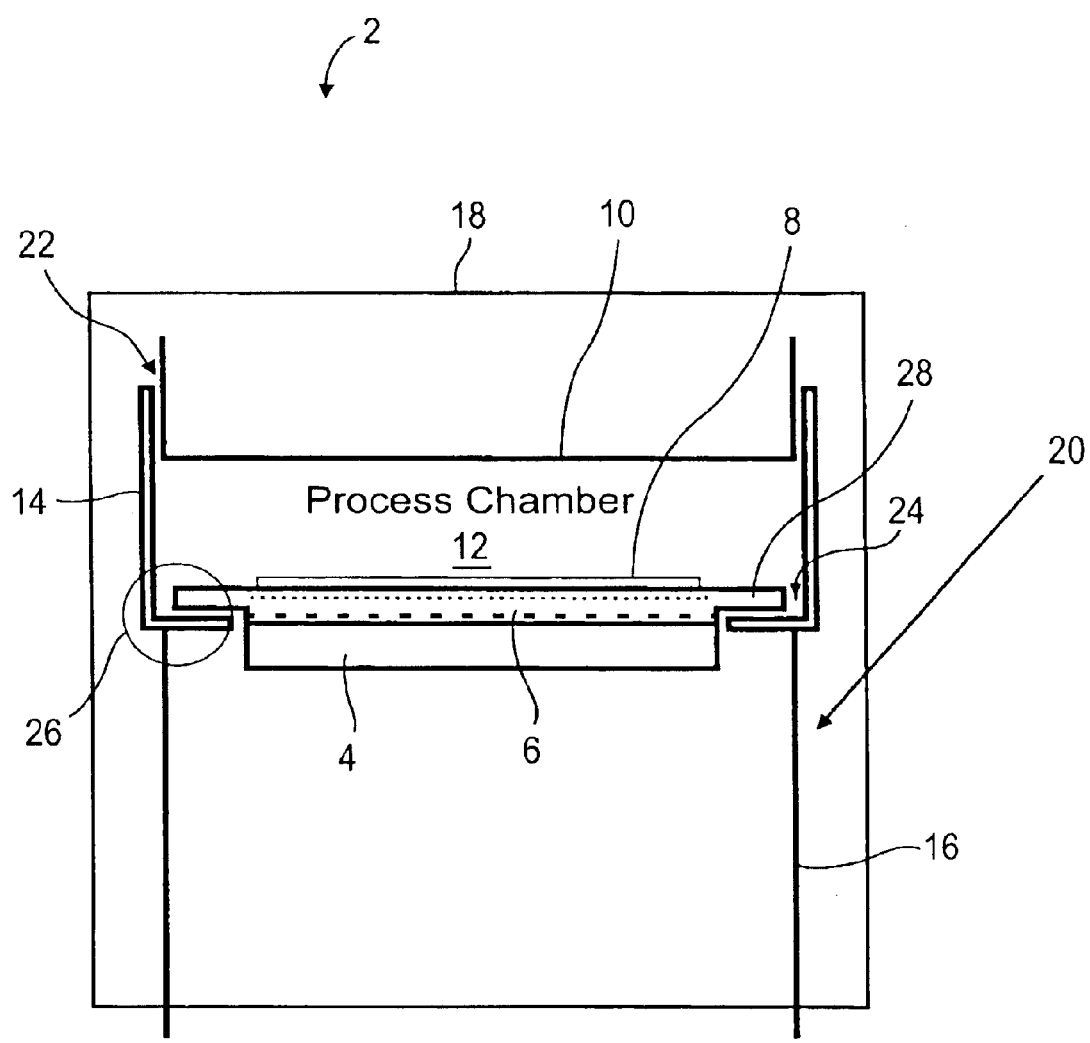
FIG. 1 is a schematic diagram of a novel ALD reactor.
Figure 2A:
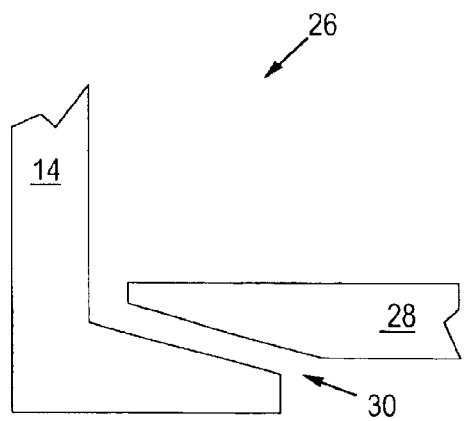
FIG. 2 shows various embodiments of the shield and shadow ring overlap region of FIG. 1.
Figure 2B:
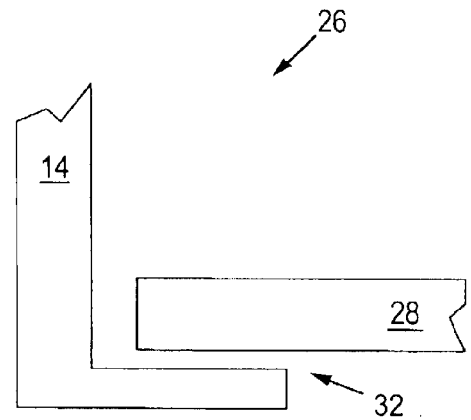
Figure 2C:
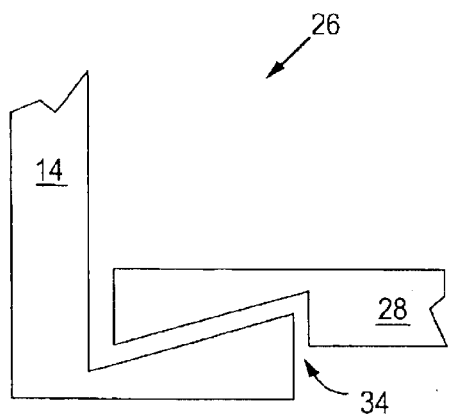
Figure 2D:
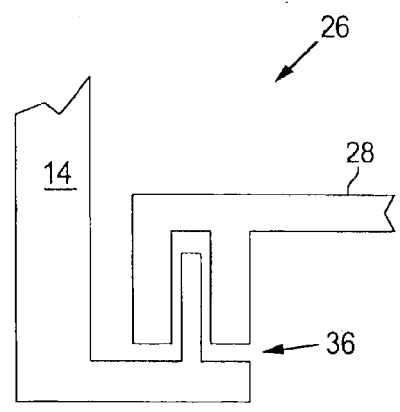

FIG. 1 is a schematic diagram of a novel ALD reactor 2. Reactor 2 includes a stationary pedestal 4, which may include an electrostatic chuck (ESC) 6 on top of which a substrate 8 rests. Substrate 8 is usually a semiconductor wafer (e.g., silicon), but may be a metallized glass substrate or other substrate. A chamber lid 10 and ESC 6 define the top and bottom boundaries, respectively, of a process chamber 12. The surrounding wall of chamber 12 is defined by a moveable shield 14, which is attached to a plurality of shield support legs 16. The volume of process chamber 12 is smaller than prior art batch reactors, but may be similar in size to prior art single wafer systems. The configuration of reactor 2, however, provides an overall volume of reactor 2 that can be smaller than that of prior art reactors, while providing the small volume of process chamber 12.

The small volume of process chamber 12 achieves the advantages of small process volumes discussed above, including quick evacuation, fast switching of process gases, and less precursor required for complete chemisorption. The volume of process chamber 12 cannot be made arbitrarily small, however, since substrate 8 must still be transferred into, and out of, process chamber 12.

In FIG. 1, the fixed position of pedestal 4, including its supporting hardware, simplifies overall design of reactor 2, allowing ease of use and maintenance as well as improved performance. In comparison to massive moveable pedestals in prior art reactors, shield 14 includes less associated hardware and is much lighter, which allows precision positioning of shield 14 to adjust the conductance of, and facilitate pumping of, chamber 12 with rapid response.

A chamber body 18 surrounds shield 14, chamber lid 10, and pedestal 4 (including ESC 6), defining an annular pumping channel 20 exterior to shield 14. During processing, shield 14 separates process chamber 12, at low pressure, from annular pumping channel 20, which is maintained at a lower pressure than the chamber to maintain a clean background ambient in reactor 2. The volume of chamber 12 is coupled to annular pumping channel 20 via a shield conductance upper path 22 and a shield conductance lower path 24. Upper path 22 and lower path 24 are each defined by portions of shield 14 and corresponding features of stationary components of reactor 2. In the embodiment shown in FIG. 1, upper path 22, typically a variable low leakage path during processing, is bounded by an inner wall of shield 14 and chamber lid 10. Lower path 24, a variable high leakage path through a shield and shadow ring overlap region 26, is bounded by a portion of shield 14 and a shadow ring 28. Shadow ring 28 is actually separate from ESC 6 and is shown in greater detail in subsequent figures.

The structures of shield 14 and shadow ring 28 may vary to provide different conductances of lower path 24 as shown in FIG. 2, which shows various embodiments of the shield and shadow ring overlap region 26 of FIG. 1. The conductance of a flow path is related to the length of the restriction as well as the physical dimensions of the path. For example, a shorter path with a large cross-sectional area has a higher conductance. For the embodiments shown in FIG. 2, the structural configurations of shield 14 and shadow ring 28 result in a highest conductance path 30, a second highest conductance path 32, a third highest conductance path 34, and a lowest conductance path 36. Practitioners in the art will appreciate that many other embodiments of shield and shadow ring overlap region 26 are possible.

Various shield positions are employed throughout a novel ALD process. Raising shield 14 to its highest position (along with shadow ring 28) allows for introduction or removal of substrate 8. Dropping shield 14 to its lowest position allows rapid evacuation of chamber 12 via upper path 22 by exposure to the vacuum of annular pumping region 20. Shield 14 is positioned at intermediate positions during processing depending on gas delivery and conductance requirements.

The motion of shield 14 can be used to precisely control the spatial relationship between shield 14 and shadow ring 28, thereby providing a tunable conductance for chamber 12 primarily via lower path 24. This allows quick, precise control of the pressure in chamber 12, even during processing, which is not possible in prior art methods that employ a moveable pedestal since vertical motion of substrate 8 is undesirable during processing. The tunable conductance also allows quick, precise control of the residence time of gases introduced to chamber 12 for multiple flow rates, and it allows minimal waste of process gases.

Basic Gas Introduction to an ALD Reactor

Reactor 2 of FIG. 1 supports gas introduction through multiple points, including top introduction, side introduction, or a combination of both top and side introductions.

Figure 3:
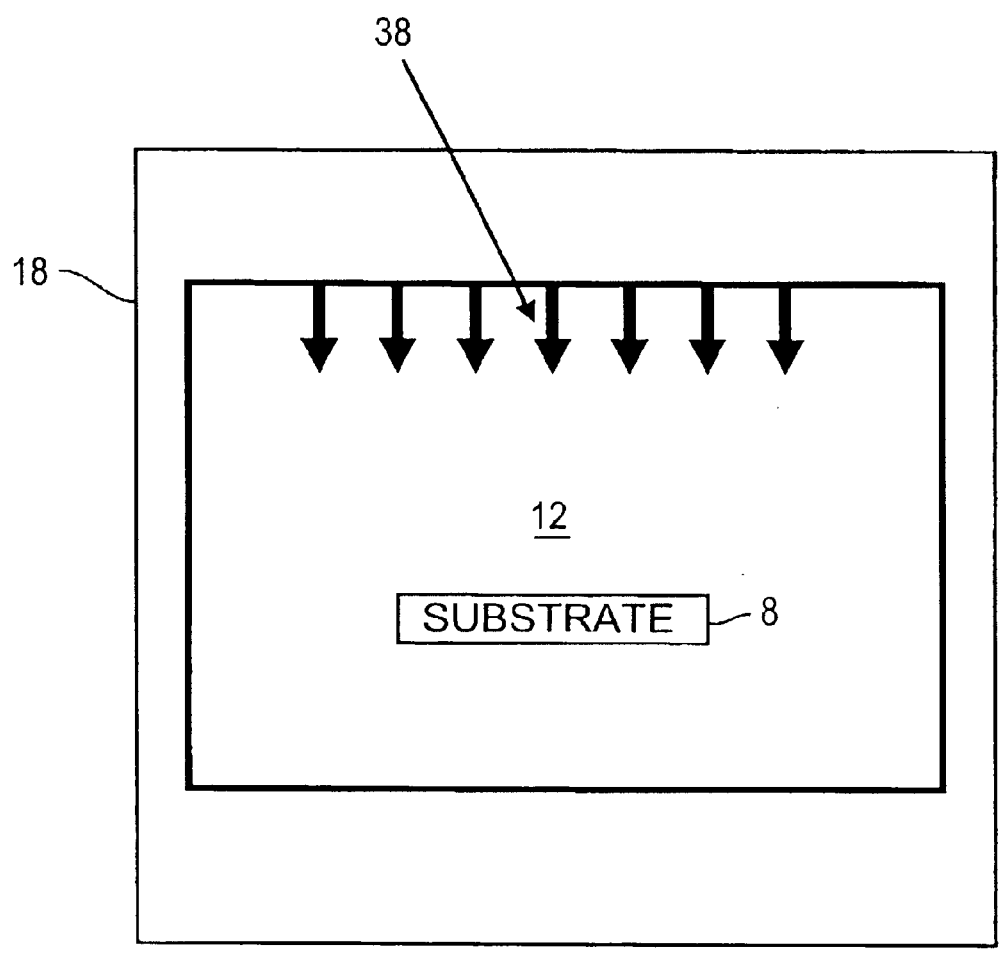
FIG. 3 is a schematic diagram showing top introduction of gas into the process chamber of the ALD reactor of FIG. 1.

FIG. 3 is a schematic diagram showing top introduction of gas into process chamber 12 of ALD reactor 2 of FIG. 1. A top mount feed (not shown) has a single introduction point (or multiple introduction points) with an optional added device (not shown), such as a showerhead and/or a baffle, to ensure that a top introduction flow distribution 38 is uniform over the substrate. The added device includes at least one passage, and may include many. The added device may also include intermediate passages to regulate gas distribution and velocity.

Figure 4A:
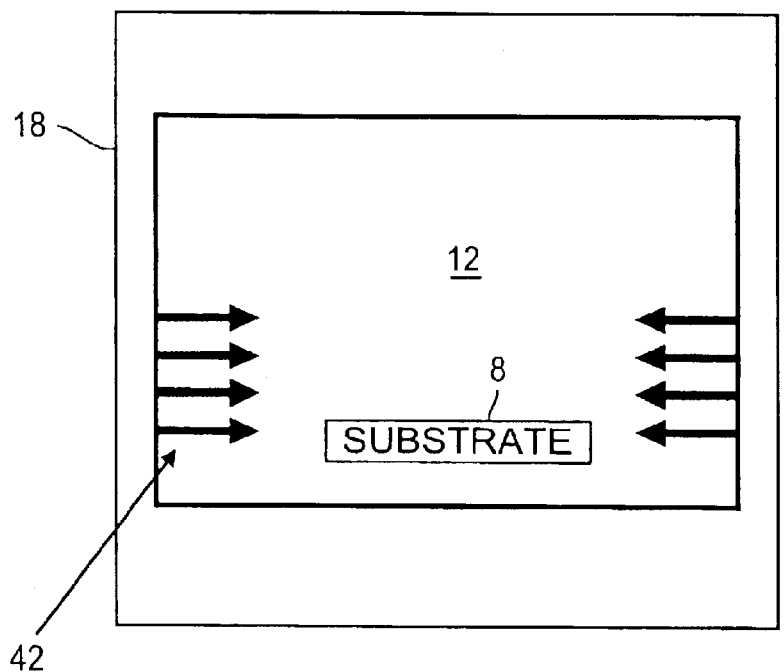
FIG. 4 is (a) a schematic diagram and (b) a plan view schematic diagram showing side introduction of gas into the process chamber of the ALD reactor of FIG. 1.
Figure 4B:
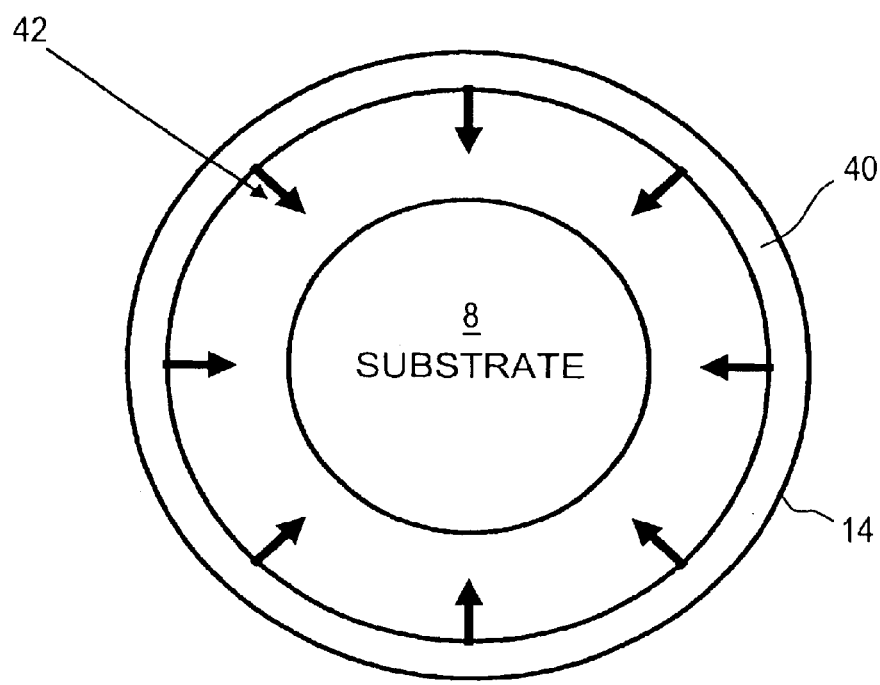

FIG. 4 is (a) a schematic diagram and (b) a plan view schematic diagram showing side introduction of gas into process chamber 12 of ALD reactor 2 of FIG. 1. Gas is introduced from a gas channel 40 in shield 14 into process chamber 12 through orifices in an inner wall of shield 14. Gas is introduced in a symmetric geometry around substrate 8 designed to ensure that a side introduction flow distribution 42 is even. In addition, the plane of the gas introduction may be adjusted vertically relative to substrate 8 before or during gas introduction, which can be used to optimize flow distribution 42.

Figure 5A:
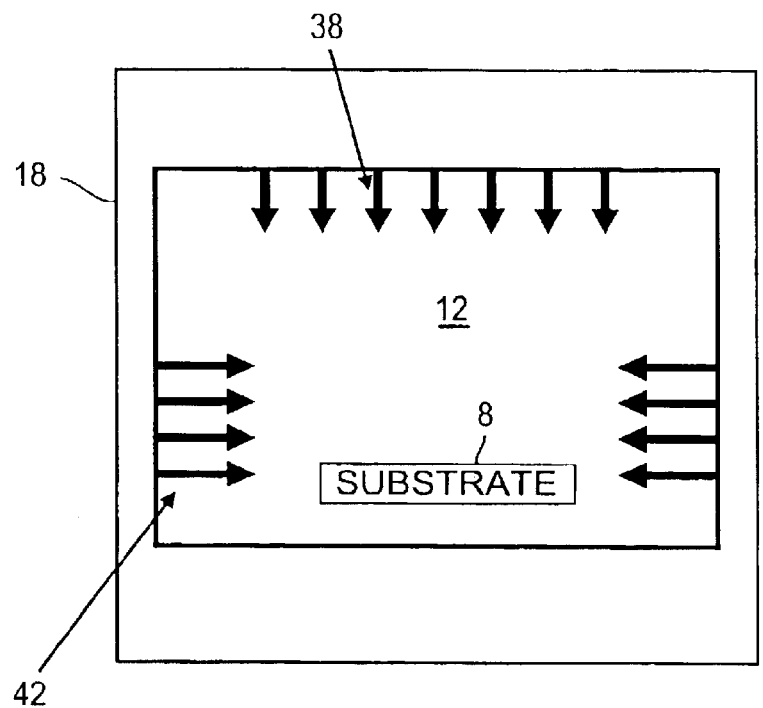
FIG. 5 is (a) a schematic diagram and (b) a plan view schematic diagram showing both top and side introduction of gas into the process chamber of the ALD reactor of FIG. 1.
Figure 5B:
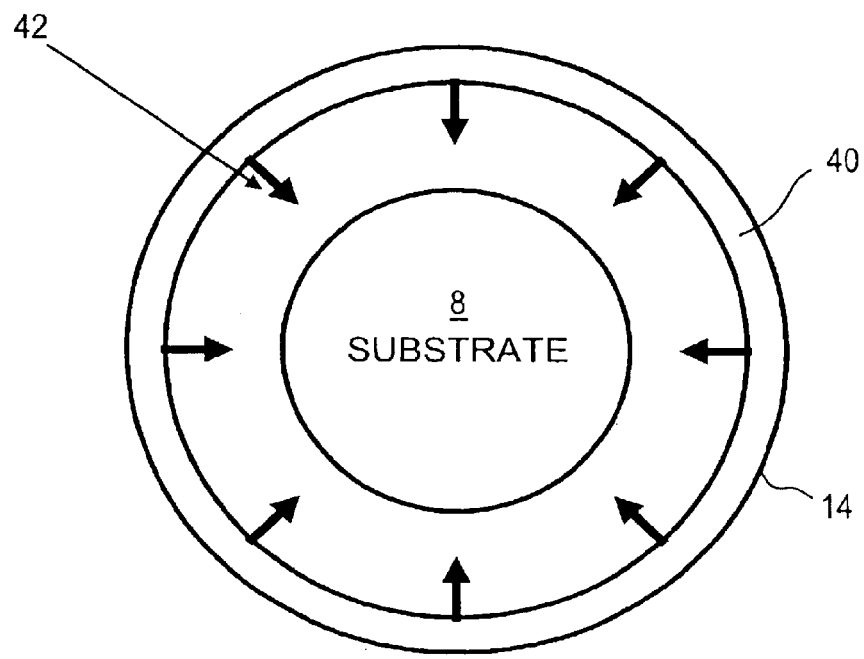

FIG. 5 is (a) a schematic diagram and (b) a plan view schematic diagram showing both top and side introduction of gas into process chamber 12 of ALD reactor 2 of FIG. 1. The gases for novel ALD processes, including precursor and purge gases, can be introduced through the same introduction path or separate paths as desired for optimal performance and layer quality.

Basic Electrostatic Chuck Assembly Design for an ALD Reactor

Reactor 2 of FIG. 1 can be used in a deposition process where the activation energy for the surface reaction is provided by ions created in a plasma above the substrate. Thus, atomic layer deposition can be ion-induced, rather than thermally induced. This allows deposition at much lower temperatures than conventional ALD systems. Given the sufficiently low process temperatures, pedestal 4 may include an electrostatic chuck (ESC) 6 for improved temperature control and improved radio frequency (RF) power coupling.

Additional detail of ion-induced atomic layer deposition may be found in the following related applications. U.S. application Ser. No. 09/812,352, entitled "System And Method For Modulated Ion-Induced Atomic Layer Deposition (MII-ALD)," filed Mar. 19, 2001, assigned to the present assignee and incorporated herein by reference. U.S. application Ser. No. 09/812,486, entitled "Continuous Method For Depositing A Film By Modulated Ion-Induced Atomic Layer Deposition (MI-ALD)," filed Mar. 19, 2001, assigned to the present assignee and incorporated herein by reference. U.S. application Ser. No. 09/812,285, entitled "Sequential Method For Depositing A Film By Modulated Ion-Induced Atomic Layer Deposition (MII-ALD)," filed Mar. 19, 2001, assigned to the present assignee and incorporated herein by reference.

Figure 6:
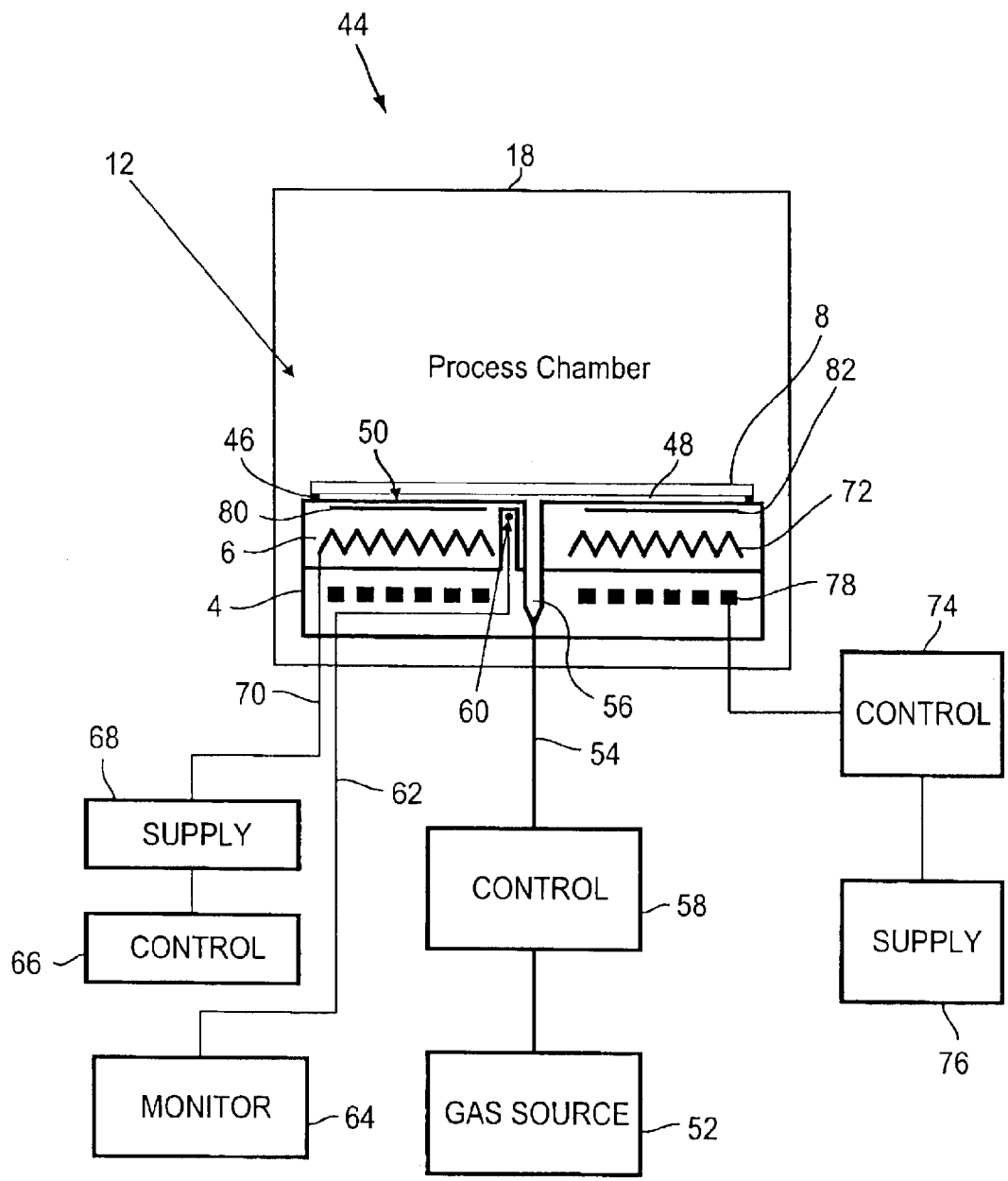
FIG. 6 is a schematic diagram of a control system for the pedestal of FIG. 1.

FIG. 6 is a schematic diagram of a control system 44 for pedestal 4 of FIG. 1. Substrate 8 rests on an annular sealing lip 46 defining a backside gas volume 48 between substrate 8 and a top surface 50 of ESC 6 of pedestal 4. The backside gas flows from a backside gas source 52 along a backside gas line 54, through a backside gas passageway 56 in ESC 6, and into gas volume 48. The backside gas improves the thermal communication between substrate 8 and ESC 6 by providing a medium for thermal energy transfer between substrate 8 and ESC 6. A means of flow control, such as a pressure controller 58, maintains the backside gas at a constant pressure, thus ensuring a uniform substrate temperature.

Substrate temperature is modulated by heating or cooling ESC 6. A temperature sensor 60 is coupled via a sensor connection 62 to a temperature monitor 64. A temperature controller 66 controls a heater power supply 68 applied via an electrical connection 70 to a resistive heater 72 embedded in ESC 6. A coolant temperature and flow controller 74, as is widely known, controls the coolant from a coolant supply 76 as it flows in a plurality of coolant channels 78 in pedestal 4.

Figure 7:
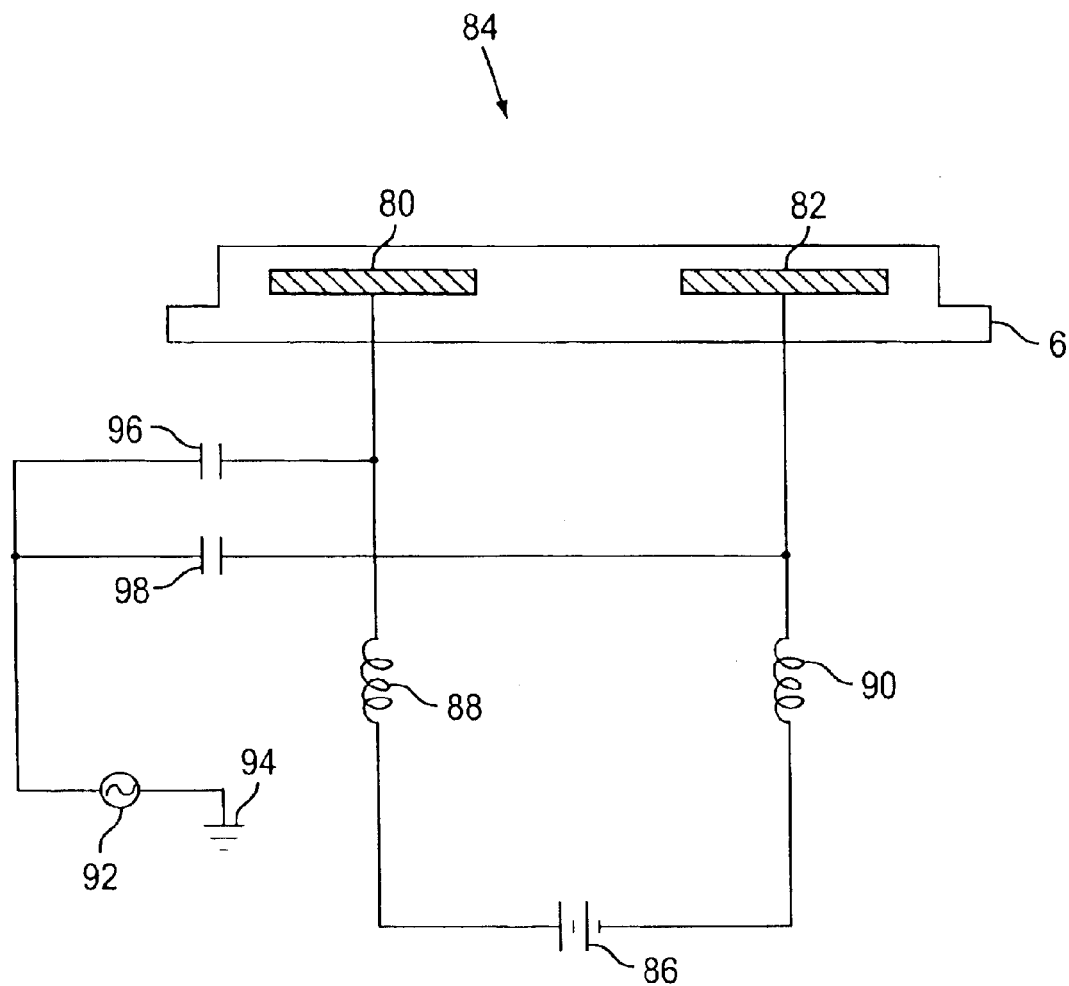
FIG. 7 is a schematic diagram of a circuit for electrical biasing of the electrostatic chuck of FIG. 1.

ESC 6 includes at least a first electrode 80 and a second electrode 82 embedded in a dielectric material. FIG. 7 is a schematic diagram of a circuit 84 for electrical biasing of electrostatic chuck 6 of pedestal 4 of FIG. 1. First electrode 80 and second electrode 82 are biased with different DC potentials to provide the "chucking" action that holds substrate 8 (FIG. 1) to ESC 6 prior to plasma ignition and during deposition. The biasing scheme of FIG. 7 allows establishment of the electrostatic attraction (i.e., "chucking") at low biases that would be insufficient to generate enough electrostatic attraction with a conventional monopolar chuck. In FIG. 7, one terminal of a DC power supply 86 is coupled via a first inductor 88 to first electrode 80. The other terminal of DC power supply 86 is coupled via a second inductor 90 to second electrode 82. Inductors 88 and 90 serve as RF filters.

RF power (e.g., at 13.56 MHz) is also supplied simultaneously to both first electrode 80 and second electrode 82 using an RF generator 92 coupled to a ground terminal 94. A first capacitor 96 and a second capacitor 98 are respectively coupled between RF generator 92 and first electrode 80 and second electrode 82. Capacitors 96 and 98 serve as DC filters to block the DC voltage from power supply 86. Circuit 84 allows improved coupling of RF power to substrate 8 during processing due to the close proximity (e.g., 0.6 mm–2 mm spacing) of substrate 8 to first electrode 80 and second electrode 82 embedded in ESC 6.

Since substrate 8 is in such close proximity to first and second electrodes 80 and 82, the transmission efficiency of RF power through the intervening dielectric of ESC 6 is higher than in conventional reactors where RF power is applied to electrodes at a greater distance from the substrate. Thus, less power is needed to achieve sufficient RF power coupling to substrate 8 in novel ALD reactor 2 (FIG. 1), and the same power to generate the bias on substrate 8 can also be used to create a plasma above substrate 8 at very low powers (e.g., <600W, and typically <150W).

ALD Reactor Detail

Figure 8:
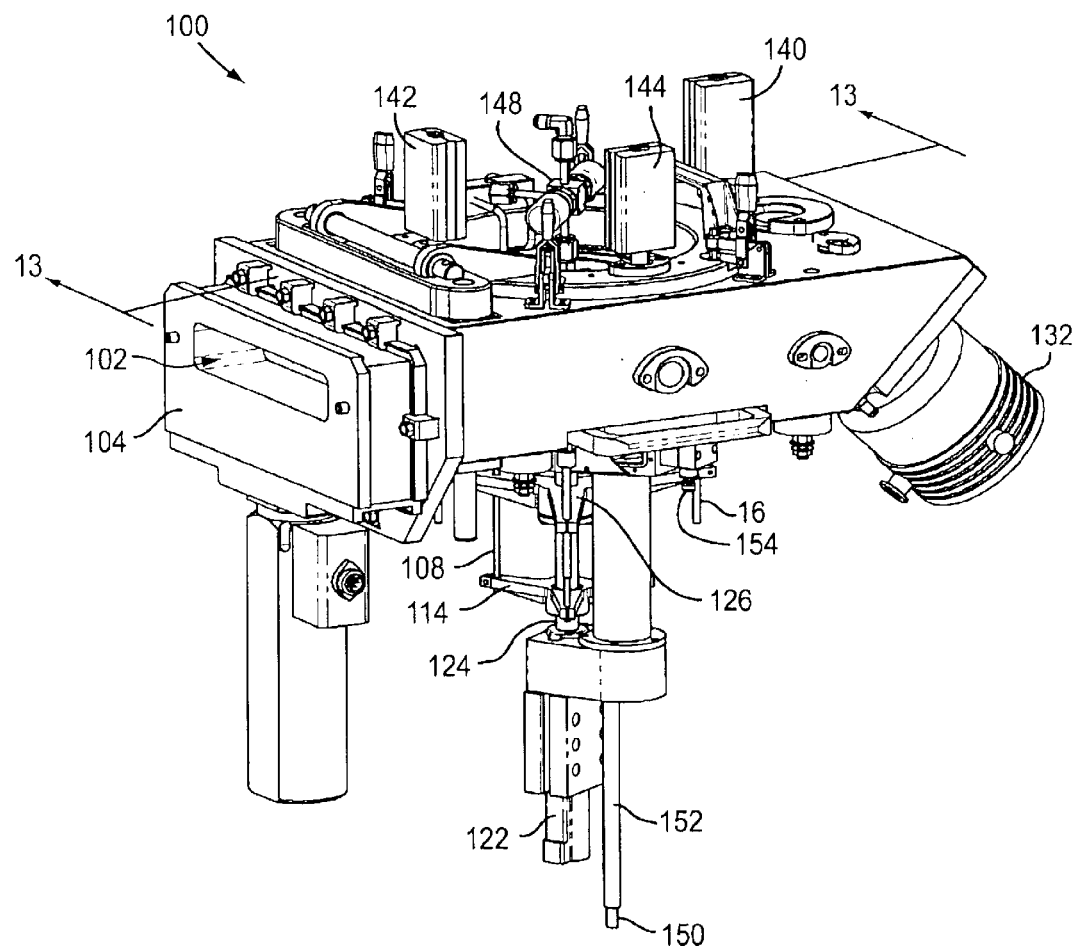
FIG. 8 is a front-side perspective view of a novel ALD reactor.
Figure 9:
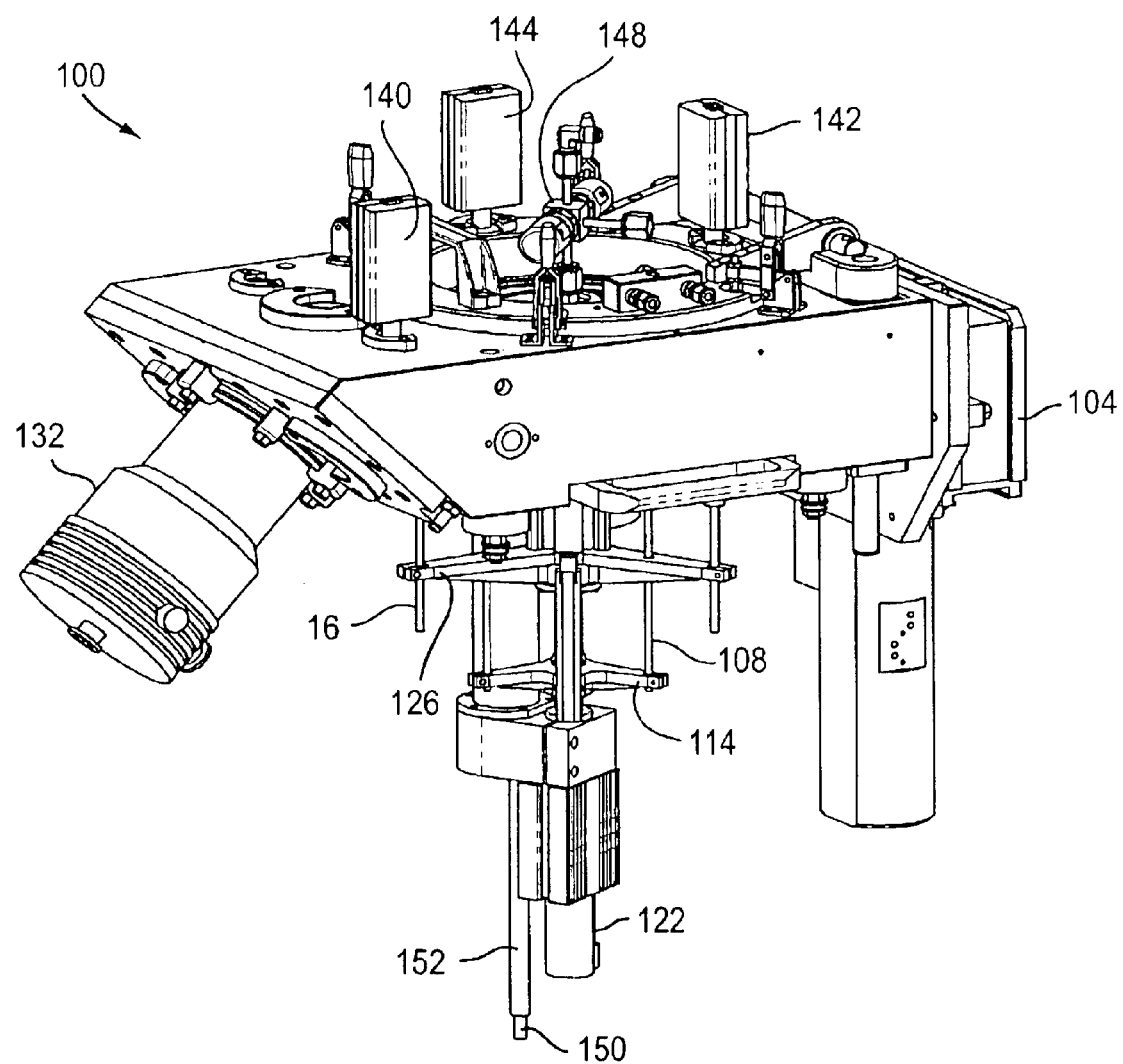
FIG. 9 is a back-side perspective view of the ALD reactor of FIG. 8.
Figure 10:
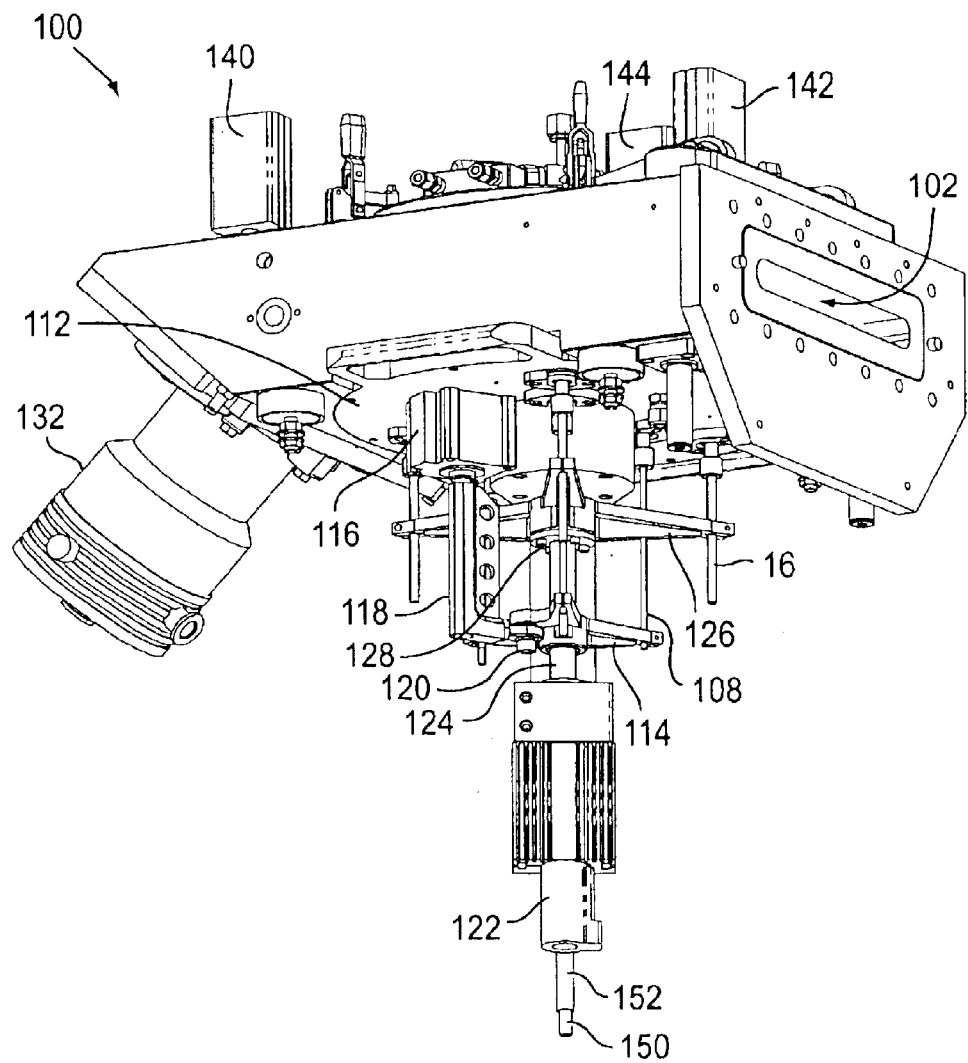
FIG. 10 is a back-side perspective view, from below, of the ALD reactor of FIG. 8.
Figure 11:
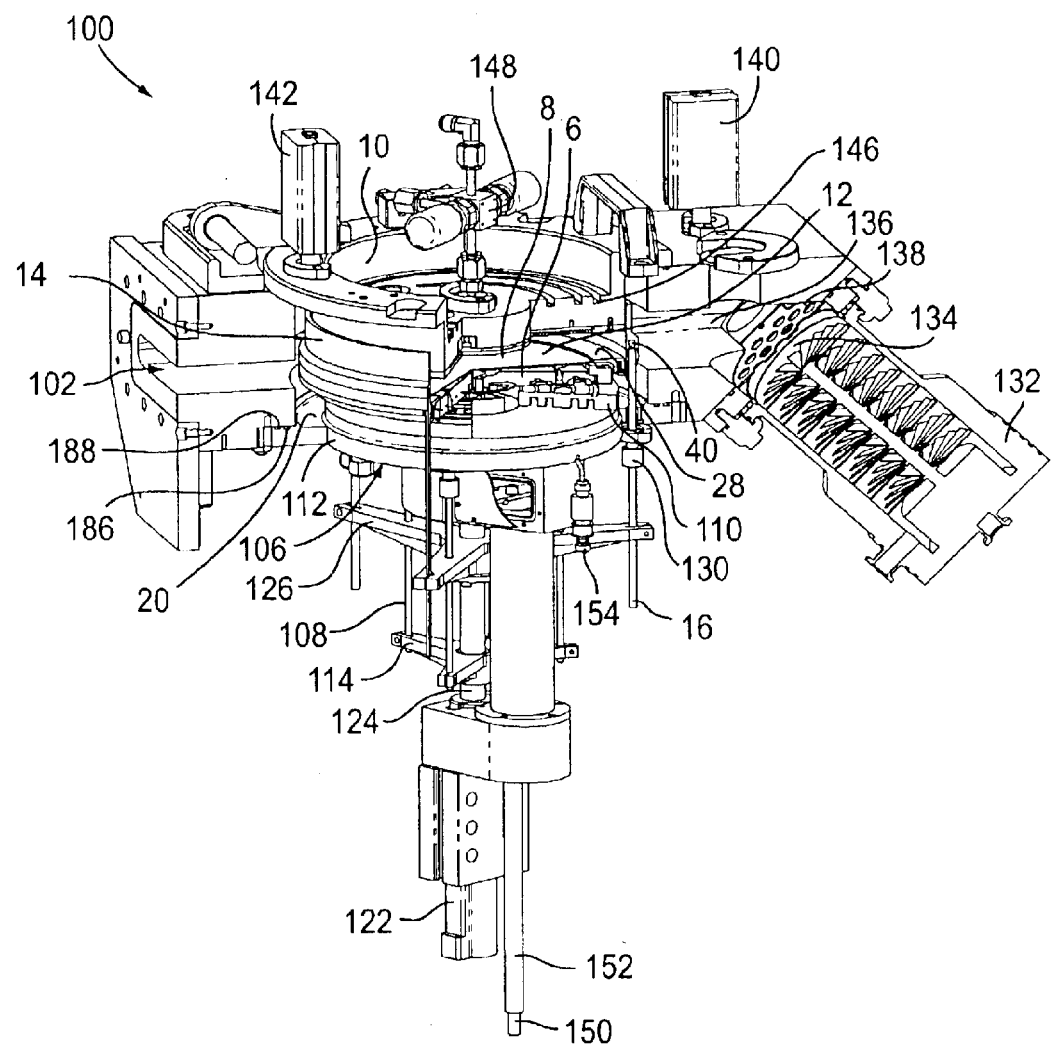
FIG. 11 is a front-side cutaway perspective view of the ALD reactor of FIG. 8.
Figure 12:
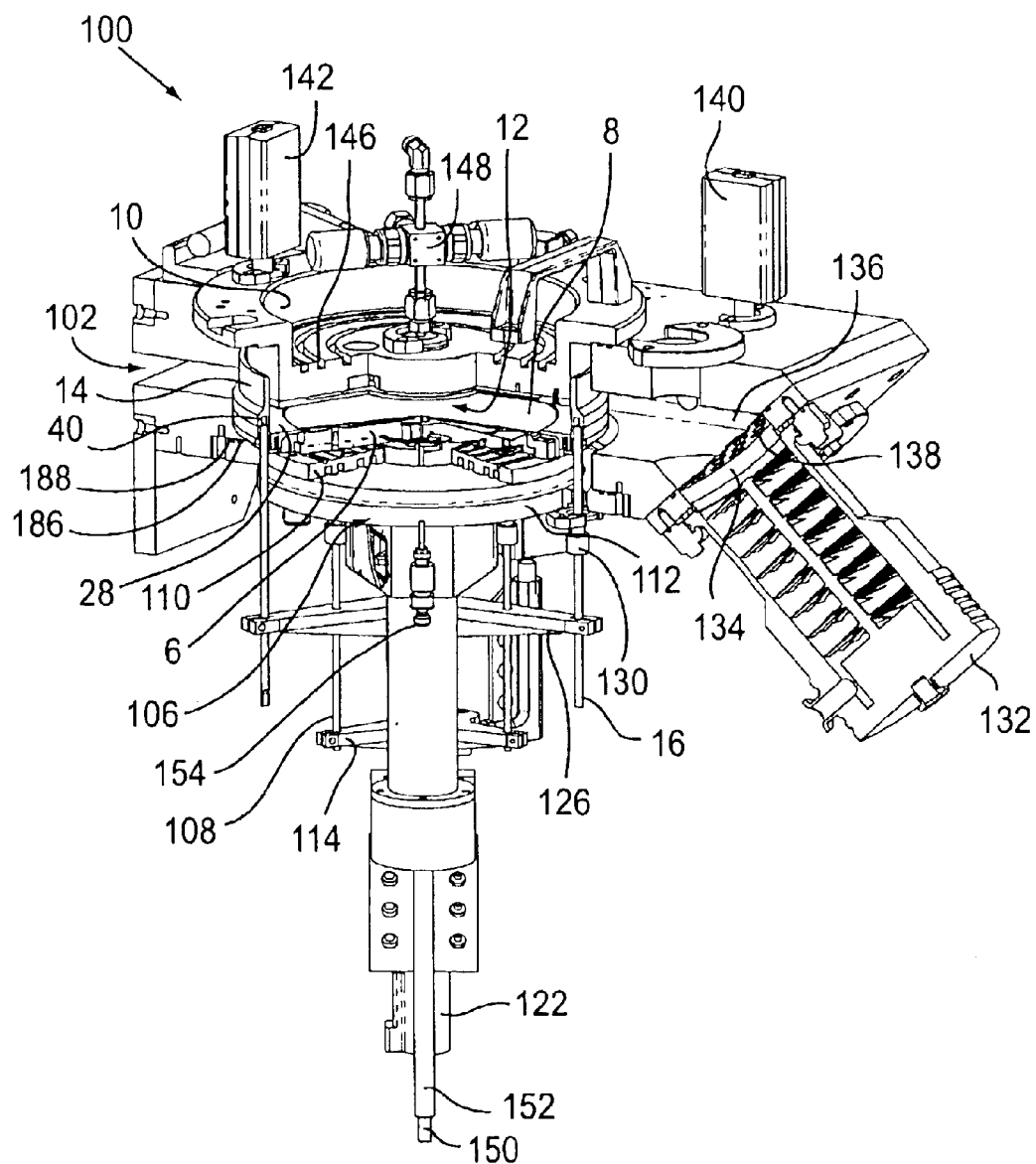
FIG. 12 is a front-side cutaway perspective view of the ALD reactor of FIG. 8.

FIG. 8, FIG. 9, FIG. 10, FIG. 1, and FIG. 12 show external views and internal cutaway views of a novel ALD reactor 100. FIG. 8 is a front-side perspective view of reactor 100. FIG. 9 is a back-side perspective view of reactor 100. FIG. 10 is a back-side perspective view, from below, of reactor 100. FIG. 11 is a front-side cutaway perspective view of reactor 100. FIG. 12 is another front-side cutaway perspective view of reactor 100.

Referring to FIG. 8, a substrate 8 (FIG. 12) is transferred into or out of a process chamber 12 (FIG. 11 and FIG. 12) of reactor 100 through a substrate entry slot 102 in a slit valve 104. Substrate 8 is loaded onto or unloaded from the pedestal (e.g., an electrostatic chuck assembly 106 as seen in FIG. 11 and FIG. 12) by a plurality of lift pins 108. In the load or unload position, the tips of lift pins 108 extend through orifices in an electrostatic chuck (ESC) 6 to hold substrate 8 above the top surface of ESC 6. In the process position, the tips of lift pins 108 retract below the top surface of ESC 6 allowing contact between substrate 8 and ESC 6 (FIG. 11 and FIG. 12).

Referring to FIG. 11 and FIG. 12, lift pins 108 extend downward from process chamber 12 in the interior of reactor 100 through an electrostatic chuck assembly 106 (including ESC 6, a cooling plate 110, and a baseplate 112) to the exterior under-side of reactor 100. Each of lift pins 108 is attached to a lift pin spider 114 to coordinate their motion. Vertical translation of lift pin spider 114 is accomplished with an off-axis lift pin actuator 116 (e.g., a pneumatic cylinder), which controls motion of a the rod 118 that is coupled to lift pin spider 114 by a spherical joint 120 as seen in FIG. 10. Spherical joint 120 transmits lifting forces to lift pin spider 114 but no moments.

Referring to FIG. 11, to facilitate substrate transfer, a moveable shield 14, must be in a load position. Shield 14 is raised or lowered using a linear motor 122, which moves a linear motor output rod 124 attached to a shield lift spider 126 by a collet clamp 128 (best seen in FIG. 10). Each one of a plurality of shield support legs 16 (FIG. 11) extends through a shield support leg seal 130 and is coupled between shield lift spider 126 and shield 14. The axis of linear motor 122 is aligned with the axis of process chamber 12 resulting in no net moments on shield lift spider 126. Lift pin spider 114 rides a portion of linear motor output rod 124, coaxial with output rod 124 and shield lift spider 126. Lift pin spider 114, however, is unaffected by movement of rod 124, and this arrangement results in no net moments on lift pins 108.

As mentioned above, linear motor 122 provides actuation of shield 14. This is in contrast to conventional moveable pedestals wherein slower stepper motors are used for actuation. Conventional rotational stepper motors use lead screws (possibly in conjunction with a gear train), which are slow but capable of moving heavy masses, to effect movement of the heavy pedestal. Linear motor 122 does not use a gear train, but instead directly drives the load. Linear motor 122 includes a plurality of alternating magnets to effect motion of output rod 124.

Linear motor 122 can be a commercially available linear motor and typically includes a sleeve having a coil and a moveable rod enclosing the series of alternating magnets. The movement of the rod through the sleeve is precisely controlled, using a Hall Effect magnetic sensor, by a signal applied to the coil. In one embodiment, pulses applied to the coil precisely control the position of the rod with respect to the sleeve, as is well known. Since shield 14 is a light weight compared to conventional heavy pedestals, linear motor 122 provides high performance positioning, with response times on the order of milliseconds. Linear motor 122 thus provides a quicker response and more accurate shield positioning than is achievable with conventional stepper or servo motors used to actuate the pedestal of conventional ALD reactors.

Referring to FIG. 11, a pump, such as a turbomolecular pump 132, maintains a background ambient pressure as low as a few microtorr or less in an annular pumping channel 20 surrounding shield 14. Pump 132 is attached to reactor 100 at an angle such that a circular pump throat 134 is fully exposed to a narrow pumping slot 136 aft of process chamber 12, maximizing the conductance between them. In this manner, pump 132 with a diameter, d, has maximum exposure to pumping slot 136 of height, h (where h<d), with minimum restriction between pump 132 and chamber 12 (see also FIG. 13 discussed below). For specific processing applications, a pumping speed restrictor 138 can be inserted at pump throat 134 to restrict the conductance as needed. In some embodiments, a pressure controlling throttle valve (e.g., a butterfly valve) can be used instead of, or in conjunction with, restrictor 138. Pressure in pumping slot 136 and annular pumping channel 20 is monitored by a pump pressure sensor 140 mounted on the top surface of reactor 100.

Process chamber 12 is bounded on top by a chamber lid 10. Pressure in process chamber 12 of reactor 100 may be on the order of a few microtorr up to several torr. The pressure of chamber 12 is monitored by a fast chamber pressure sensor 142 and a precision chamber pressure sensor 144, both of which are mounted on an upper peripheral flange of chamber lid 10 (FIG. 8). The temperature of chamber lid 10 is controlled by fluid flowing in a plurality of lid cooling/heating channels 146 (FIG. 11). One possible path of gas introduction to process chamber 12 is through a showerhead three-way valve 148 mounted centrally on chamber lid 10. Another possible method of gas introduction to process chamber 12 is through a shield gas channel 40.

RF power is transferred to electrodes in ESC 6 via an RF conductor 150 shielded within an RF insulator tube 152. A gas medium (commonly referred to as a backside gas) is provided via a backside gas valve 154 to ESC 6 to improve the thermal coupling between ESC 6 and substrate 8. During processing, an optional shadow ring 28 rests on a portion of ESC 6 fully surrounding a peripheral edge of substrate 8.

Figure 13:
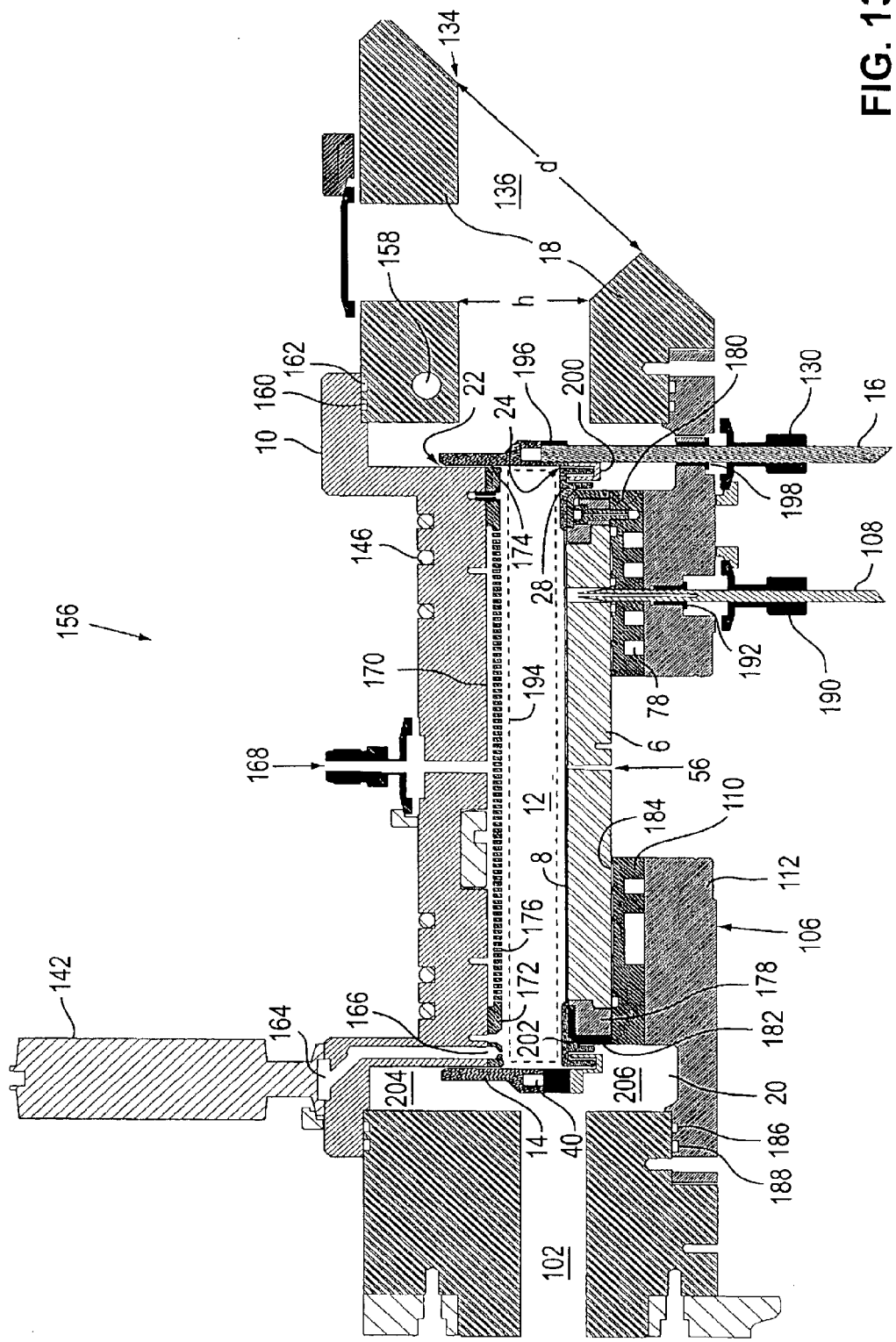
FIG. 13 is a cross-sectional view of a chamber portion of the ALD reactor along line 13—13 of FIG. 8.

FIG. 13 is a cross-sectional view of a chamber portion 156 of ALD reactor 100 along line 13—13 of FIG. 8. Substrate entry slot 102 is shown on the left hand side extending through a chamber body 18. Pumping slot 136, of height h, is shown on the right hand side extending through chamber body 18 to pump throat 134, of diameter d. The temperature of chamber body 18 is controlled by fluid flowing in a chamber cooling/heating channel 158.

Chamber lid 10 rests atop chamber body 18. A vacuum seal, to maintain low pressure in the interior of reactor 100, is maintained through the use of an upper O-ring 160 between chamber lid 10 and chamber body 18. Laterally spaced from O-ring 160 between chamber lid 10 and chamber body 18 is an upper RF gasket 162, forming an RF shield. The temperature of chamber lid 10 is controlled by fluid flowing in lid cooling/heating channels 146. Alternatively, the temperature of chamber lid 10 may be controlled by an electric or resistive heater or other cooling/heating means.

The pressure in process chamber 12 is monitored, in part, by fast chamber pressure sensor 142, which is mounted on an upper peripheral flange of chamber lid 10. Pressure sensor 142 monitors the pressure in a pressure tap volume 164, which is coupled to process chamber 12 by a pressure sensor orifice 166. This arrangement allows exposure of pressure sensor 142 to the pressure of chamber 12, while preventing plasma and other process chemistries from reaching, and possibly damaging, pressure sensor 142.

Gases can be introduced into process chamber 12 through a showerhead gas feed inlet 168, which leads to a plenum 170 above a showerhead 172 attached to a lower surface of chamber lid 10. Showerhead 172 includes a showerhead lip 174 and a plurality of showerhead gas orifices 176, which are used to distribute gas evenly into process chamber 12.

Substrate 8 rests on an upper surface of an ESC assembly 106, which includes in part, ESC 6, cooling plate 110, and baseplate 112. The vertical spacing between the upper surface of ESC assembly 106 and showerhead 172 may be 0.3 inches to 1 inch, typically less than 0.6 inches. Backside gas passageway 56 is shown centrally located in and extending through ESC 6. ESC 6, which includes the largest portion of the upper surface on which substrate 8 rests, is held in contact with cooling plate 110 using a clamp ring 178, which overlaps a surrounding flange at the base of ESC 6. A plurality of clamp ring fasteners 180, each extending through clamp ring 178 into cooling plate 110, secure the connection between ESC 6 and cooling plate 110. A process kit 182 fully surrounds clamp ring 178 and electrically hides clamp ring fasteners 180 from ESC 6 and substrate 8. For a more detailed view of clamp ring 178, fasteners 180, and process kit 182, see FIG. 16, discussed below.

The temperature of cooling plate 110 is controlled using fluid flowing in a plurality of coolant channels 78 as shown in FIG. 13. An upper surface of cooling plate 110 is patterned to create a plurality of thermal breaks 184, or gaps, between ESC 6 and cooling plate 110. Thermal breaks 184 increase the temperature difference between ESC 6 and cooling plate 110. This allows the temperature of ESC 6 to rise substantially higher than the temperature of baseplate 112, which stays relatively cool. For a more detailed view of thermal breaks 184, see FIG. 27, discussed below.

As shown in FIG. 13, a lower surface of cooling plate 110 is attached to an upper surface of baseplate 112. The upper surface of baseplate 112 forms the lower walls of coolant channels 78 in cooling plate 110. A vacuum seal, to maintain low pressure in the interior of reactor 100, is maintained through the use of an O-ring 186 between baseplate 112 and chamber body 18. Laterally spaced from O-ring 186 between baseplate 112 and chamber body 18 is an RF gasket 188.

One of the plurality of lift pins 108 is shown in retracted process position, with the tip of lift pin 108 below the top surface of ESC 6. Lift pin 108 extends through a lift pin seal 190, which maintains the low pressure in the interior of reactor 100. A lift pin bushing 192 reduces friction during vertical translation of lift pin 108 through aligned orifices in baseplate 112, cooling plate 110, and ESC 6.

In FIG. 13, shield 14 is shown in an intermediate process position. Process chamber 12 is thus bounded on the top by showerhead 172, on the bottom largely by ESC 6, and on the sides by shield 14 to confine a plasma 194. Shield 14 includes shield gas channel 40 and is attached to each shield support leg 16 using a shield cap 196. Each shield support leg 16 extends through shield support leg seal 130, which maintains the low pressure in the interior of reactor 100. A plurality of shield support leg bushings 198 reduce friction during vertical translation of shield support legs 16 through orifices in baseplate 112.

A shadow ring hook 200 is attached to a lower portion of shield cap 196. Shadow ring hook 200 is shown interdigitated with shadow ring 28, which fully surrounds a peripheral edge of ESC 106 and rests on a process kit bevel 202 of process kit 182. Shadow ring 28 protects the underlying portions of ESC assembly 106 during deposition onto substrate 8. Shadow ring 28 also defines the circumferential region near the edge of substrate 8 where deposition is masked. Shadow ring 28 also plays a role in defining the chamber conductance. For a more detailed view of process kit bevel 202, see FIG. 16, discussed below.

In FIG. 13, two leakage paths modulate gas flow between process chamber 12 and annular pumping channel 20, which is largely bounded by chamber body 18, chamber lid 10, and ESC assembly 106. The leakage occurs due to differing pressures between process chamber 12 and annular pumping channel 20. A shield conductance upper path 22 is bounded on one side by an inner upper surface of shield 14, and on the other side by outer surfaces of chamber lid 10 and showerhead 172. A shield conductance lower path 24 is bounded on one side by surfaces of a lower portion of shield 14, shield cap 196, and shadow ring hook 200, and on the other side by surfaces of shadow ring 28. Upper path 22 leads from process chamber 12 to an upper portion 204 of annular pumping channel 20, while lower path 24 leads from process chamber 12 to a lower portion 206 of annular pumping channel 20.

Shield 14 can be vertically translated by either raising it into upper portion 204 of annular pumping channel 20 or lowering it into lower portion 206 of annular pumping channel 20. As shield 14 is translated, the conductances of upper path 22 and lower path 24 are changed. The variations in conductance can be controlled to vary the pressure in process chamber 12 in a controlled manner as needed for various steps in an atomic layer deposition process sequence.

Shield Operation

Unlike in conventional ALD reactors, reactor 2 includes a stationary pedestal 4 (see FIG. 1). For example, reactor 100 of FIG. 12 includes ESC assembly 106. Transfer of substrate 8 into process chamber 12 of reactor 100 is facilitated through the use of moveable shield 14, which also plays a significant role during processing.

Figure 15:
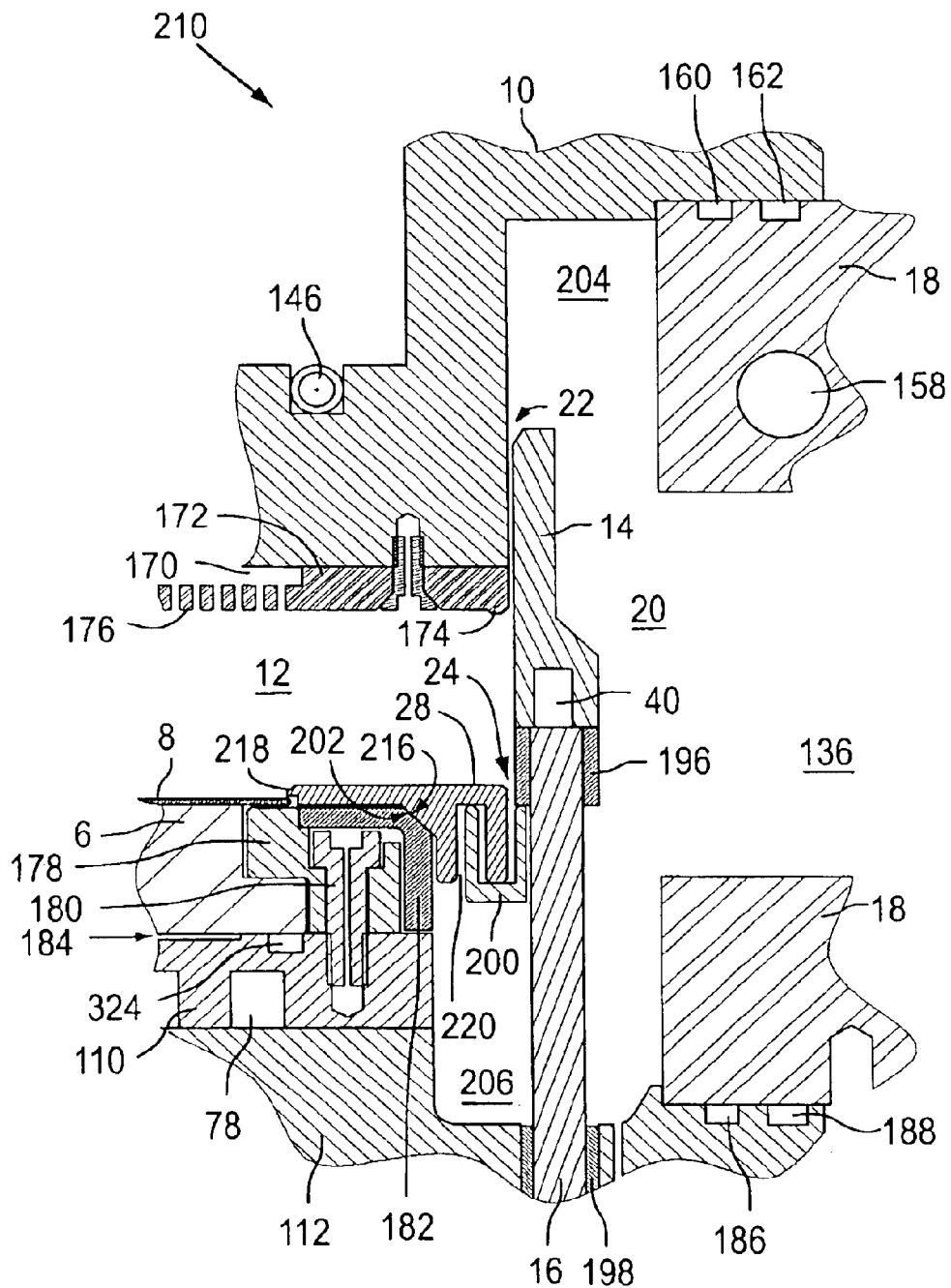
FIG. 15 is a detailed cross-sectional view of the right side of the chamber portion of FIG. 13 showing a low conductance process shield position.
Figure 16:
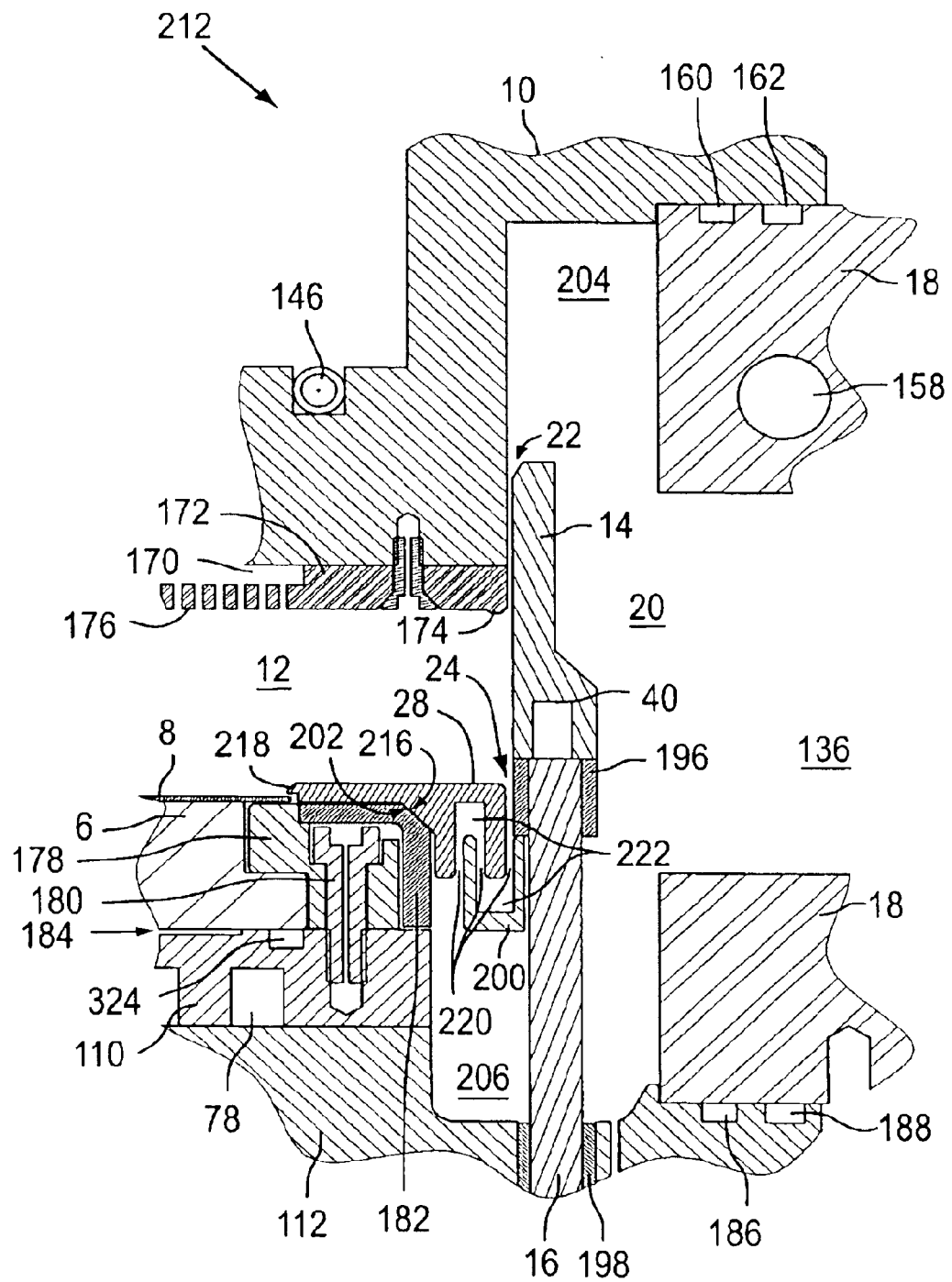
FIG. 16 is a detailed cross-sectional view of the right side of the chamber portion of FIG. 13 showing a high conductance process shield position.
Figure 17:
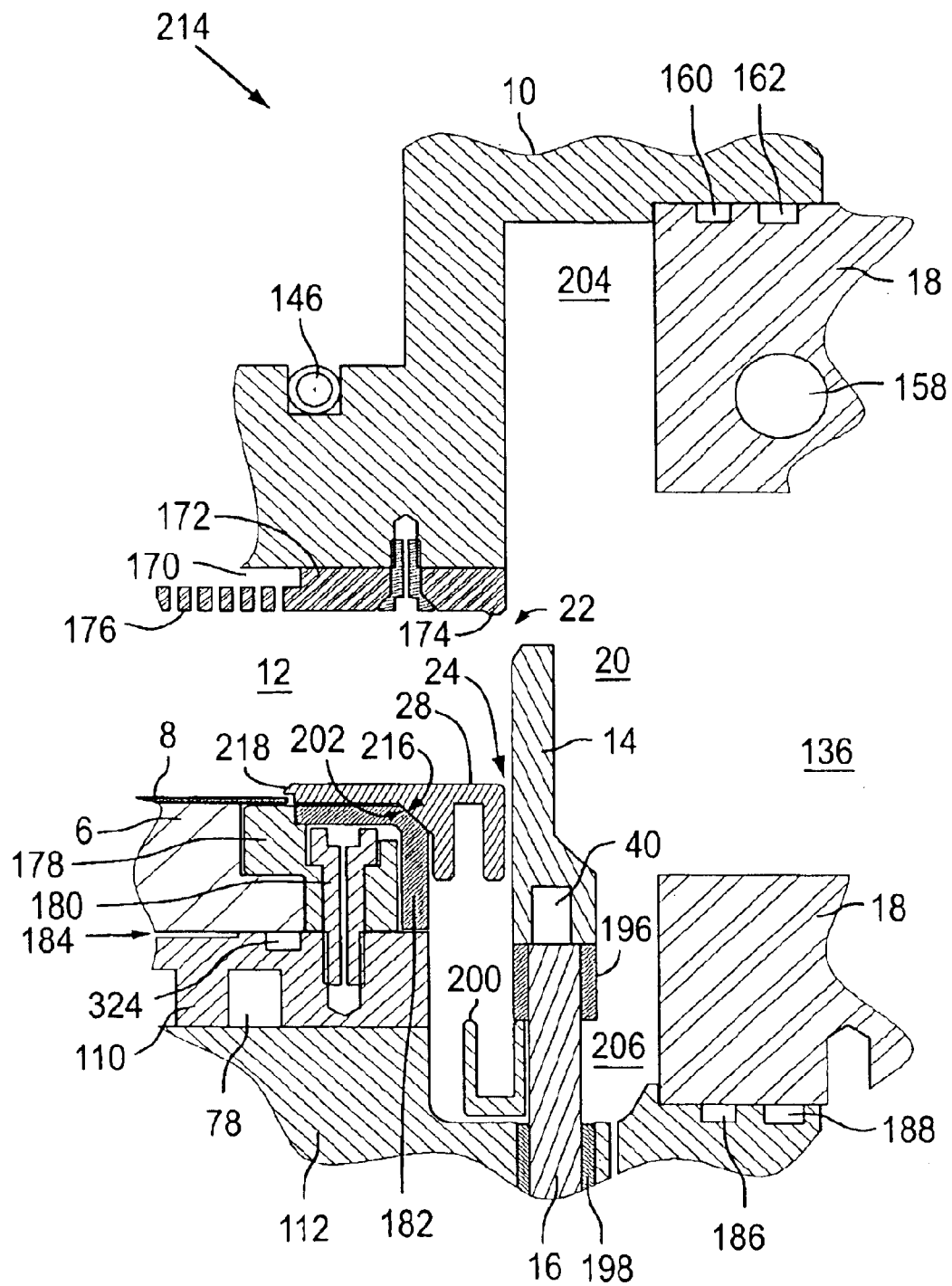
FIG. 17 is a detailed cross-sectional view of the right side of the chamber portion of FIG. 13 showing a purge shield position.

Various shield positions are employed throughout the ALD process. FIG. 14, FIG. 15, FIG. 16, and FIG. 17 show detailed cross-sectional views of the right side of chamber portion 156 of FIG. 13, showing shield 14 in a substrate load shield position 208 (FIG. 14), a low conductance process shield position 210 (FIG. 15), a high conductance process shield position 212 (FIG. 16), and a purge shield position 214 (FIG. 17).

Figure 14:
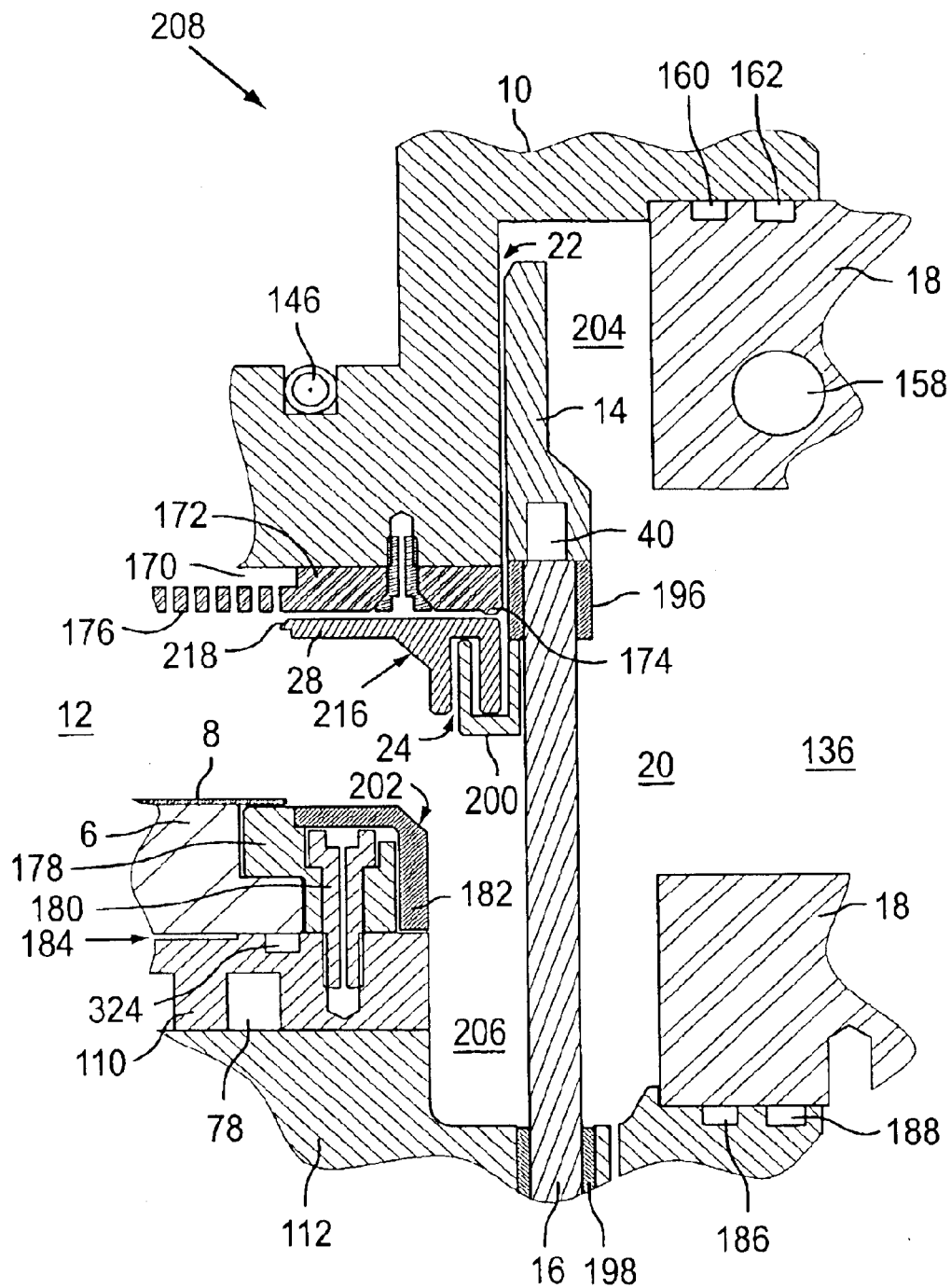
FIG. 14 is a detailed cross-sectional view of the right side of the chamber portion of FIG. 13 showing a load shield position.

In load shield position 208 of FIG. 14, shield support legs 16 are raised by linear motor 122 (FIG. 8). When shield 14 is raised above a certain point, shadow ring hook 200 contacts shadow ring 28 and lifts it as well. Shield 14 and shadow ring 28 are then raised together. Shield 14 enters upper portion 204 of annular pumping channel 20. Shield 14 and shadow ring 28 can be raised until shadow ring 28 contacts showerhead lip 174, which prevents shadow ring 28 from contacting showerhead 172.

Load shield position 208 thus allows loading (or unloading) of substrate 8 into (or out of) process chamber 12 via substrate entry slot 102 (FIG. 13). For example, to load substrate 8 into process chamber 12, a substrate blade or paddle (not shown) carries substrate 8 into process chamber 12. Lift pins 108 are raised by lift pin actuator 116 (FIG. 10) to contact substrate 8 and lift it off the top surface of the blade. The blade is then retracted out of chamber 12 through entry slot 102. Lift pins 108 are retracted past the top surface of ESC 6 allowing substrate 8 to rest on ESC 6 as shown in FIG. 14. A similar process is followed to unload substrate 8 from chamber 12.

In an alternative embodiment, shadow ring 28 is not used, and shield 14 forms variable conduction paths with other surfaces that may be fixed or moveable. In some embodiments, it is possible that the load position may be achieved by lowering shield 14 sufficiently so that substrate 8 may pass over the top edge of shield 14.

Once substrate 8 has been loaded into process chamber 12, shield 14 is lowered by linear motor 122 (FIG. 8) for processing. The low conductance process shield position 210 shown in FIG. 15, shows the positions of shield 14 and shadow ring 28 at the moment that shadow ring 28 contacts process kit 182. An angled shadow ring seat 216 of shadow ring 28 rests on process kit bevel 202 of process kit 182. This is the only point of contact between shadow ring 28 and process kit 182. Air gaps separate shadow ring 28 and process kit 182 away from each edge of process kit bevel 202. The airgaps between shadow ring 28 and process kit 182 allow for differential thermal expansion of shadow ring 28 and process kit 182 during processing. The angle of process kit bevel 202 helps center shadow ring 28, through interaction with the angle of shadow ring seat 216, so that the edge of substrate 8 is shadowed uniformly by a shadow ring edge 218 of shadow ring 28.

Lowering shield 14 into process position creates shield conductance upper path 22 and shield conductance lower path 24, as described with respect to FIG. 13 above. While it is possible to reduce the conductance of lower path 24 to zero (FIG. 15), during deposition upper path 22 generally forms a low conductance leakage path, while lower path 24 generally forms a higher conductance leakage path (FIG. 16).

By changing the relative position of shield 14 to shadow ring 28, the conductance out of chamber 12 can be modulated. This modulation, in turn, alters the pressure of chamber 12. The high conductance process shield position 212 shown in FIG. 16, shows the positions of shield 14 and shadow ring 28 at an intermediate step of an ALD process. Lower path 24 includes several distinct regions: a plurality (three in this embodiment) of fixed conductance regions 220 (fixed gaps between shadow ring hook 200 and shadow ring 28) interspersed with a plurality (two in this embodiment) of variable conductance regions 222 (variable gaps). The volumes of fixed conductance regions 220 and variable conductance regions 222 can be precisely controlled (by precise positioning of shield 14 by linear motor 122) to adjust the conductance of lower path 24, and therefore the pressure of chamber 12, as needed during the process.

In purge shield position 214 of FIG. 17, shield support legs 16 are lowered by linear motor 122 (FIG. 8). Shield 14 and shadow ring hook 200 are lowered into lower portion 206 of annular pumping channel 20. Shadow ring 28 remains seated on process kit 182. Both shield conductance upper path 22 and shield conductance lower path 24 become high conductance paths. Purge shield position 214 allows quick evacuation of the gases in process chamber 12 into annular pumping channel 20 due to the high conductances created and the lower pressure of annular pumping channel 20 compared to chamber 12.

As mentioned above, linear motor 122 (FIG. 8) provides actuation of shield 14. This allows quick and accurate variation of the conductance of shield conductance upper and lower paths 22 and 24. This translates into quick and accurate variation of the pressure in process chamber 12 for given gas flows into process chamber 12.

In some embodiments, a throttle valve (i.e., a butterfly valve, a variable position gate valve, a pendulum valve, etc.) positioned at pump throat 134 (FIG. 13) can also be used in conjunction with moveable shield 14 to effect quick pressure changes in process chamber 12 by modulating the maximum pumping speed of pump 132 (FIG. 12). The throttle valve augments the pressure range achievable in process chamber 12, providing a "coarse adjustment" of the pressure in process chamber 12, while shield 14 provides a "fine adjustment" of the pressure.

Showerhead and Shield Design for Gas Introduction and Temperature Control

The novel hardware for ALD reactor 100 (FIG. 11) supports the introduction of gases into process chamber 12 through multiple points. The primary introduction point is through the top of reactor 100, in particular, through showerhead three-way valve 148 (mounted on chamber lid 10) and showerhead 172 (best seen in FIG. 13). Gases may also be introduced into chamber 12 through shield 14, which may be additionally configured for temperature control.

Figure 18:
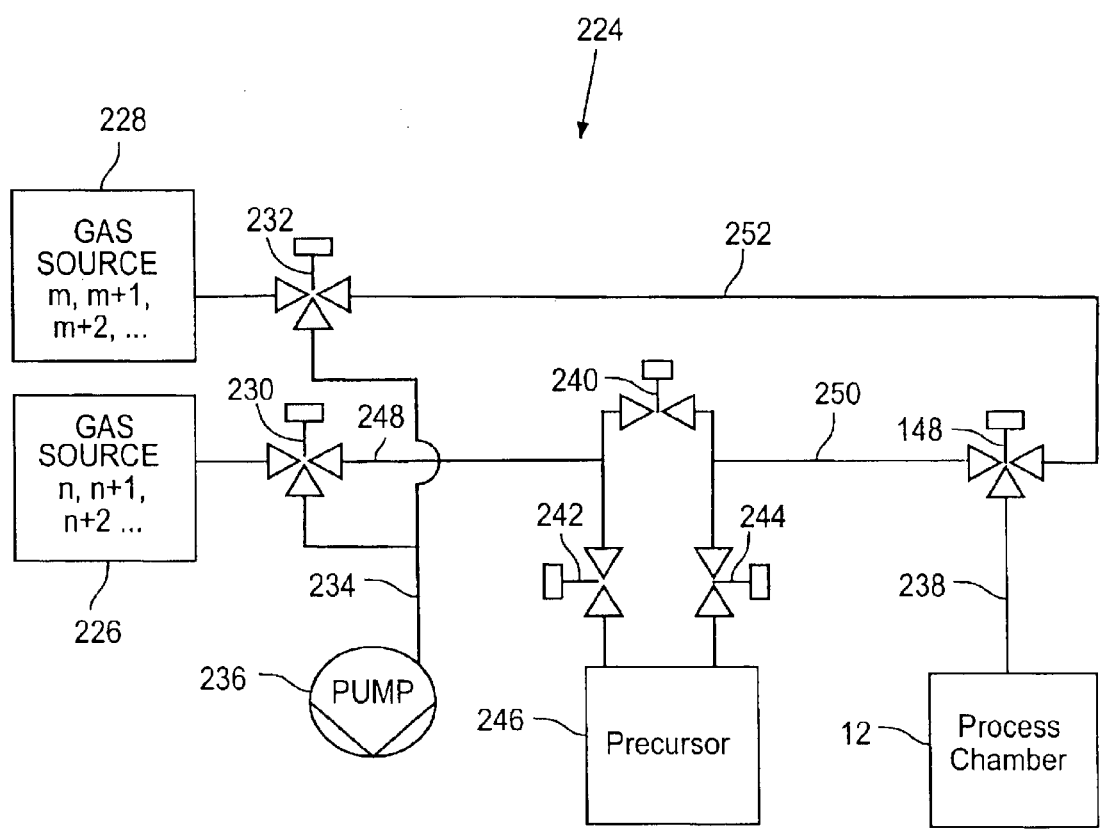
FIG. 18 is a schematic diagram of a valve system for gas delivery in the ALD reactor of FIG. 8.

FIG. 18 is a schematic diagram of a novel valve system 224 for gas delivery in ALD reactor 100 of FIG. 8. This embodiment delivers a single precursor and a purge gas to process chamber 12, either separately or in a mixed proportion. The purge gas is used to purge the chamber and as the gas source to strike a plasma. A carrier gas for the precursor flows from a first gas source 226, and the purge gas flows from a second gas source 228.

When either the carrier gas or the purge gas is not flowing to chamber 12, it is diverted by a first three-way valve 230 and a purge three-way valve 232, respectively, through a pump bypass gas line 234 to a vacuum pump 236. Utilization of vacuum pump 236 allows the carrier and purge gases to flow in steady state conditions even when they are not flowing to chamber 12. This avoids disturbances in the gas flows caused by the long settling times of gas sources that are switched on and off.

A showerhead three-way valve 148 controls access to a chamber gas line 238, which leads to process chamber 12. Three-way valve 148, located centrally on chamber lid 10 as seen in FIG. 11, provides at least two distinct advantages. First, gases introduced to chamber 12 can be switched rapidly with minimal loss or delay. Second, gases are isolated from each other outside of chamber 12, resulting in no cross-contamination of reactants.

A first on/off valve 240 is coupled between first ends of a second on/off valve 242 and a third on/off valve 244. The opposite ends of second and third on/off valves 242 and 244 are each coupled to a first precursor source 246. First on/off valve 240 is also coupled between first three-way valve 230 and showerhead three-way valve 148 via a gas line 248 and a gas line 250, respectively. Precursor source 246 can be isolated by closing on/off valves 242 and 244. This may be done, for example, to change precursor source 246. In this case, on/off valve 240 may be closed, or opened to allow carrier gas to flow through three-way valves 230 and 148 into chamber 12. During deposition, first on/off valve 240 is normally closed, and second and third on/off valves 242 and 244 are normally open.

Three-way valves 230, 232, and 148 are switched synchronously to deliver either precursor or purge gas to chamber 12. When delivering precursor, purge three-way valve 232 is switched to flow the purge gas to vacuum pump 236, and showerhead three-way valve 148 is switched to the precursor side. Simultaneously, three-way valve 230 is switched to allow carrier gas to flow from first gas source 226 through gas line 248 and on/off valve 242 into precursor source 246. The carrier gas picks up precursor in precursor source 246, typically by bubbling through a liquid source. The carrier gas, now including precursor, flows through on/off valve 244, through gas line 250, through showerhead three-way valve 148, through chamber gas line 238, and into chamber 12.

When delivering purge gas, first three-way valve 230 is switched to flow the carrier gas to vacuum pump 236. Purge three-way valve 232 and showerhead three-way valve 148 are switched to allow purge gas to flow from second gas source 228 through a gas line 252 and chamber gas line 238 into chamber 12.

Valve system 224 keeps gas line 248 charged with carrier gas, gas line 250 charged with carrier plus precursor, and gas line 252 charged with purge gas. This allows fast switching between gas sources by significantly reducing the gas delivery time to chamber 12. Valve system 224 also minimizes waste of gases since gas lines do not need to be flushed between deposition steps. Furthermore, any gas bursts from transient pressure spikes upon gas switching, due to the charged gas lines, would only help the initial stages of chemisorption or surface reaction.

Figure 19:
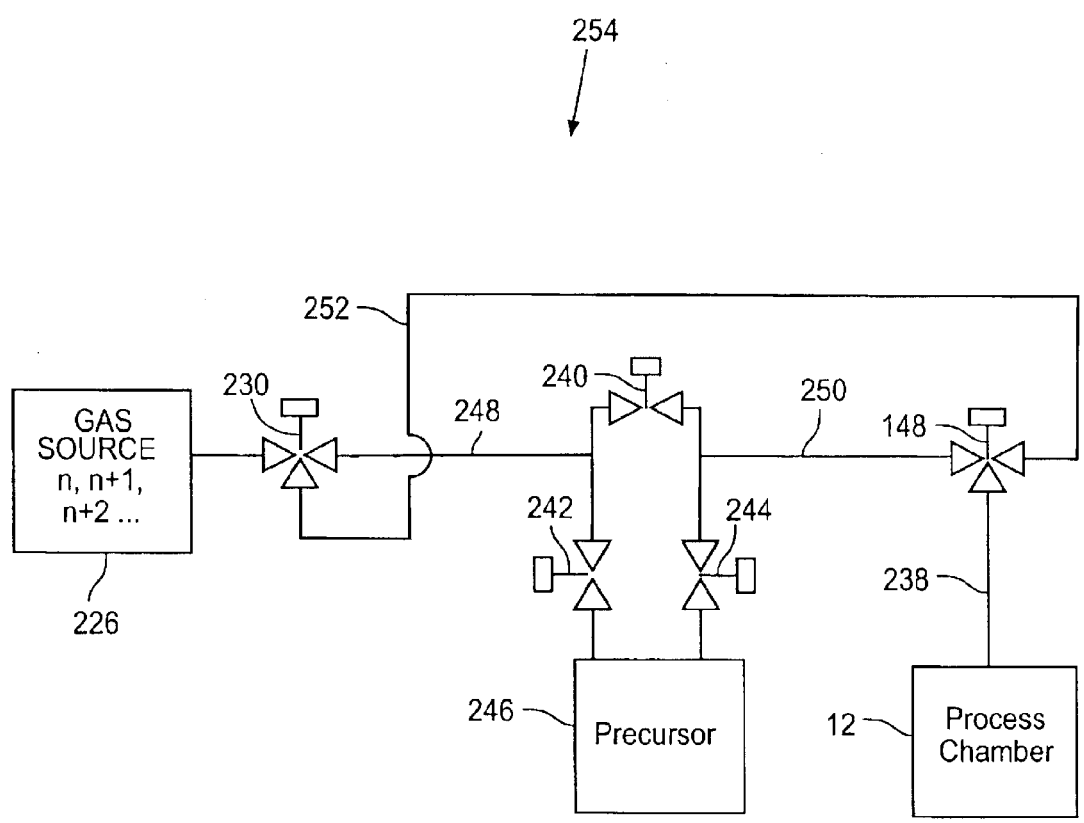
FIG. 19 is a schematic diagram of a valve system for gas delivery in the ALD reactor of FIG. 8.
Figure 20:
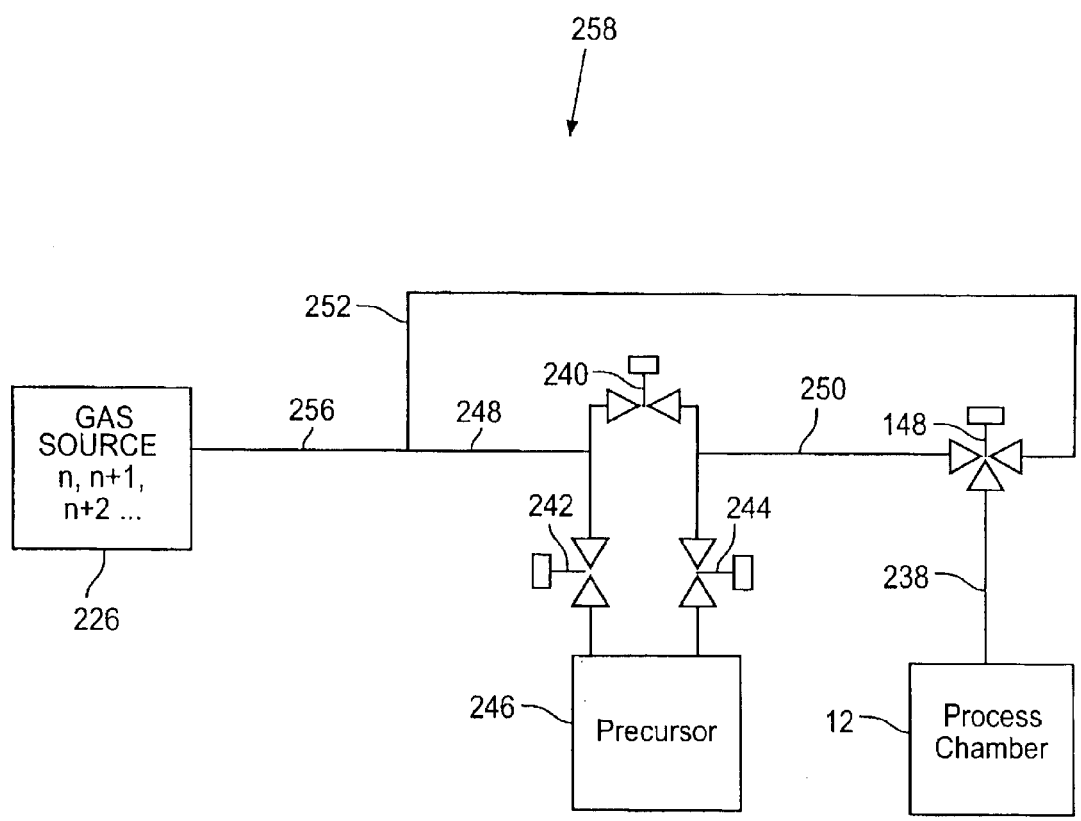
FIG. 20 is a schematic diagram of a valve system for gas delivery in the ALD reactor of FIG. 8.

Practitioners will appreciate that alternative embodiments of valve systems for gas delivery to reactor 100 are possible. In the embodiment shown in FIG. 18, two separate gas sources are shown providing the carrier gas and the purge gas, which may be different gases. It is possible, however, that in some embodiments the same gas used as the purge gas may be used as the carrier gas for the precursor. In this case, separate gas sources may be used as shown in FIG. 18, or first gas source 226 may be used singly in a valve system 254, which has many similar components to valve system 224 of FIG. 18, as shown schematically in FIG. 19. Valve system 254 can be simplified by replacing three-way valve 230 with a T-junction 256 as shown schematically in FIG. 20 for a valve system 258, which has many similar components to valve system 224 of FIG. 18. As in valve system 224 of FIG. 18, showerhead three-way valves 148 in valve system 254 (FIG. 19) and valve system 258 (FIG. 20) control the flow of purge gas or carrier-plus-precursor gas to chamber 12. As shown in valve system 254 (FIG. 19) and valve system 258 (FIG. 20), pump 236 may not be used in some embodiments.

In some embodiments, gas delivery of multiple precursors may be desirable. Two embodiments of multiple precursor delivery are shown in the schematic diagrams of a valve system 260 in FIG. 21 and a valve system 262 in FIG. 22. Valve systems 260 (FIG. 21) and 262 (FIG. 22) each have many similar components to valve system 224 of FIG. 18. Valve systems 260 (FIG. 21) and 262 (FIG. 22) are shown configured for two precursor sources, but may be further adapted for additional precursor sources. In each of valve systems 260 (FIG. 21) and 262 (FIG. 22), a second three-way valve 264 controls the flow of carrier gas to a second precursor source 266. A fourth on/off valve 268, a fifth on/off valve 270, and a sixth on/off valve 272 are coupled similarly to, and operate similarly to, valves 240, 242, and 244, respectively, to control the flow of carrier gas through second precursor source 266. A gas line 274, similar to gas line 248, is coupled between three-way valve 264 and on/off valve 270.

Figure 21:
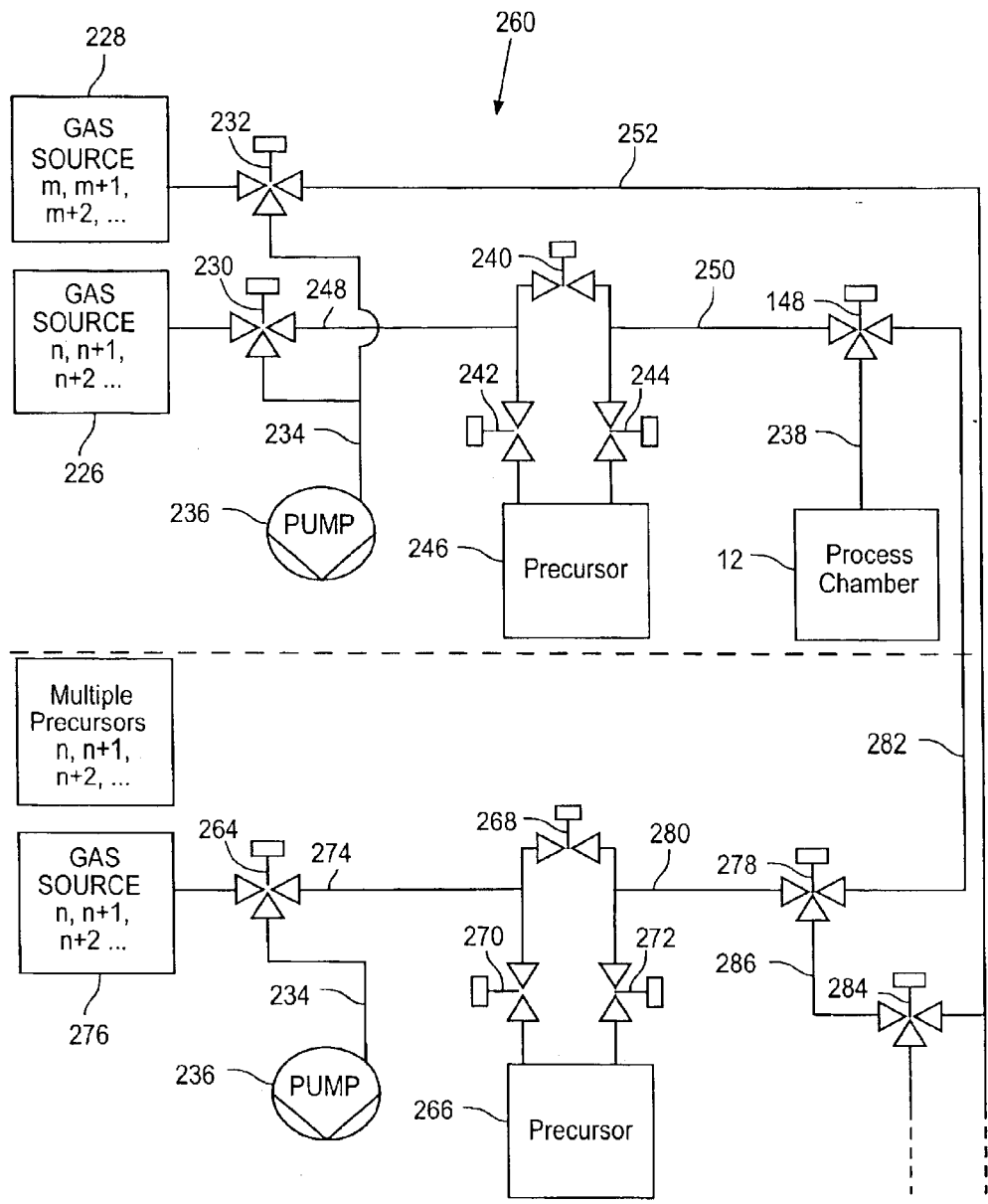
FIG. 21 is a schematic diagram of a valve system for gas delivery in the ALD reactor of FIG. 8.

In FIG. 21, valve system 260 further includes a third gas source 276 in addition to first and second gas sources 226 and 228 of valve system 224 of FIG. 18. A third three-way valve 278, coupled to on/off valve 272 via a gas line 280, controls delivery of the second precursor to showerhead three-way valve 148 via a gas line 282. A fourth three-way valve 284 controls delivery of the purge gas via gas line 252 and a gas line 286 to three-way valve 278, which directs the purge gas to showerhead three-way valve 148 as needed via gas line 282.

Figure 22:
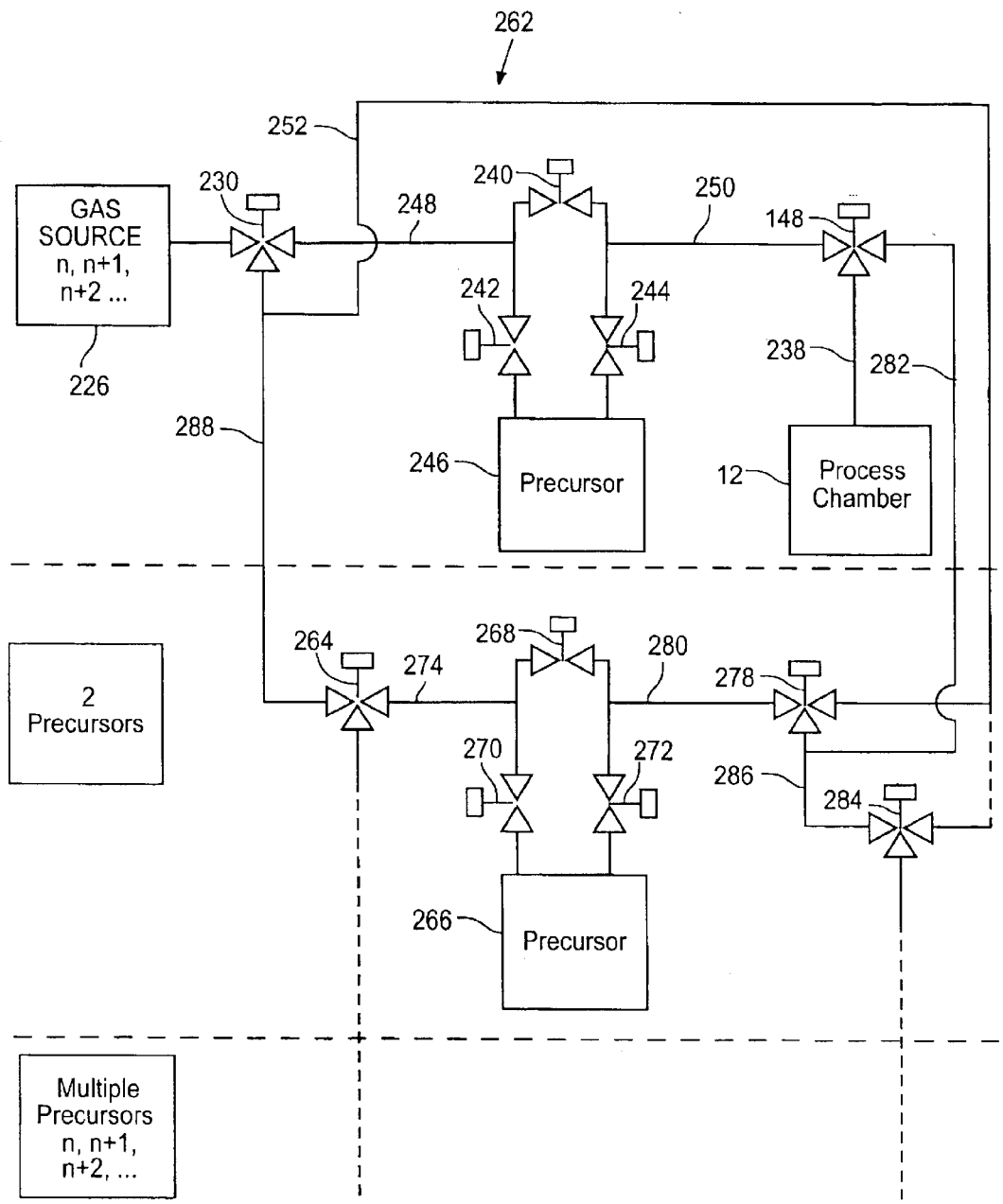
FIG. 22 is a schematic diagram of a valve system for gas delivery in the ALD reactor of FIG. 8.

In FIG. 22, valve system 262 is shown configured to use gas source 226 for both the purge and carrier gases. The carrier gas is delivered from gas source 226 to three-way valve 264 via a gas line 288. The purge gas is delivered to the second terminal of a third three-way valve 278 (and similar valves of any additional precursor sources) via gas line 252. The third terminal of three-way valve 278 is coupled to the second terminal of showerhead three-way valve 148 via gas line 282. Three-way valve 278 thus controls delivery of the second precursor and the purge gas to showerhead three-way valve 148.

Other modifications may be made for alternative embodiments of the valve systems of FIGS. 18, 19, 20, 21, and 22. The functions of showerhead three-way valve 148 may be accomplished instead with an equivalent network of on/off valves (similar to valves 240, 242, and 244) and fittings. Metering valves may be added to branches to regulate the flow for specific branches. Pressure sensors may be added to branches and coupled with the valve actuation to introduce known amounts of reactant. Valve timing may be manipulated to deliver "charged" volumes of gas to process chamber 12. The traditional valves may be replaced with advanced designs such as micro-electromechanical (MEM) based valves or valve networks. The entire valve system can be heated to prevent condensation of reactants in the network.

Figure 23A:
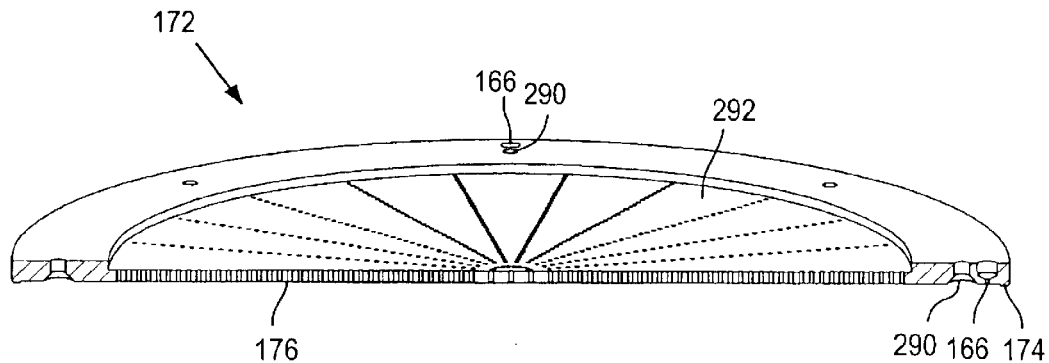
FIG. 23 is a perspective cross-section of two embodiments of a showerhead for gas distribution.
Figure 23B:
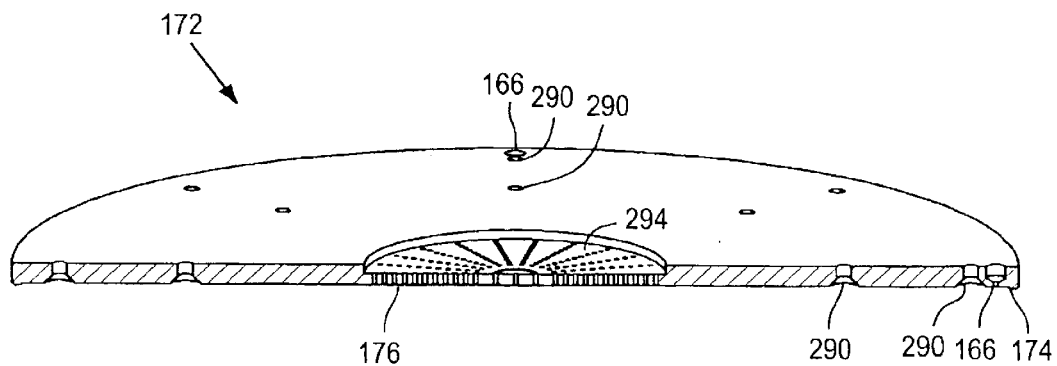

FIG. 23 is a perspective cross-section of two embodiments of a showerhead 172 for gas distribution. Showerhead 172 is designed to have a larger diameter, and thus a larger area, than substrate 8 and ESC 6 (FIG. 13). Showerhead 172 includes a plurality of mounting holes 290 used to facilitate attachment of showerhead 172 to chamber lid 10 with a plurality of fasteners (see FIG. 13). Showerhead 172 also includes a plurality of pressure sensor orifices 166, one for each pressure sensor used to sense the pressure in process chamber 12. For example, fast chamber pressure sensor 142 and precision chamber pressure sensor 144 (FIG. 8) would each require a pressure sensor orifice 166 in showerhead 172. Showerhead 172 also includes showerhead lip 174 peripherally around the edge of showerhead 172 used to prevent shadow ring 28 from hitting showerhead 172.

Showerhead 172 also includes a cavity 292 centrally located in an upper surface of showerhead 172 as shown in FIG. 23(*a*). Cavity 292 forms plenum 170 (FIG. 13) upon attachment of showerhead 172 to chamber lid 10. A plurality of showerhead gas orifices 176 are arranged within cavity 292 in a pattern designed for a particular gas flow distribution. The diameter of cavity 292 is designed to be larger than the diameter of substrate 8 (FIG. 13). In the embodiment of FIG. 23(*b*), showerhead 172 includes a cavity 294 that is similar to cavity 292 of FIG. 23(*a*), but cavity 294 has a diameter designed to be smaller than the diameter of substrate 8. Practitioners will appreciate that a number of different diffusing devices may be used to tailor the directionality of the gas flows as needed.

Figure 24:
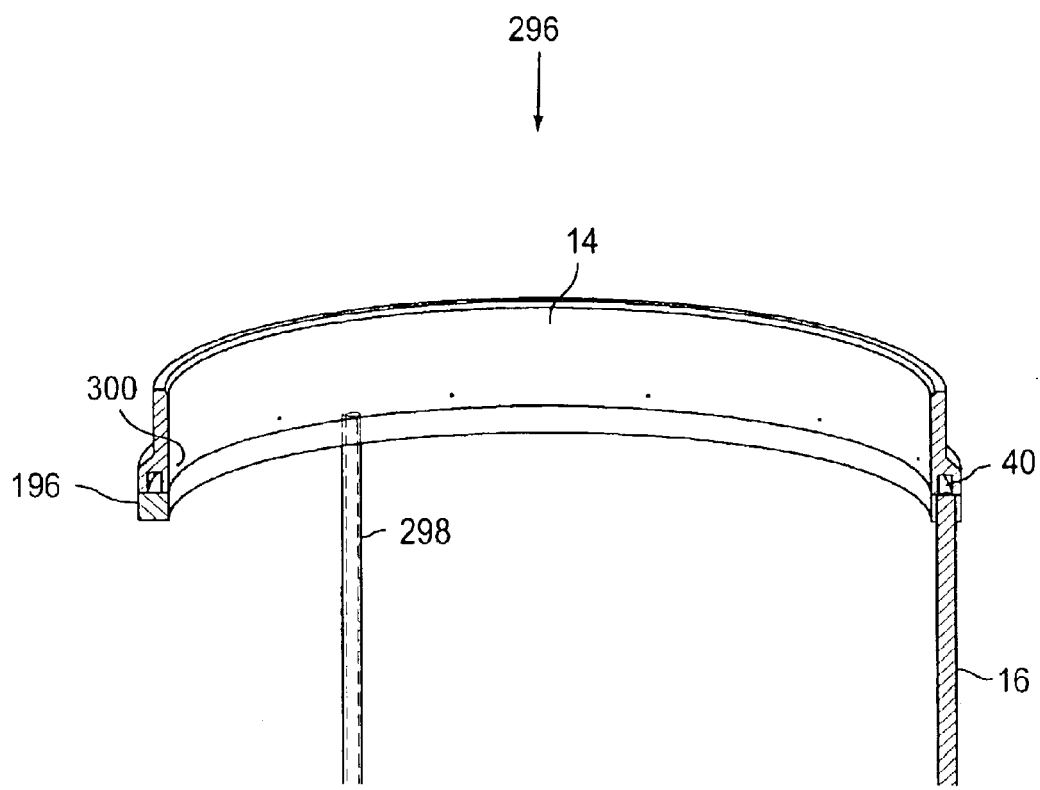
FIG. 24 is a perspective cross-section of an embodiment of a shield assembly for the ALD reactor of FIG. 8.

As mentioned above, gas may also be introduced into process chamber 12 through shield 14. This allows cylindrical gas introduction around the volume of process chamber 12 as discussed above with reference to FIG. 4. FIG. 24 is a perspective cross-section of an embodiment of a shield assembly 296, including a shield gas channel 40, for ALD reactor 100 of FIG. 8. A plurality of shield support legs 16 attach to shield cap 196, which is attached to the base of shield 14. Most of shield support legs 16 are solid. Gas is introduced into shield 14, through at least one hollow shield support leg 298, which extends through shield cap 196 into shield gas channel 40 in shield 14.

Shield gas channel 40 is annular and runs completely around the base of shield 14. Shield gas channel 40 is a high conductance channel that allows introduced gas to distribute evenly around shield gas channel 40 of shield 14 before introduction into process chamber 12 (FIG. 13). Gas is introduced to chamber 12 through a plurality of gas flow orifices 300, which are evenly spaced along shield gas channel 40 and extend through an inner wall of shield 14 into process chamber 12. The gas introduction path of shield assembly 296 is designed to ensure uniform gas flow around substrate 8 as discussed with reference to FIG. 4.

Introduction of gas through shield 14 allows tremendous flexibility in designing ALD processes. In some embodiments, the same gas introduced through showerhead 172 can be simultaneously introduced through shield 14 to provide improved coverage in process chamber 12 and on substrate 8 (FIG. 13). Alternatively, in some embodiments, one gas can be introduced through showerhead 172 while a different gas is introduced through shield 14, allowing improved gas isolation and quicker cycling of the gases.

Movement of shield 14, either before or during the gas flow, allows gas to be introduced at different planes within process chamber 12, parallel to the plane of substrate 8. The shield motion can be used to optimize the gas flow distribution of a particular ALD process.

As discussed previously, another role of shield 14 is to confine plasma 194 during processing (FIG. 13), which can result in heating of shield 14. To maintain the shield at an acceptable process temperature, a cooling/heating channel can be incorporated in the shield design. This also helps prevent deposition on shield 14.

Figure 25:
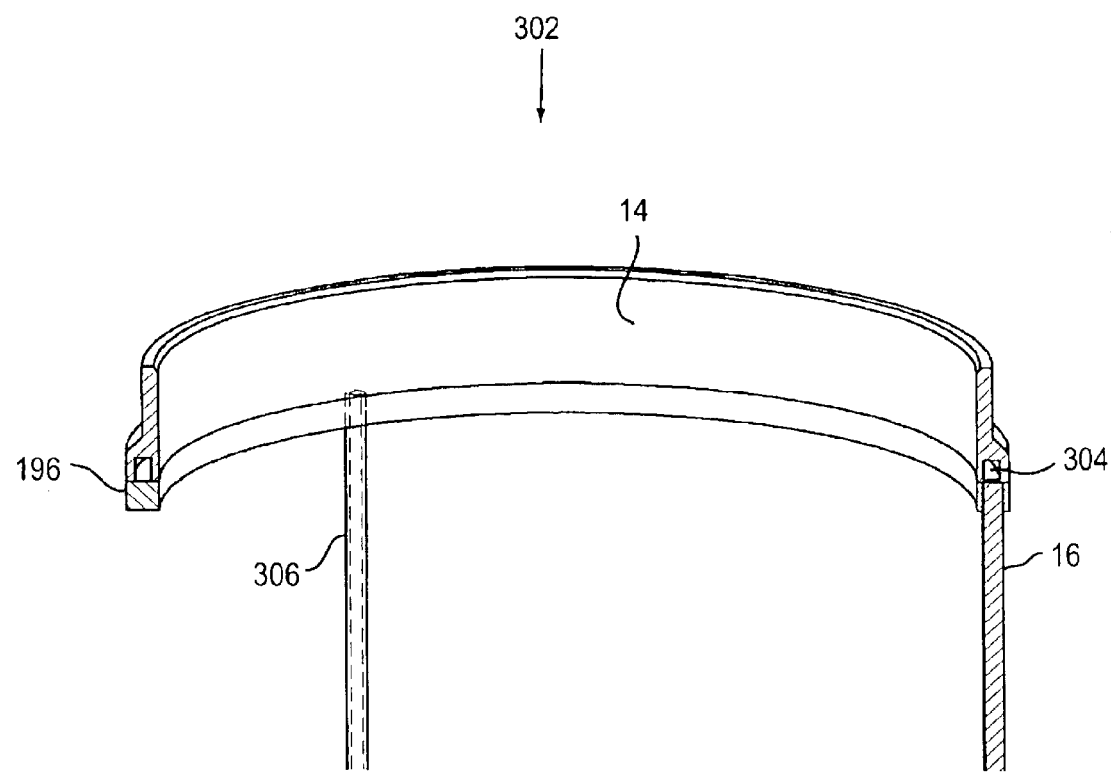
FIG. 25 is a perspective cross-section of an embodiment of a shield assembly for the ALD reactor of FIG. 8.

FIG. 25 is a perspective cross-section of an embodiment of a shield assembly 302, including a shield cooling/heating channel 304, for ALD reactor 100 of FIG. 8. Shield assembly 302 includes some shield support legs 16, which are solid, attached to shield cap 196 at the base of shield 14. Similar to shield assembly 296 of FIG. 24, which includes gas channel 40, a cooling or heating fluid flows up into shield 14 through at least one hollow shield support leg 306, which extends through shield cap 196 into cooling/heating channel 304 in shield 14. Shield cooling/heating channel 304 is annular and runs about two-thirds of the way around the base of shield 14. The cooling or heating fluid flows down, out of shield 14, through at least one other hollow shield support leg (not shown), which is similar to hollow shield support leg 306.

Figure 26:
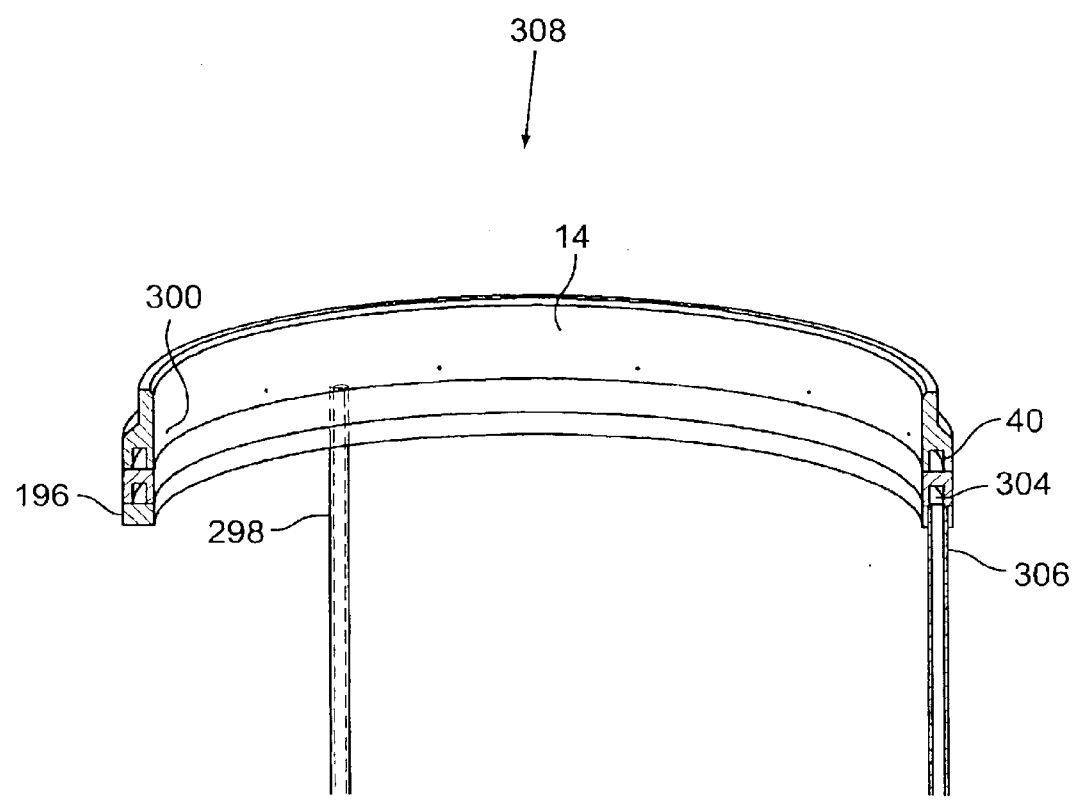
FIG. 26 is a perspective cross-section of an embodiment of a shield assembly for the ALD reactor of FIG. 8.

Cooling or heating of shield 14 using a fluid flowing in cooling/heating channel 304 also allows improved control of the temperature of gases introduced into process chamber 12 through shield 14. FIG. 26 is a perspective cross-section of an embodiment of a shield assembly 308, including both shield gas channel 40 and shield cooling/heating channel 304, for ALD reactor 100 of FIG. 8. In the embodiment shown in FIG. 26, gas channel 40 is located above cooling/heating channel 304. Hollow shield support leg 306 extends through shield cap 196 into cooling/heating channel 304 to allow fluid flow. Hollow shield support leg 298 extends through shield cap 196 and cooling/heating channel 304 into gas channel 40 to allow gas introduction from shield 14 into process chamber 12 via gas flow orifices 300.

Practitioners will appreciate that shield assembly 308 could include alternative arrangements of gas channel 40 and cooling/heating channel 304, including multiple gas channels 40 and/or multiple cooling/heating channels 304.

Design of particular shield assembly embodiments is extremely flexible, and reactor 100 is designed to facilitate removal, replacement, and use of various shield assemblies. This allows the easy introduction of a shield assembly that might include gas delivery and cooling/heating (i.e., shield assembly 308), or only one of these (i.e., shield assemblies 296 or 302), or neither gas delivery nor cooling/heating, depending on the requirements of the customer and the process.

Electrostatic Chuck Assembly Design

ALD processes in the disclosed embodiments are ion-induced (see, for example, application Ser. No. 09/812,352, application Ser. No. 09/812,486, and application Ser. No. 09/812,285, referenced above), rather than thermally induced, through use of plasma 194 generated in process chamber 12 (FIG. 11 and FIG. 13). This allows deposition at lower temperatures than in conventional ALD systems, allowing replacement of conventional heated susceptors with an electrostatic chuck (ESC) assembly 106 to retain substrate 8. ESC assembly 106 may be further designed for improved temperature control and improved radio frequency (RF) power coupling.

Figure 27A:
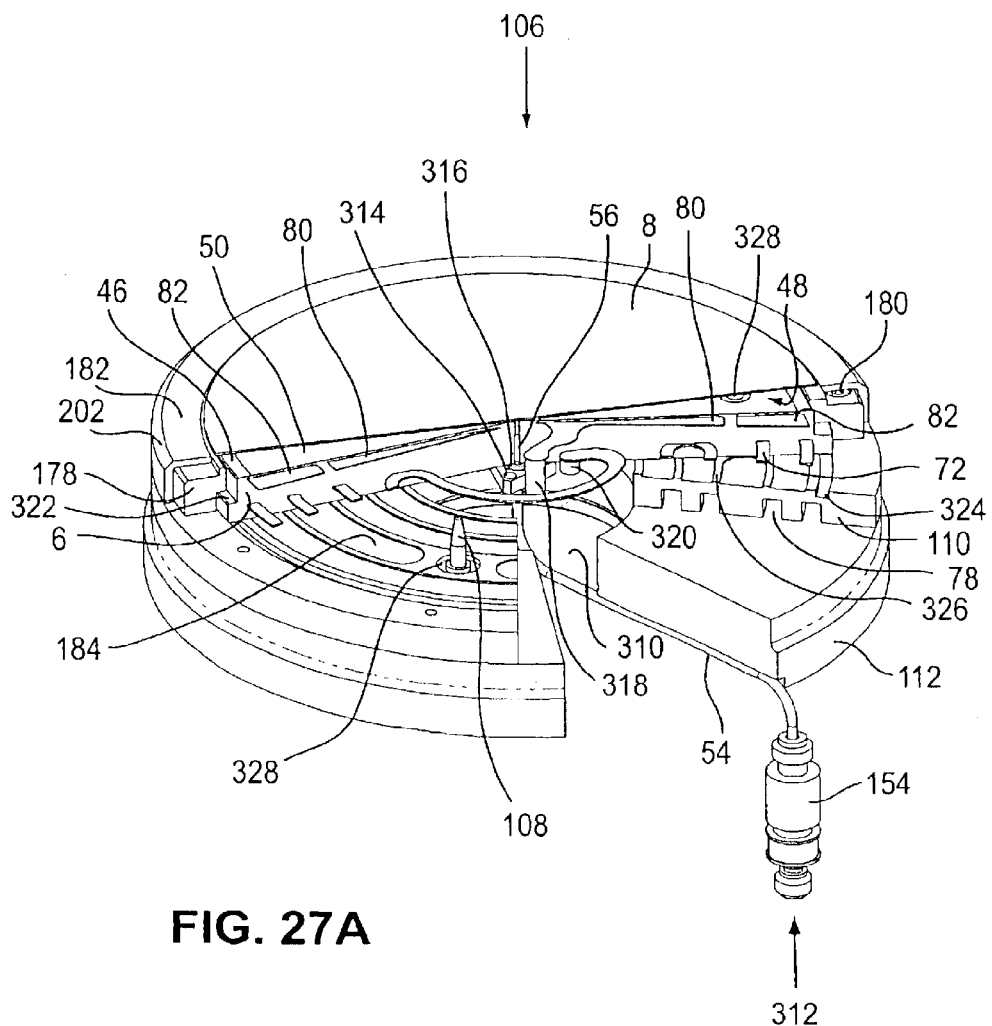
FIG. 27 is a cutaway perspective view of an embodiment of an electrostatic chuck assembly for the ALD reactor of FIG. 8.
Figure 27B:
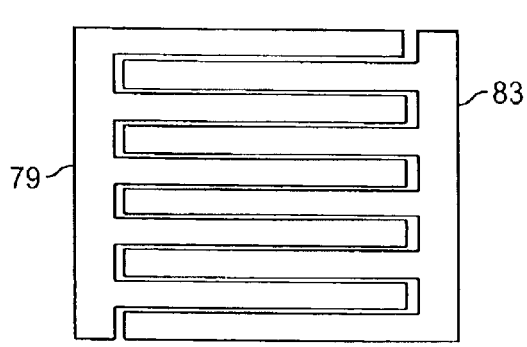
Figure 27C:
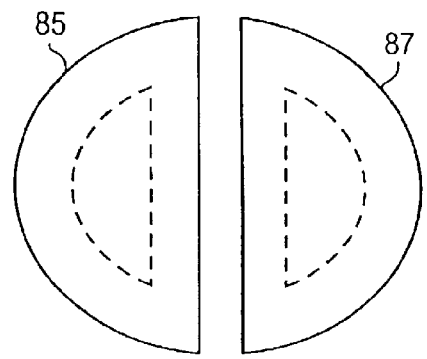

FIG. 27 is a cutaway perspective view of an embodiment of an electrostatic chuck assembly 106 for ALD reactor 100 of FIG. 8. ESC assembly 106 includes in part, an electrostatic chuck (ESC) 6, a cooling plate 110, and a baseplate 112. Cooling plate 110 and baseplate 112 can be shaped as annuli with overlapping central orifices that together define an access port 310, which provides access to a central region of the underside of ESC 6.

Substrate 8 rests on an annular sealing lip 46, peripherally surrounding a top surface 50 of ESC 6. Annular sealing lip 46 holds substrate 8 above surface 50 defining a backside gas volume 48 bounded by surface 50, sealing lip 46, and the backside of substrate 8.

A backside gas is provided to gas volume 48 through a backside gas entry 312 to a backside gas valve 154. Gas valve 154 is located on the exterior underside of reactor 100 at the outer edge of baseplate 112 to provide easy access (FIG. 8 and FIG. 11). The backside gas flows along a backside gas line 54, which runs radially inward along a lower surface of baseplate 112. Gas line 54 curves upward through access port 310 and is attached to the center of the bottom surface of ESC 6 using a backside gas line flange 314. The backside gas flows through a backside gas passageway 56 centrally located in and extending through ESC 6 to gas volume 48. A backside gas line seal 316 inside flange 314 maintains the pressure of gas volume 48. The backside gas plays an important role in the temperature control of substrate 8.

Electrostatic chucks are usually made of a dielectric material (e.g., aluminum nitride AlN, or polyimide). ESC 6 may be designed to have its bulk material effects dominated by the Johnson-Rahbek (JR) effect rather than a coulombic effect, since the JR effect provides a stronger, more efficient electrostatic attraction. A JR ESC typically has a bulk resistivity between $10^8$ and $10^{12}$ Ω-cm, while a coulombic ESC generally has a bulk resistivity greater than $10^{13}$ Ω-cm.

Embedded in the dielectric material of ESC 6, close to top surface 50, are at least two electrodes. A first electrode 80 and a second electrode 82 are shaped as concentric annular plates made of a conductive material, for example, tungsten or molybdenum. First electrode 80 is biased using a first electrode terminal 318, which is coupled to first electrode 80 and extends down through ESC 6 into access port 310. Second electrode 82 is biased using a separate second electrode terminal (not shown). A DC "chucking" voltage is applied to both first electrode 80 and second electrode 82 to create an electrostatic attraction between substrate 8 and top surface 50 of ESC 6 to retain substrate 8 during processing. Simultaneously, RF bias power is coupled to each electrode 80 and 82 as well. The RF bias power provides the power for plasma and hence ion generation during modulated ion induced atomic layer deposition.

In addition to generating a plasma, the RF bias power also induces a slight negative potential (i.e., a DC offset voltage typically $-10V$ to $\leq 80V$ at <150W RF power and 0.1–1 Torr pressure) on substrate 8. The induced voltage defines the ion energy of the positively charged ions in the plasma and attracts the positively charged ions toward the surface of substrate 8. The positively charged ions impinge on the wafer, driving the deposition reaction and improving the density of the deposited film.

A resistive heater 72 is also embedded in ESC 6. Resistive heater 72 is shaped as at least one coil or ribbon that winds throughout ESC 6 in a plane located about midway between electrodes 80 and 82 and the bottom of ESC 6. Heater 72 is controlled via at least one resistive heater terminal 320 coupled to heater 72. Terminal 320 extends down through ESC 6 into access port 310. Thus, ESC 6 is basically a dielectric substrate support with an embedded heater 72 and embedded electrodes 80 and 82 for DC biasing and RF power coupling.

ESC 6 is held in contact with cooling plate 110 using an annular clamp ring 178, which overlaps a clamp land 322 of a surrounding flange at the base of ESC 6. An ESC O-ring 324 creates a vacuum seal between ESC 6 and cooling plate 110. A plurality of clamp ring fasteners 180, each extending through clamp ring 178 into cooling plate 110, secure the connection between ESC 6 and cooling plate 110. A process kit 182, having an annular elbow shape, fully surrounds clamp ring 178 covering a top surface and a side surface of clamp ring 178. Process kit 182 includes a process kit bevel 202 used for centering a shadow ring 28 (FIG. 15) on process kit 182. Process kit 182 may be made of a dielectric material (e.g., aluminum oxide, aluminum nitride, or hard-anodized aluminum) to electrically isolate clamp ring fasteners 180 from ESC 6 and substrate 8. Process kit 182 also protects clamp ring 178 and fasteners 180 from process gases, facilitating cleaning of reactor 100 (FIG. 12).

Cooling plate 110 can be made (e.g., machined) from a variety of thermally conductive materials, for example, aluminum or stainless steel. An upper surface of cooling plate 110 is patterned to create a plurality of small area contacts 326 and a plurality of thermal breaks 184. Contacts 326, which have the form of ridges, contact the bottom surface of ESC 6. Thermal breaks 184 are gaps between ESC 6 and cooling plate 110, which increase the temperature difference between ESC 6 and cooling plate 110. The temperature of cooling plate 110 can be controlled using a fluid (e.g., water) flowing in a plurality of coolant channels 78. Coolant channels 78 are designed to allow the fluid to flow in a largely circular manner at various diameters of cooling plate 110.

A lower surface of cooling plate 110 is attached to an upper surface of baseplate 112. The upper surface of baseplate 112 forms the lower walls of coolant channels 78 in cooling plate 110. Baseplate 112, which may be made of aluminum, provides structural support for ESC assembly 106. Thermal breaks 184 of cooling plate 110 allow maintenance of a significant temperature difference between top surface 50 (which may be near 300° C.) of ESC 6 and a bottom surface of baseplate 112 (which is exposed to air and may be less than 50° C.).

One of a plurality of lift pins 108, which facilitate loading and unloading of substrate 8, is shown in retracted process position, with the tip of lift pin 108 below top surface 50 of ESC 6. Each lift pin 108 extends through a lift pin orifice 328, which includes a plurality of aligned orifices in baseplate 112, cooling plate 110, and ESC 6.

Alternative embodiments of ESC assembly 106 are possible. For example, in some embodiments, at least one peripheral ring of holes can be used to introduce the backside gas, rather than just a centrally located hole, as discussed in more detail below. In addition, in some embodiments, ESC 6 can be replaced with a conventional susceptor to facilitate ALD processes at higher temperatures. Practitioners will appreciate that various other embodiments are possible.

Temperature Control of Electrostatic Chuck Assembly

Temperature control of ESC assembly 106 (FIG. 27) is important for high quality atomic layer deposition. A uniform temperature across a substrate 8 resting on annular sealing lip 46 of ESC 6 promotes uniform chemisorption of precursors. If the temperature of substrate 8 is too high, decomposition or desorption of precursors may occur. If the temperature of substrate 8 is too low, either or both of the chemisorption and the deposition reactions will be impeded.

Figure 28:
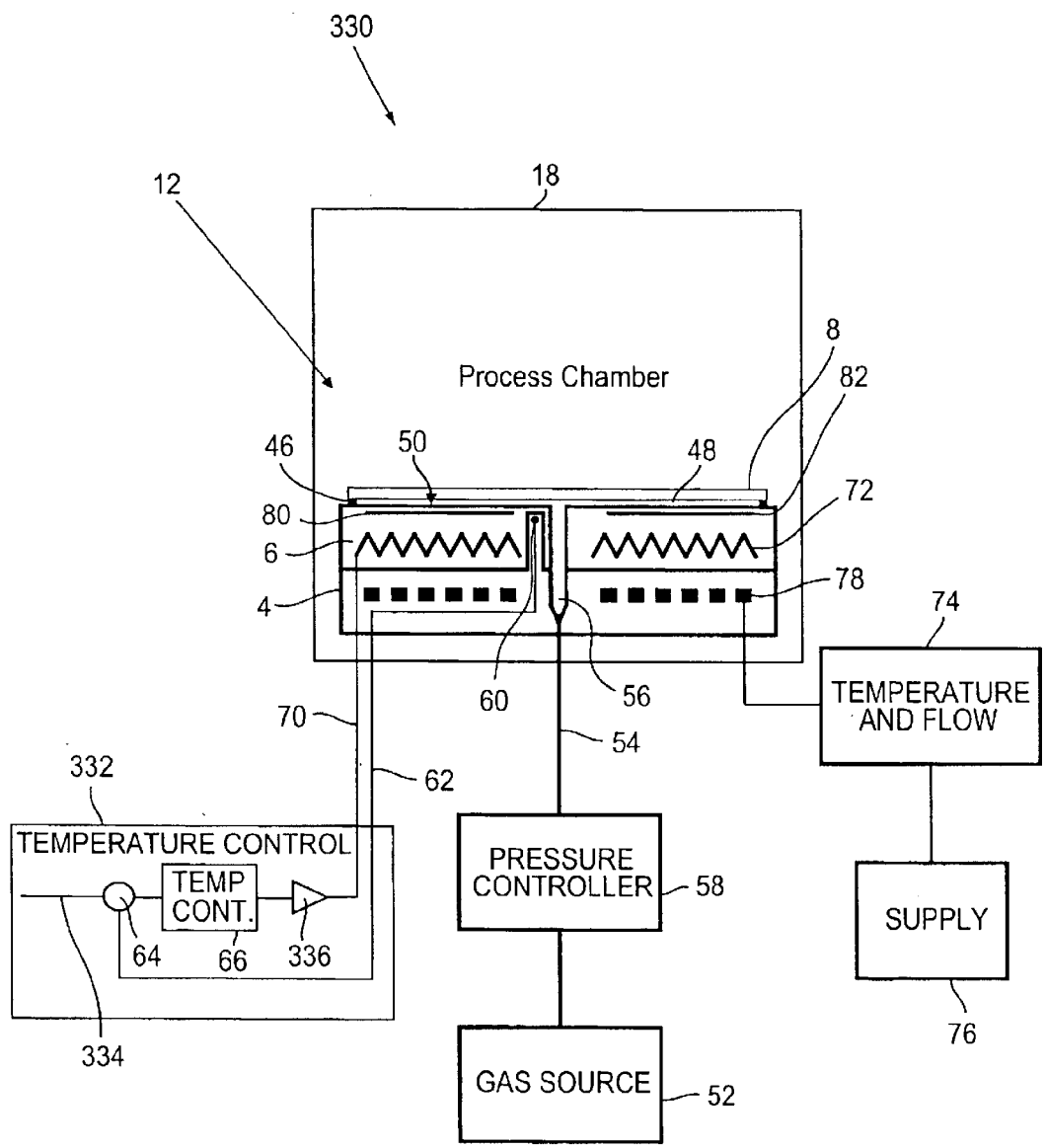
FIG. 28 is a schematic diagram of a control system for the electrostatic chuck assembly of FIG. 27 of the ALD reactor of FIG. 8.

FIG. 28 is a schematic diagram of a control system 330 for electrostatic chuck (ESC) assembly 106 (FIG. 27) of ALD reactor 100 of FIG. 8. Control system 330 may also be applied to various embodiments of pedestal 4 of ALD reactor 2 of FIG. 1. Control system 330 is an embodiment of control system 44 of FIG. 6, as discussed previously.

Control system 330 is used to establish and maintain a uniform temperature across substrate 8. As shown in FIG. 28, substrate 8 rests on an annular sealing lip 46 defining a backside gas volume 48 between substrate 8 and top surface 50 of ESC 6. A backside gas (e.g., Ar, He, etc.) is usually chosen from among the species in chamber 12 to prevent contamination in the deposited film. The backside gas flows from a backside gas source 52 along a backside gas line 54, through a backside gas passageway 56 in ESC 6, and into gas volume 48.

The backside gas improves the thermal contact between substrate 8 and ESC 6, by providing a medium for thermal energy transfer between substrate 8 and ESC 6. Heat transfer improves with increasing backside gas pressure, up to a saturation limit. Typical ranges are 6–10 Torr for good thermal conductivity. A pressure controller 58 maintains the backside gas at a constant pressure, thus ensuring constant heat transfer and uniform substrate temperature. In practice, annular sealing lip 46 may take the form of several islands scattered across top surface 50 of ESC 6. This introduces a leak rate of the backside gas that must be taken into account.

The temperature of substrate 8 is modulated by heating or cooling ESC 6. A temperature sensor 60 (e.g., a thermocouple or optical infrared sensor) is coupled via a sensor connection 62 to a temperature monitor 64 in a closed loop feedback control circuit 332. A temperature setpoint signal is also provided to monitor 64 via a setpoint electrical connection 334. A temperature controller 66 creates a signal that is amplified through a power amplifier or modulator 336 and applied via an electrical connection 70 to a resistive heater terminal 320 (FIG. 27), which is coupled to a resistive heater 72 embedded in ESC 6. A coolant temperature and flow controller 74, as is widely known, controls the fluid from a coolant supply 76 as it flows in a plurality of coolant channels 78 in pedestal 4 (or in ESC assembly 106 in FIG. 12 and FIG. 13).

Control system 330 is designed to control the temperature of substrate 8, by heating and/or cooling, for a wide range of power and temperature. Temperature control can be accomplished by various techniques, including regulating the backside gas pressure, heating ESC 6 directly with resistive heater 72, or regulating the temperature and/or flow of fluid in coolant channels 78. The temperature of substrate 8 can thus be periodically or continuously varied during the deposition process to meet different process demands. Additional information regarding temperature control in atomic layer deposition may be found in related U.S. application Ser. No. 09/854,092, entitled "Method And Apparatus For Improved Temperature Control In Atomic Layer Deposition," filed May 10, 2001.

Alternative embodiments of control system 330 of FIG. 28 are possible. For example, the temperature control system of circuit 332 may have various embodiments. In addition, temperature sensor 60 may have various embodiments. Temperature sensor 60 may be a thermocouple that measures the temperature of ESC 6. Temperature sensor 60 may be a pyrometer device that optically measures the temperature of the backside of substrate 8. Or, temperature sensor 60 could take other equivalent forms.

Figure 29:
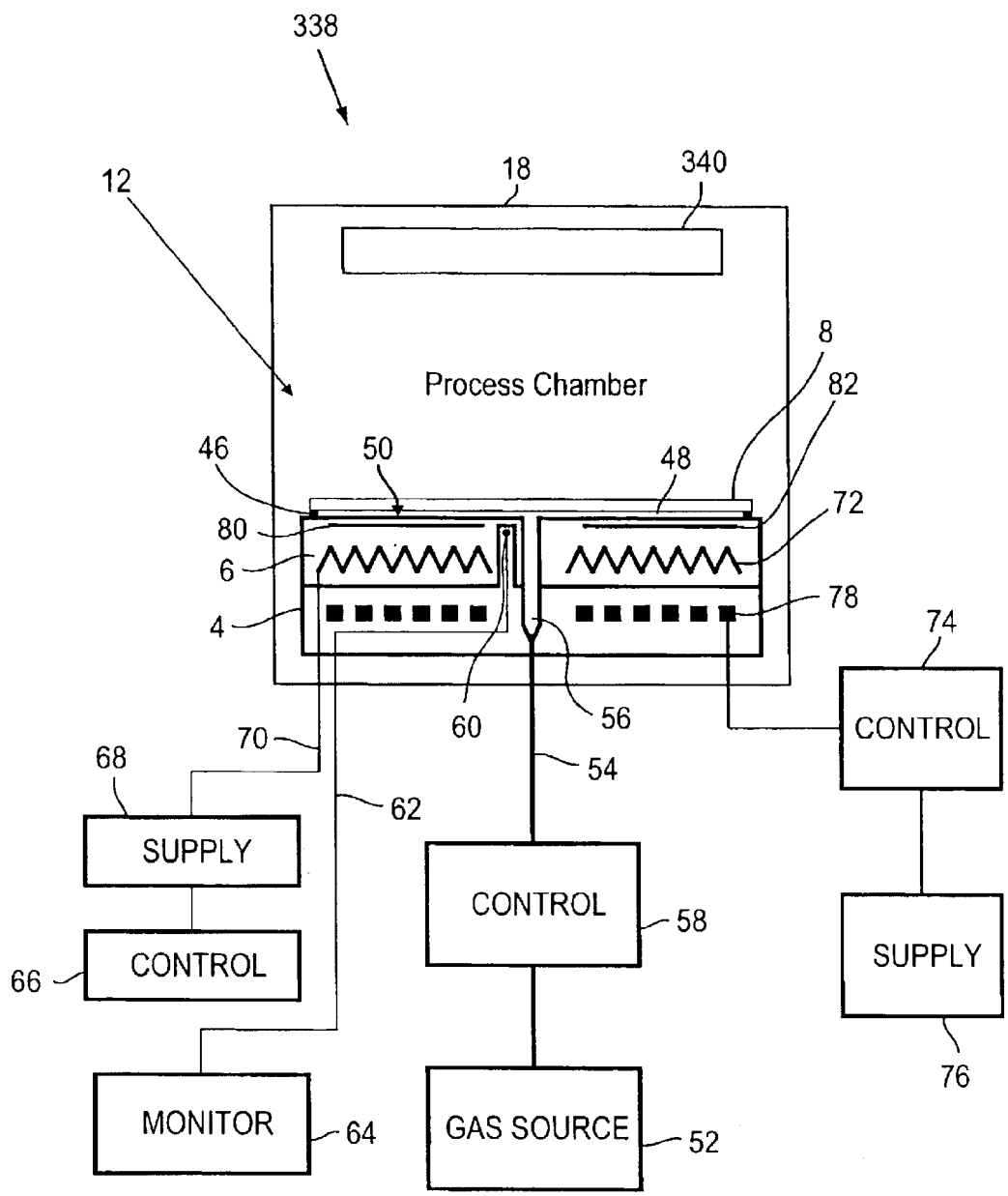
FIG. 29 is a schematic diagram of a control system including an alternative energy source for the electrostatic chuck assembly of FIG. 27 of the ALD reactor of FIG. 8.

In some embodiments of control system 330 of FIG. 28, an alternative energy source may be included as another option to control the temperature of substrate 8. FIG. 29 is a schematic diagram of a control system 338, including an alternative energy source 340, for pedestal 4 of reactor 2 (FIG. 1) or for ESC assembly 106 (FIG. 27) of ALD reactor 100 (FIG. 8). Control system 338 is similar to control system 44 (FIG. 6) and control system 330 (FIG. 28), as discussed previously. Alternative energy source 340 is located outside of pedestal 4 (or ESC assembly 106) near the top of chamber 12 and may include radiation from lamps, a plasma, or another source. Alternative energy source 340 could be controlled, for example, by regulating the power to the lamps or plasma. Alternative energy source 340 could be used alone, or in conjunction with one or more of resistive heater 72, the fluid in coolant channels 78, or the pressure of the backside gas in gas volume 48.

In some embodiments, an additional cooling source may be added to control system 330 of FIG. 28 to improve the cooling capacity and/or performance. The additional cooling source could be a refrigeration system, a heat pipe, a refrigerated liquid or gas coolant system, or other equivalent system.

Figure 30:
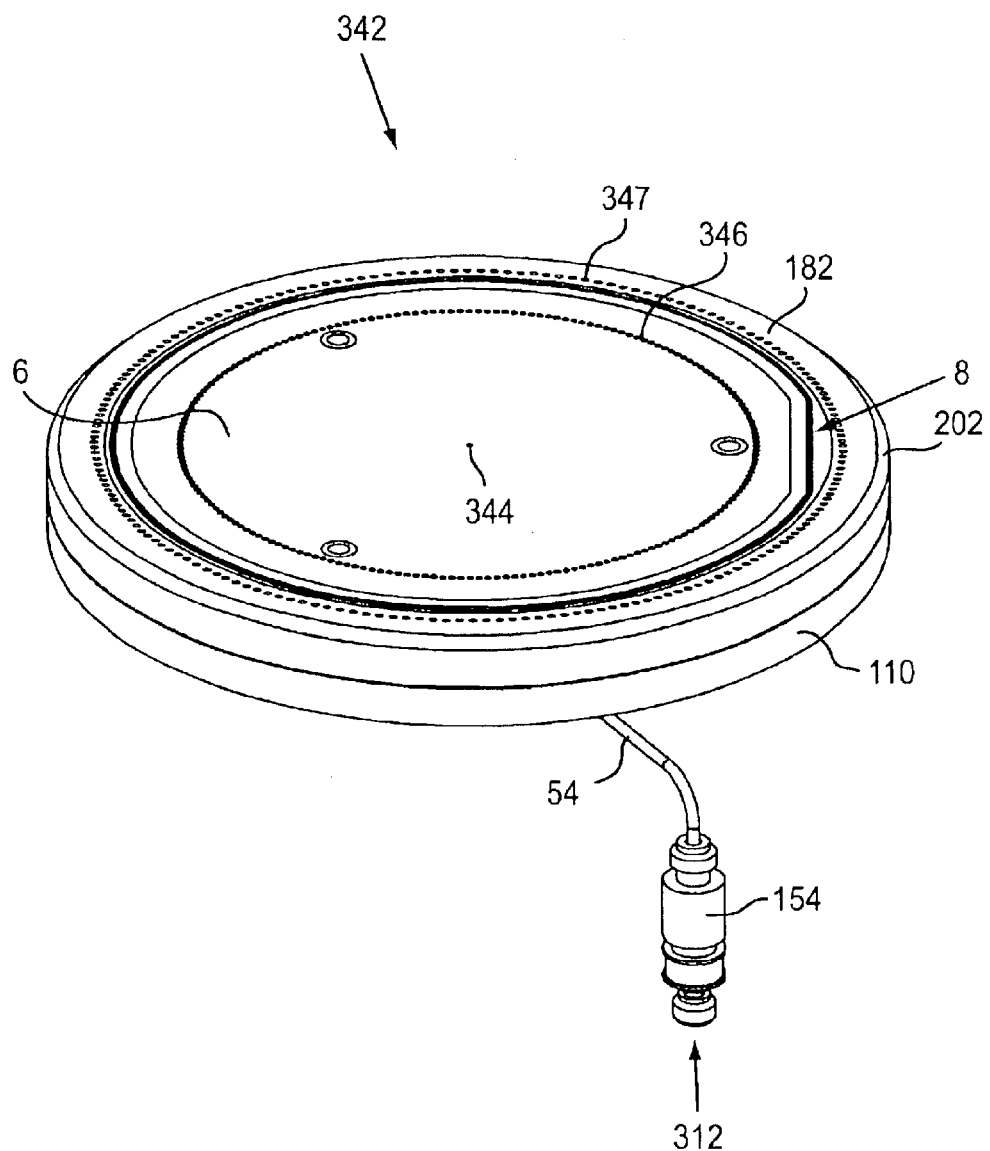
FIG. 30 is a perspective view of an embodiment of a portion of an electrostatic chuck assembly for the ALD reactor of FIG. 8.

In some embodiments of control system 330 of FIG. 28, the backside gas may be introduced to gas volume 48 through multiple orifices rather than just a centrally located orifice. FIG. 30 is a perspective view of an embodiment of a portion 342 of an ESC assembly 106 (FIG. 27) for ALD reactor 100 of FIG. 8. ESC 6 includes a central orifice 344 as well as a peripheral ring of orifices 346 located near the periphery of substrate 8. Various embodiments of ESC 6 may include either or both of orifice 344 and orifices 346. Orifices 346 result in improved pressure uniformity between substrate 8 and ESC 6, which results in improved temperature uniformity across substrate 8. An additional peripheral ring of orifices (not shown) can be added outside of orifices 346 to ensure a constant pressure gradient at the edge of substrate 8. The additional ring of orifices would also serve as an edge purge to prevent reactive gases from entering gas volume 48 (FIG. 28) and causing deposition on the backside of substrate 8.

In some embodiments of control system 330 of FIG. 28, pressure controller 58 may be replaced by, for example, a flow regulator such as a metering valve or mass flow controller. In still other embodiments, an actuation valve can be added between pressure controller 58 and backside gas volume 48 to isolate pressure controller 58 and gas source 52 from process chamber 12 during a substrate transfer. This valve may additionally be used to stop the flow of backside gas to reduce its pressure, allowing the substrate to "de-chuck" without "popping" (shifting) when electrodes 80 and 82 in ESC 6 are de-powered. This valve may additionally be used in conjunction with a pump to more quickly reduce the backside gas pressure before "de-chucking" substrate 8.

Practitioners will appreciate that various other embodiments of control system 330 and its various constituents are possible.

Electrical Biasing and Plasma Generation Using Electrostatic Chuck Assembly

Figure 31:
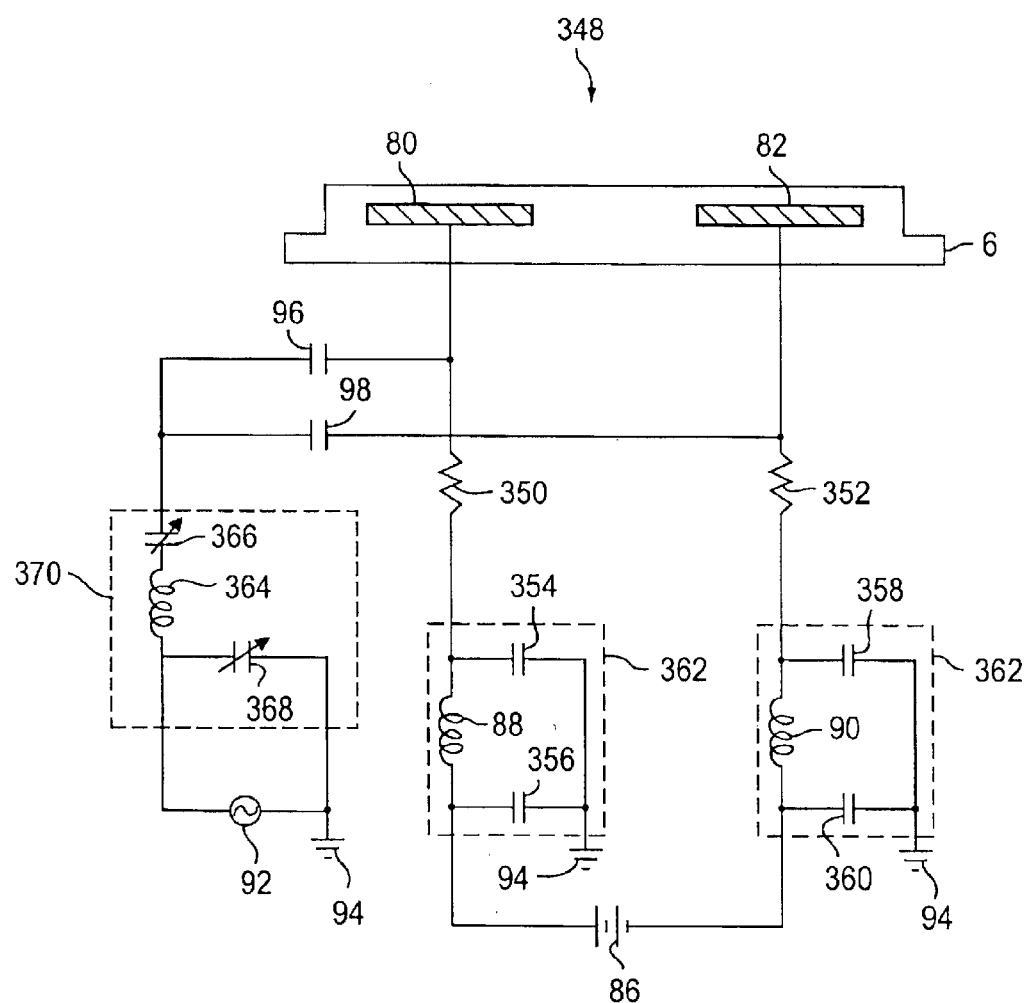
FIG. 31 is a schematic diagram of a circuit for electrical biasing of the electrostatic chuck of the ALD reactor of FIG. 8.

FIG. 31 is a schematic diagram of a circuit 348 for electrical biasing of electrostatic chuck (ESC) 6 of ESC assembly 106 (FIG. 27) of ALD reactor 100 of FIG. 8. Circuit 348 may also be applied to various embodiments of ESC 6 of pedestal 4 of ALD reactor 2 of FIG. 1. Circuit 348 is an alternative embodiment to circuit 84 of FIG. 7, as discussed previously.

As shown in FIG. 31, ESC 6 includes at least a first electrode 80 and a second electrode 82. One possible embodiment of the electrode geometry of first and second electrodes 80 and 82 (shown schematically in FIG. 31) is shown in FIG. 27, where first and second electrodes 80 and 82 are shown as concentric annular plates. A double D (i.e., mirror imaged) configuration for electrodes 80 and 82 can also be used. In FIG. 31, first and second electrodes 80 and 82 are each biased with a DC voltage. RF bias power is also coupled to both electrodes 80 and 82. Embedding electrodes 80 and 82 in ESC 6 allows improved RF power coupling to substrate 8 with maximum uniformity and minimal power loss, compared to applying RF power to cooling plate 110 (or baseplate 112) upon which ESC 6 sits (FIG. 27). This is because electrodes 80 and 82 in ESC 6 are close to substrate 8, while cooling plate 110 (and baseplate 112) are comparatively far from substrate 8.

First electrode 80 and second electrode 82 are biased with different DC potentials to provide the "chucking" action that holds substrate 8 to ESC 6 prior to plasma ignition and during deposition. As shown in FIG. 31, first electrode 80 is coupled via a serial coupling of a first inductor 88 and a first load resistor 350 to one terminal of a DC power supply 86. Second electrode 82 is coupled via a serial coupling of a second inductor 90 and a second load resistor 352 to the other terminal of DC power supply 86.

A third capacitor 354 is coupled between one terminal of inductor 88 and a ground terminal 94. A fourth capacitor 356 is coupled between the other terminal of inductor 88 and ground terminal 94. A fifth capacitor 358 is coupled between one terminal of inductor 90 and ground terminal 94. A sixth capacitor 360 is coupled between the other terminal of inductor 90 and ground terminal 94. Inductor 88 and capacitors 354 and 356 together form an RF trap circuit 362, which filters RF from the DC bias. Similarly, inductor 90 and capacitors 358 and 360 together form another RF trap circuit 362.

RF power is also supplied to both first electrode 80 and second electrode 82 using an RF generator 92 with one terminal coupled to ground terminal 94. A third inductor 364 is coupled between the other terminal of RF generator 92 and one terminal of a first variable capacitor 366. The other terminal of variable capacitor 366 is coupled to one terminal of a first capacitor 96 and to one terminal of a second capacitor 98. The other terminal of capacitor 96 is coupled to first electrode 80. The other terminal of capacitor 98 is coupled to second electrode 82. A second variable capacitor 368 is coupled across the terminals of RF generator 92, between one terminal of inductor 364 and ground terminal 94. Inductor 364 and capacitors 366 and 368 together form an RF impedance matching circuit 370, which minimizes the reflected power to RF generator 92.

Circuit 348 of FIG. 31 allows simultaneous application of a DC "chucking" voltage and of an RF power for plasma generation during processing. The same RF power is used to create plasma 194 above substrate 8 (FIG. 13) and to generate a negative, induced DC bias on substrate 8. RF power can be used since the breakdown voltage required to generate plasma 194 using RF power is far lower than in the DC case (e.g., 100V vs. 300–400V) for a given Paschen curve of pressure-distance product (P×d). In addition, a stable DC bias can be induced using RF power. Of course, it is possible to generate plasma 194 using a high DC voltage instead of RF power, with appropriate modifications to the biasing hardware (see, for example, the discussion of FIG. 40 below).

In FIG. 31, coupling RF power to electrodes 80 and 82 allows a uniform potential to build across substrate 8 while employing low RF powers, for example, 50W to 150W, which is less than the 350W to 600W required in conventional plasma reactors. The frequency of the RF bias power can be 400 kHz, 13.56 MHz, or higher (e.g., 200 MHz). The low frequency, however, can lead to a broad ion energy distribution with high energy tails which may cause excessive sputtering. The higher frequencies (e.g., 13.56 MHz or greater) lead to tighter ion energy distributions with lower mean ion energies, which is favorable for modulated ion-induced ALD deposition processes. The more uniform ion energy distribution occurs because the bias polarity switches before ions can impinge on substrate 8, such that the ions see a time-averaged potential.

In conventional plasma reactors, RF power is applied to the top boundary of the process chamber, usually a showerhead. This causes sputtering of the top boundary, which is a major source of impurity incorporation (typically aluminum or nickel) and/or particulate incorporation in conventionally deposited films. The sputtering also transfers kinetic energy to the reactor structure, heating it considerably and requiring active cooling of the reactor structure.

In the present embodiments, RF power is applied to electrodes 80 and 82 (FIG. 31) embedded in ESC 6 of ESC assembly 106 of ALD reactor 100 (FIG. 12), rather than to showerhead 172 (FIG. 13). This minimizes sputtering of showerhead 172 and allows better control of the bias induced on substrate 8. It also avoids excessive heating of chamber lid 10, minimizing any cooling requirements.

Referring to FIG. 13, showerhead 172 and shield 14 are grounded so that the higher plasma sheath voltage drop is localized mostly on substrate 8 where deposition takes place. This is because the voltage ratio $V_{hot}/V_{cold}$ is proportional to the respective electrode areas according to $(A_{cold}/A_{hot})^n$, where n is greater than one. $V_{hot}$ is the plasma sheath voltage drop at the powered, or "hot," electrode, that is, ESC 6 of ESC assembly 106. $V_{cold}$ is the voltage drop at the non-powered, or "cold," electrode, that is, showerhead 172 and shield 14. The combined areas of showerhead 172 and shield 14 can be jointly considered as the area of the cold electrode. This is because the small volume of process chamber 12 results in a showerhead 172 to ESC 6 spacing that is small (nominally 0.3 to 0.6 inches) so that the powered electrode can "see" showerhead 172 and shield 14 as a single ground reference. Taken together, these combined areas are larger than the area of substrate 8, or the area of the hot electrode. Thus, for this reactor, $A_{cold}/A_{hot} > 1$.

In addition, by applying RF power to ESC 6 via electrodes 80 and 82 (FIG. 31), a low RF power can be used to simultaneously generate plasma 194 (FIG. 13) and to keep the energy of the impinging ions from plasma 194 low and controlled. The ion energy is given by $E=e|V_p|+e|V_{bias}|$, where $V_p$ is the plasma potential and $V_{bias}$ is the bias voltage induced on substrate 8. The induced bias voltage is controlled by the applied RF power. The induced bias voltage increases with increasing RF power and decreases with decreasing RF power. Increasing the RF power also generally increases the number of ions generated. Referring to FIG. 13, cooling plate 110 and baseplate 112 are grounded. Therefore, each clamp ring fastener 180 is also grounded. Process kit 182, which is made of an insulating material, electrically shields fasteners 180 so that plasma 194 is not affected by the ground voltage of fasteners 180.

Figure 32:
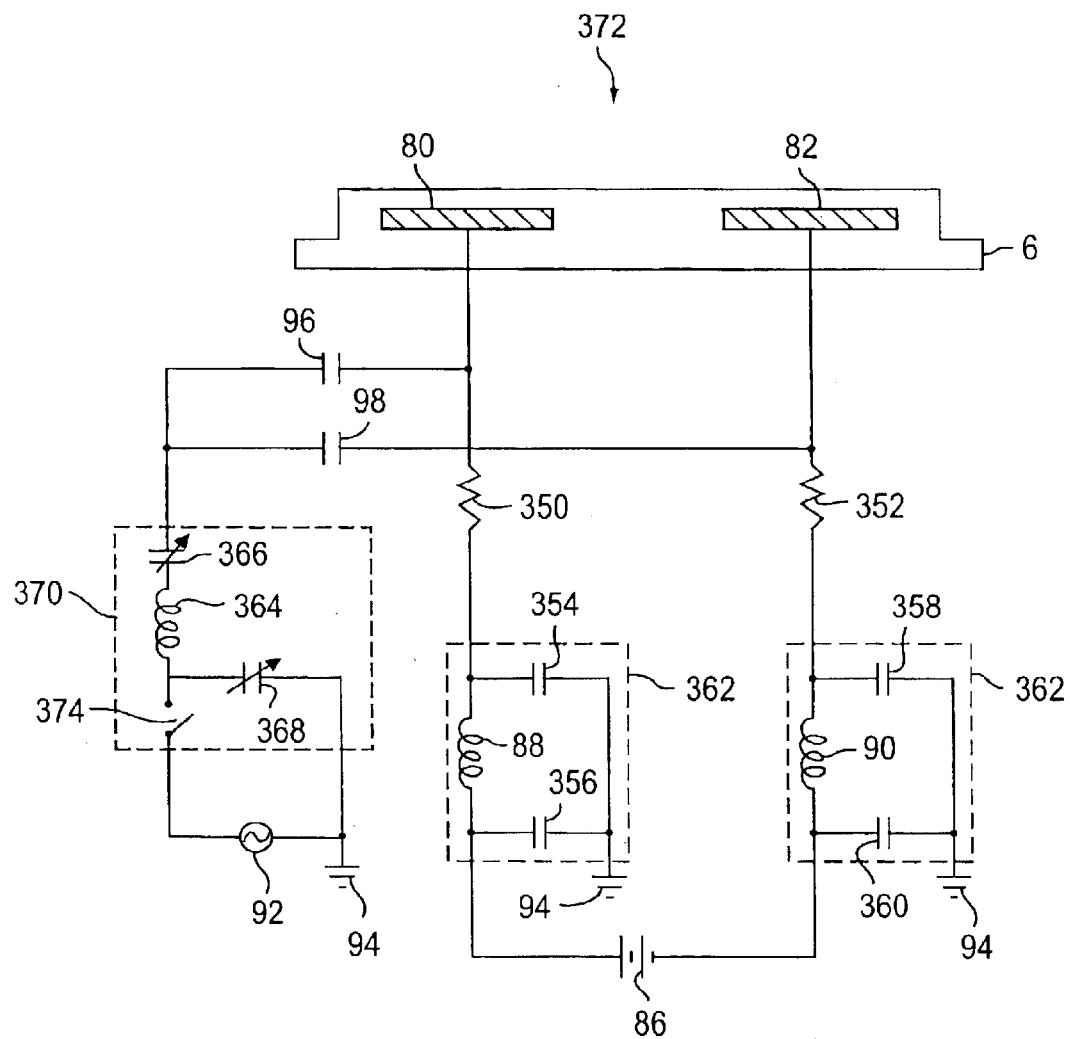
FIG. 32 is a schematic diagram of a circuit for electrical biasing of the electrostatic chuck of the ALD reactor of FIG. 8.
Figure 33:
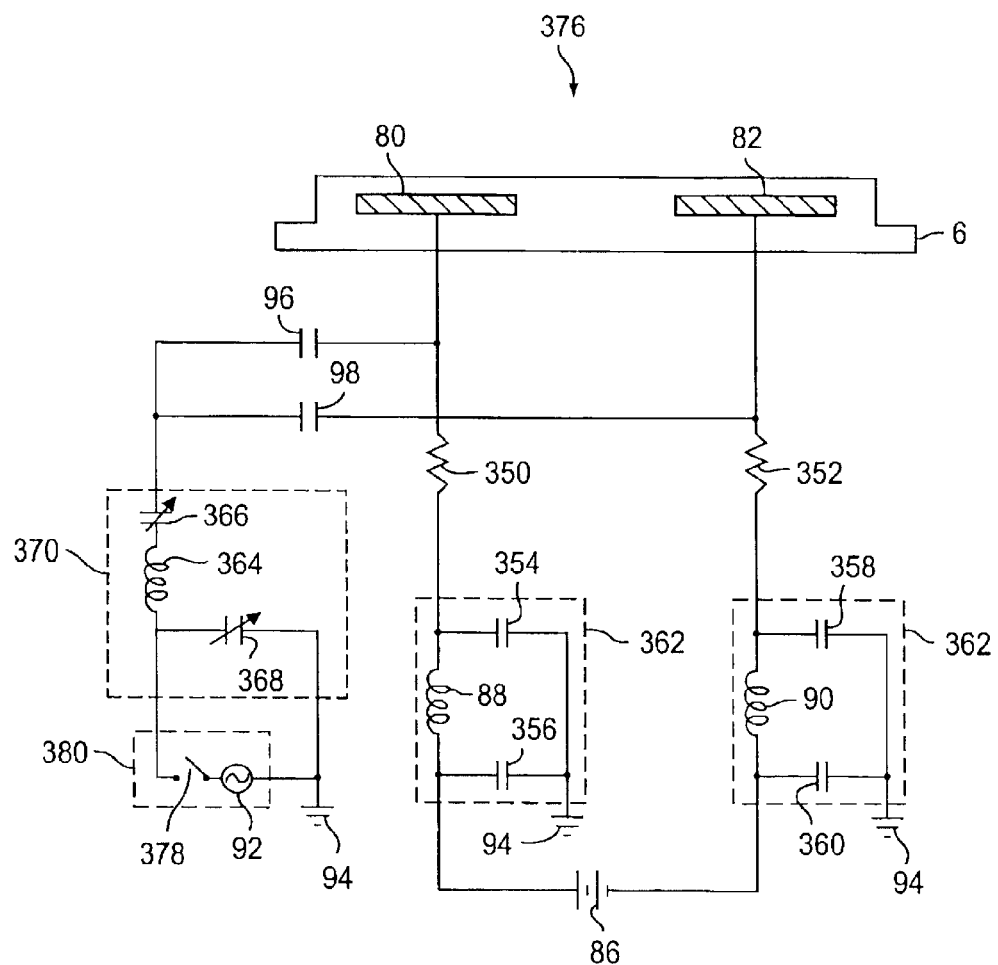
FIG. 33 is a schematic diagram of a circuit for electrical biasing of the electrostatic chuck of the ALD reactor of FIG. 8.

Plasma 194 can be controlled in a variety of ways. For example, plasma 194 can be controlled by varying the applied RF power. In some alternative embodiments of circuits for electrical biasing of ESC 6 of ALD reactor 100 (FIG. 12 and FIG. 13), a switch may be included, for example, in RF impedance matching circuit 370 or with RF generator 92 (FIG. 31). FIG. 32 is a schematic diagram of a circuit 372, including an RF match switch 374 in RF impedance matching circuit 370, for electrical biasing of ESC 6. FIG. 33 is a schematic diagram of a circuit 376, including an RF supply switch 378 in an RF power supply 380 (which also includes RF generator 92), for electrical biasing of ESC 6. Circuit 372 (FIG. 32) and circuit 376 (FIG. 33) are similar to circuit 348 (FIG. 31), except for switches 374 and 378. Switches 374 and 378 can be opened to isolate RF generator 92, or switches 374 and 378 can be closed to apply RF power to electrodes 80 and 82. Switches 374 and 378 enable a plasma response time in the 100 ms time range.

Plasma 194 (FIG. 13) can also be controlled by varying gas pressure while using, for example, circuit 348 of FIG. 31 with an RF power constantly applied to electrodes 80 and 82. Referring to FIG. 15, FIG. 16, and FIG. 17, as discussed previously, shield 14 forms a shield conductance upper path 22 with showerhead 172 and chamber lid 10. Shield 14 also forms a shield conductance lower path 24 with shadow ring 28. The conductances of upper and lower paths 22 and 24 are varied by precision movement of shield 14 by linear motor 122 (FIG. 8).

The conductances of upper and lower paths 22 and 24 directly affect the pressure in process chamber 12 and can be used to vary that pressure. For example, a high pressure (i.e., relative to the pressure of annular pumping channel 20) can be established in chamber 12 using a low conductance process shield position 210 as shown in FIG. 15. High pressure will strike plasma 194 (FIG. 13) given a favorable ambient in chamber 12. A low pressure can be established in chamber 12 using a purge shield position 214, as shown in FIG. 17, to expose chamber 12 to annular pumping channel 20. Low pressure will effectively terminate plasma 194 since not enough gas phase collisions will occur to sustain plasma 194. Applying RF power to electrodes 80 and 82 at pressures that will not strike or sustain plasma 194 will cause 100% reflection of the output power from RF generator 92 (FIG. 31). Thus, RF generator 92 should be capable of absorbing this power without detrimental effects.

Plasma 194 (FIG. 13) can also be controlled by a combination of varying gas pressure and applied RF power. For example, plasma 194 may be ignited by a high pressure and favorable ambient in chamber 12. Plasma 194 may be terminated by a switch, such as switch 374 in circuit 372 of FIG. 32 or switch 378 in circuit 376 of FIG. 33.

Practitioners will appreciate that various other embodiments of circuit 348 of FIG. 31 and its various constituents, for electrical biasing of ESC 6, are possible. For example, multiple RF sources may be utilized.

ALD Processes: Background and Novel Processes

FIG. 34 is a schematic illustration of a conventional ALD process. In a typical ALD cycle, which usually includes four steps, each precursor (or reactant) is introduced sequentially into the chamber, so that no gas phase intermixing occurs. First, a first gaseous precursor 382 (labeled Ax) is introduced into the deposition chamber, and a monolayer of the reactant is chemisorbed (or physisorbed) onto the surface of a substrate 8 forming a chemisorbed precursor A 384 as shown in FIG. 34(a). A free ligand x 386 is created by the chemisorption of precursor Ax 382. Second, excess gaseous precursor Ax 382 and ligands x 386 are pumped out, possibly with the aid of an inert purge gas, leaving the monolayer of chemisorbed precursor A 384 on substrate 8 as shown in FIG. 34(b).

Figure 34A:
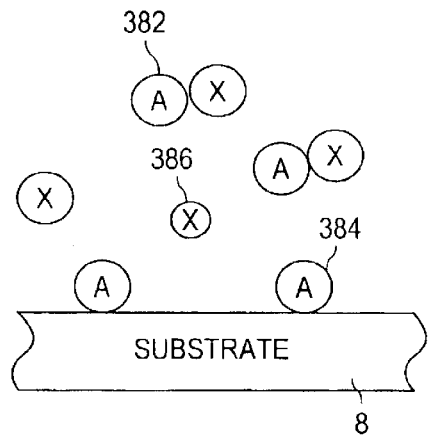
FIG. 34 is a schematic illustration of a conventional ALD process.
Figure 34B:
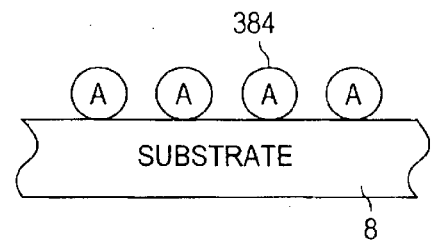
Figure 34C:
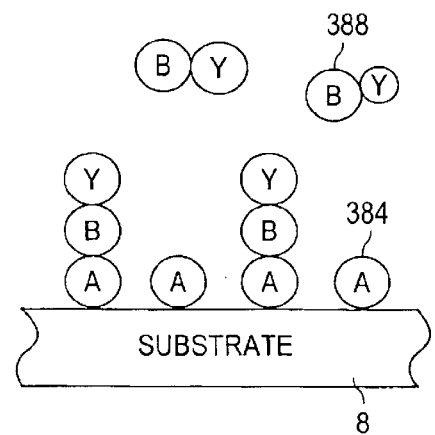
Figure 34D:
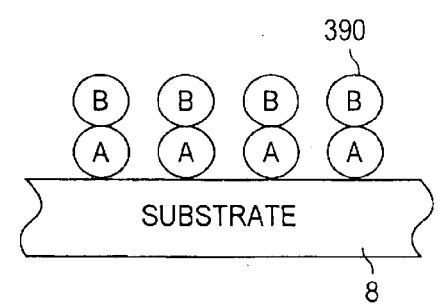

Third, a second gaseous precursor 388 (labeled By) is introduced into the deposition chamber. Precursor By 388 reacts with chemisorbed precursor A 384 on substrate 8 as shown in FIG. 34(c) in a self-limiting surface reaction. The self-limiting reaction halts once initially adsorbed precursor A 384 fully reacts with precursor By 388. Fourth, excess gaseous precursor By 388 and any reaction by-products are pumped out, again possibly with the aid of an inert purge gas, leaving behind an AB monolayer 390 of the desired thin film as shown in FIG. 34(d). A desired film thickness is obtained by repeating the deposition cycle as necessary. The film thickness can be controlled to atomic layer (i.e., angstrom scale) accuracy by simply counting the number of deposition cycles.

ALD processes, however, are slower than traditional deposition techniques such as CVD and PVD. In order to improve throughput, shorter deposition cycles are desirable. One way to shorten the deposition cycle is to shorten the durations of the individual precursor and pump/purge steps. The individual pulse lengths, however, cannot be arbitrarily decreased. The first precursor pulse must be long enough to form an adsorbed layer of the first precursor on the substrate. The second precursor pulse must be long enough to allow complete reaction between the first and second precursors. The pump/purge pulses in between the precursor pulses must be long enough so that gas phase intermixing of the precursors does not occur. Gas phase intermixing can lead to gas phase reactions and/or particle formation, each of which can cause quality and reliability problems in the deposited film.

FIG. 35 is a schematic illustration of a novel ALD process. One deposition cycle includes two steps, rather than four, which improves process throughput and repeatability. In the base process, a substrate 8 is maintained at a precise temperature that promotes chemisorption rather than decomposition.

Figure 35A:
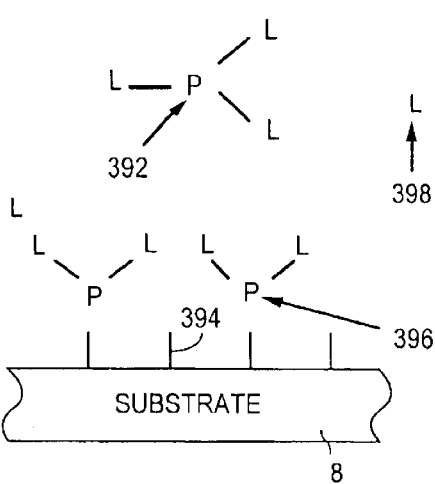
FIG. 35 is a schematic illustration of a novel ALD process.
Figure 35B:
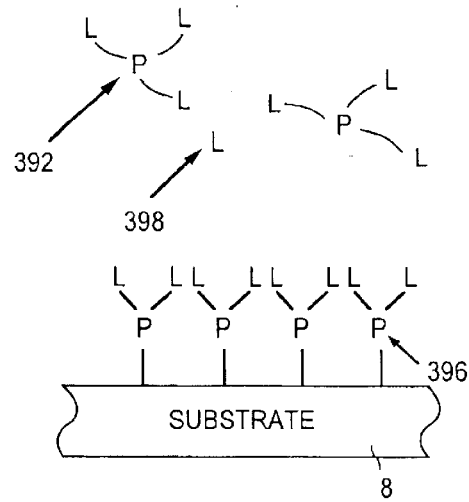

In the first step, a gaseous precursor 392 is introduced into the process chamber. Gaseous precursor 392 includes the desired thin film species (P) bonded with a plurality of ligands (L). Species P may be a single element (e.g., Ti, W, Ta, Cu) or a compound (e.g., $TiN_x$, $TaN_x$, or $WN_x$). In the novel ALD process, a molecule of gaseous precursor 392 interacts with a surface bond 394 to form a chemisorbed precursor 396 via a chemical bonding process that may create a plurality of free ligands 398 as shown in FIG. 35(a). As a result of the first step, a monolayer of chemisorbed precursor 396 is formed on substrate 8 as shown in FIG. 35(b).

Figure 35C:
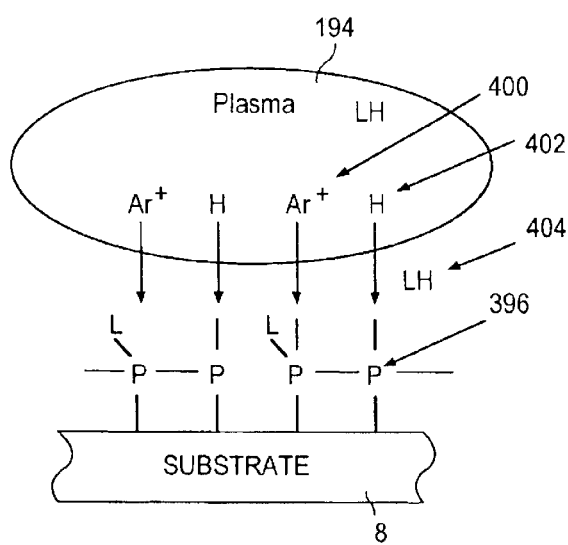

In the second step, an inert purge gas is introduced into the process chamber to purge excess gaseous precursor 392. The purge gas may include, for example, argon (Ar), diatomic hydrogen ($H_2$), and other optional species such as helium (He). RF power is applied (e.g., using a computer synchronized switch) during this second step to generate a plasma 194 in the process chamber, or the plasma is struck by an increased gas pressure under constant RF power. As shown in FIG. 35(c), plasma 194 includes a plurality of energetic ions 400 (e.g., $Ar^+$ ions) and a plurality of reactive atoms 402 (e.g., H atoms). Some of reactive atoms 402 may actually be ions.

Figure 35D:
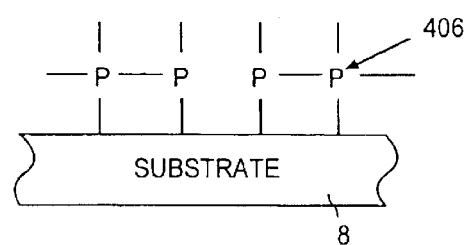

Ions 400 and atoms 402 impinge on the surface of substrate 8. Energetic ions 400 transfer energy to substrate 8, allowing reactive atoms 402 to react with chemisorbed precursor 396 and to strip away unwanted ligands (which form a plurality of volatile ligands 404) in a self-cleaning process. Reactive atoms 402, in conjunction with energetic ions 400, may thus be considered to act as a "second" precursor. When the plasma power is terminated, a monolayer 406, usually about one atomic layer of the desired species P, is left on substrate 8 as shown in FIG. 35(d). This two-step deposition cycle can be repeated as needed until the desired film thickness is achieved. The film thickness deposited per cycle depends on the deposited material. Typical film thicknesses range from 10–150 Å.

Typical precursors for tantalum (Ta) compounds include PDEAT [pentakis(diethylamido)tantalum], PEMAT [pentakis(ethylmethylamido)tantalum], $TaBr_5$, $TaCl_5$, and TBTDET [t-butylimino tris(diethylamino)tantalum]. Typical precursors for titanium (Ti) compounds include $TiCl_4$, TDMAT [tetrakis(dimethylamido)titanium], and TDEAT [tetrakis(diethylamino)titanium]. Typical precursors for copper (Cu) compounds include CuCl and Cupraselect® [(trimethylvinylsilyl)hexafluoroacetylacetonato copper I]. Typical precursors for tungsten (W) compounds include $W(CO)_6$ and $WF_6$. In contrast to conventional ALD processes, organometallic precursors can be used in novel ALD processes.

The purge pulse includes gas, or gases, that are inert (e.g., argon, hydrogen, and/or helium) to prevent gas phase reactions with gaseous precursor 392. Additionally, the purge pulse can include the same gas, or gases, needed to form energetic ions 400 (e.g., $Ar^+$ ions) and reactive atoms 402 (e.g., H atoms). This minimizes the gas switching necessary for novel ALD processes. Acting together, reactive atoms 402 react with chemisorbed precursor 396, while energetic ions 400 provide the energy needed to drive the surface reaction. Thus, novel ALD processes can occur at lower temperatures (e.g., T<300° C.) than conventional ALD processes (e.g., T~400–500° C.). This is especially important for substrates that already include low thermal stability materials, such as low-k dielectrics.

Since the activation energy for the surface reaction is provided by energetic ions 400 created in plasma 194 above substrate 8, the reaction will not generally occur without the energy provided by ion bombardment because the process temperature is kept below the temperature required for thermal activation. Thus, novel atomic layer deposition processes are ion-induced, rather than thermally induced. The deposition reaction is controlled by modulation of the energy of energetic ions 400, by modulation of the fluxes of energetic ions 400 and reactive atoms 402 impinging on substrate 8, or by modulation of both energy and fluxes. The energy (e.g., 10 eV to 100 eV) of energetic ions 400 should be high enough to drive the surface reaction, but low enough to prevent significant sputtering of substrate 8.

Figure 36A:
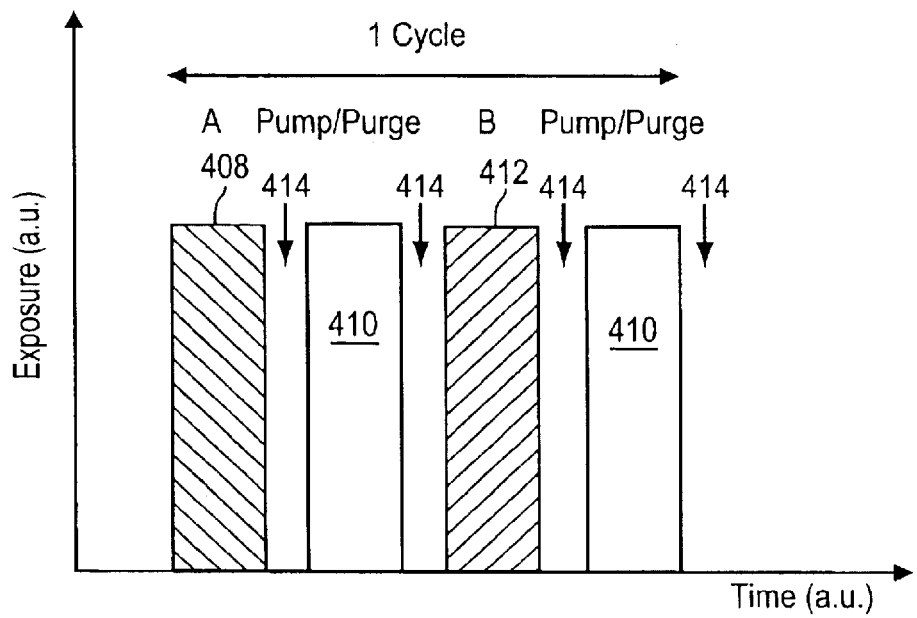
FIG. 36 shows timing diagrams for (a) a typical prior art ALD process and (b) a novel ALD process.

Timing diagrams for (a) a typical prior art ALD process and (b) a novel ALD process are compared in FIG. 36. FIG. 36(a) shows that one deposition cycle in a conventional ALD process includes a first precursor pulse 408, a purge/pump pulse 410, a second precursor pulse 412, and another purge/pump pulse 410. Each pulse is followed by a delay 414, which has a duration that is usually non-zero. Delays 414, during which only pumping occurs and no gases flow, are additional insurance against gas phase intermixing of first precursor pulse 408 and second precursor pulse 412. Delays 414 also provide time to switch gases with conventional valve systems.

The durations of first and second precursor pulses 408 and 412 may be between 200 ms and 15 sec. The duration of purge/pump pulses 410 may be 5–15 sec. The durations of delays 414 may be 200 ms to 5 sec. This results in deposition cycles from 11 sec to 75 sec. Thus, a 50 cycle deposition process could take over one hour.

Figure 36B:
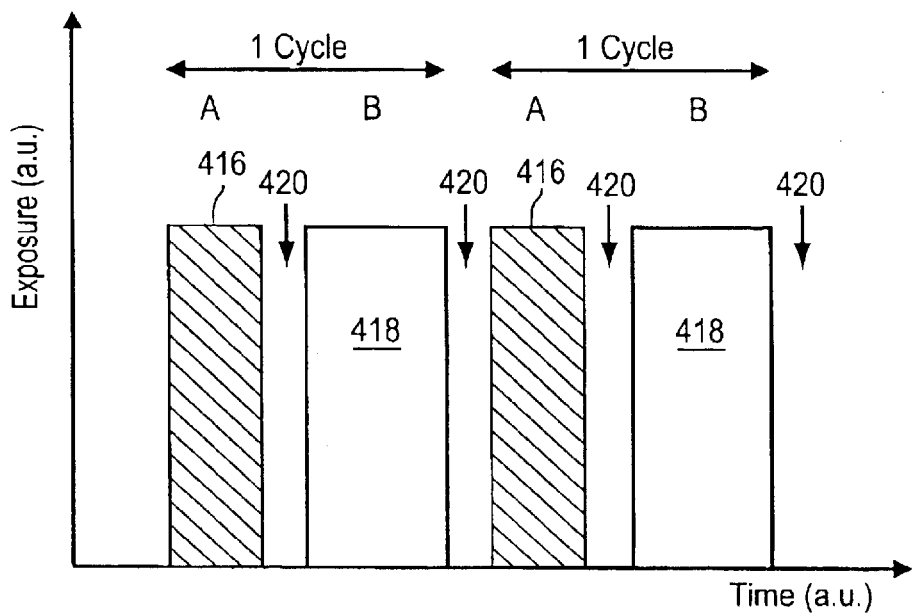

FIG. 36(b) shows two deposition cycles in the novel ALD process. One deposition cycle includes a first precursor pulse 416 and a purge gas pulse 418. Each pulse is followed by a delay 420. The elapsed time of one deposition cycle is significantly shorter in accordance with the novel process when compared to conventional ALD processes, thereby increasing process throughput.

Process throughput can be further increased if delays 420 have zero length. Zero-length delays can be accomplished using three-way valves (in particular showerhead three-way valve 148 of FIG. 8) or a similar configuration of on/off valves and fittings, which allow fast gas switching. Delays 420 of zero length are further facilitated in novel ALD processes by effective use of purge gas pulse 418, which may include a mixture of more than one gas. For example, the purge gas may include the "second" precursor source gas(es) (i.e., as shown in FIG. 35(c), reactive atoms 402, acting in conjunction with energetic ions 400, created during purge gas pulse 418). Additionally, the carrier gas for the first precursor (i.e., flowing during first precursor pulse 416) may be one of the source gases of the "second" precursor.

Practitioners will appreciate that alternative embodiments of novel ALD processes are possible. For example, in some embodiments, multiple precursors for compound thin films might be employed. In other embodiments, the deposition cycle of FIG. 36(b) might begin with a purge gas pulse 418, including a plasma, used as an in-situ clean to remove carbon-containing residues, native oxides, or other impurities. In these embodiments, reactive atoms 402 (e.g., H atoms in FIG. 35(c)) react with carbon and oxygen to form volatile species (e.g., $CH_x$ and $OH_x$ species). Energetic ions 400 (e.g., $Ar^+$ and/or $He^+$ ions in FIG. 35(c)) improve dissociation (e.g., of $H_2$) and add a physical clean (e.g., via sputtering by $Ar^+$ ions generated in the plasma). In still other embodiments, reactive atoms 402 may not be needed and plasma 194 may not include reactive atoms 402.

Additional information regarding in-situ cleaning in atomic layer deposition may be found in related U.S. Provisional Application Ser. No. 60/255,812, entitled "Method For Integrated In-Situ Cleaning And Subsequent Atomic Layer Deposition Within A Single Processing Chamber," filed Dec. 15, 2000.

Alternative Novel ALD Processes

The novel ALD process described previously may be modified to further increase performance. Alternative novel ALD processes may address faster purging of precursors, rapid changes in the conductance of the process chamber, state-based changes from one step to the next, self-synchronization of the process steps, and/or various plasma generation and termination options. Such alternatives can be used to further decrease the length of a deposition cycle, thereby increasing throughput.

For example, in some novel ALD process embodiments, it is desirable to quickly purge a gaseous precursor 392 from the process chamber after formation of a monolayer of chemisorbed precursor 396 on substrate 8 (FIG. 35(b)). This can be accomplished using the in-process tunable conductance achieved by shield 14 (FIG. 13), which can be moved during the deposition cycle. Referring to FIG. 15, FIG. 16, and FIG. 17, as discussed previously, shield 14 forms shield conductance upper path 22 with showerhead 172 and chamber lid 10. Shield 14 also forms shield conductance lower path 24 with shadow ring 28. The conductances of upper and lower paths 22 and 24 are varied by precision movement of shield 14 by linear motor 122 (FIG. 8).

It is possible, therefore, to rapidly increase the chamber conductance by lowering shield 14 after exposing substrate 8 to gaseous precursor 392. For example, a purge shield position 214 may be used (FIG. 17). Lowering shield 14 opens up shield conductance upper and lower paths 22 and 24 to annular pumping channel 20. The low pressure of pumping channel 20 will hasten removal of excess gaseous precursor 392, and by-products such as free ligands 398 (FIG. 35(b)), from process chamber 12. Simultaneously, the purge gas (e.g., Ar, $H_2$, and/or He) is flowed to assist in purging excess gaseous precursor 392 and by-products from chamber 12. Lowering shield 14 also leads to a drop in the pressure in chamber 12 through exposure of chamber 12 to annular pumping channel 20. Shield 14 can then be moved back up, for example, to a position similar to shield position 212 of FIG. 16, to decrease the conductance and raise the pressure in chamber 12 (assuming constant gas flow) in order to strike plasma 194 (FIG. 35(c)).

In particular, plasma 194 can be generated while using, for example, circuit 348 of FIG. 31. Application of RF power may be synchronized (e.g., by computer control) with the position of shield 14 (FIGS. 15–17) to generate plasma 194 in chamber 12 (FIG. 13). Alternatively, if RF bias power is constantly applied to electrodes 80 and 82 using circuit 348 (FIG. 31), high pressure (i.e., relative to the pressure of annular pumping channel 20) in process chamber 12 can be used to trigger plasma 194 (FIG. 13). Low pressure (i.e., near the pressure of annular pumping channel 20) will effectively terminate plasma 194 since not enough collisions will occur to sustain plasma 194.

FIG. 37 shows timing diagrams for an alternative ALD process embodiment, as discussed above. FIG. 37(a) shows two deposition cycles including a first precursor pulse 416 followed by a purge gas pulse 418 with zero length delays after each pulse. FIG. 37(b) shows the corresponding chamber conductance. Each one of a plurality of low conductance periods 422 (corresponding to raised shield positions) is separated from another by one of a plurality of high conductance periods 424 (corresponding to lowered shield positions). High conductance periods 424 occur at the beginning and end of each purge gas pulse 418 to assist in purging chamber 12 (FIG. 13) of resident gases.

FIG. 37(c) shows the corresponding pressure in chamber 12 (FIG. 13). A low conductance period 422 results in a high pressure period 426. A high conductance period 424 results in a low pressure period 428. FIG. 37(c) also shows a plurality of "plasma on" periods 430 and a plurality of "plasma off" periods 432. Plasma on periods 430 occur during each high pressure period 426 during purge gas pulses 418. As discussed, the RF power to generate plasma 194 (FIG. 13) may be synchronized with the shield position. Alternatively, the plasma can be ignited by high pressure (in the presence of the purge gas) and terminated by low pressure, while RF bias power is constantly supplied to electrodes 80 and 82 embedded in ESC 6 (FIG. 31).

Conventional ALD hardware and processes rely on the precise timing of the individual precursor pulses 408 and 412 and purge/pump pulses 410 (FIG. 36(a)) to decrease the deposition cycle length and ensure proper process performance. These time-based processes rely on several assumptions including that steady state conditions exist, that all ALD reactors behave similarly, and that all gases and processes are "on time."

In contrast, some novel ALD process embodiments can use a state-based approach, rather than a time-based approach, to synchronize the individual pulses. This can provide self-synchronization of the individual pulses for improved process speed, control, and reliability. Instead of introducing a next gas pulse (with a fixed duration) a predetermined time after the introduction of the previous fixed duration gas pulse, subsequent gas pulses can be triggered based upon a change in the pressure state of process chamber 12 (FIG. 13). This can be accomplished using a pressure switch mounted in chamber body 18 capable of sensing changes in the pressure of process chamber 12. The pressure can be modulated via the in-process tunable conductance, achieved by a shield 14 that can be moved during the deposition cycle, as described previously.

FIG. 38 shows timing diagrams for another alternative embodiment of a novel ALD process. The ALD process of FIG. 38 is similar to the ALD process of FIG. 37, but it has an alternate plasma termination technique. Accordingly, to avoid redundancy, the discussion focuses on differences in the embodiments.

Figure 38A:
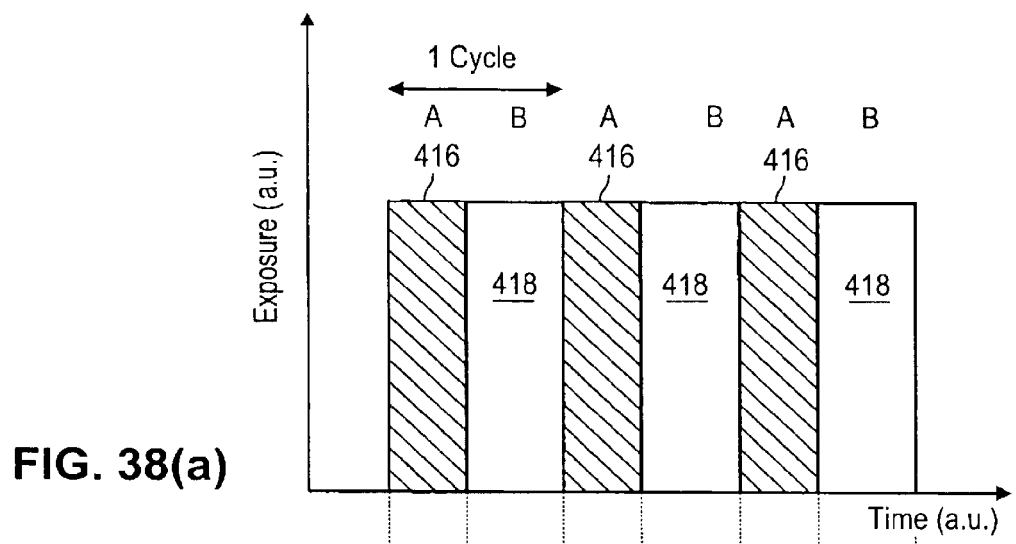
FIG. 38 shows timing diagrams for an alternative embodiment of a novel ALD process.
Figure 38B:
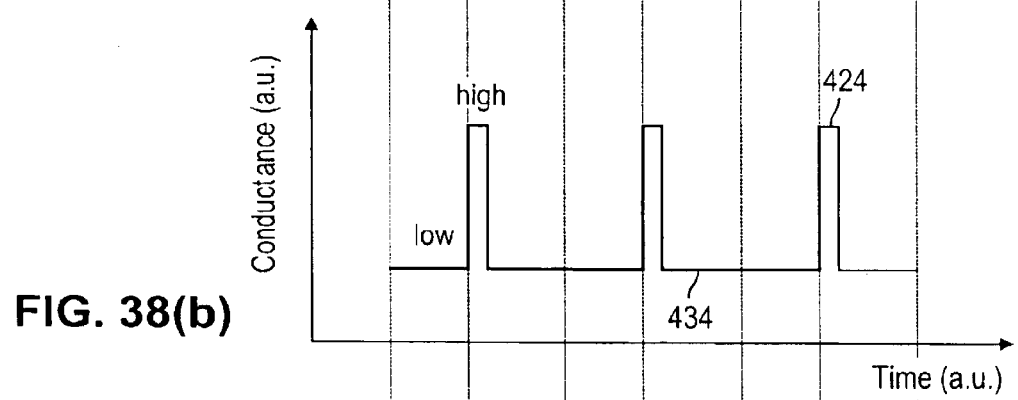
Figure 38C:
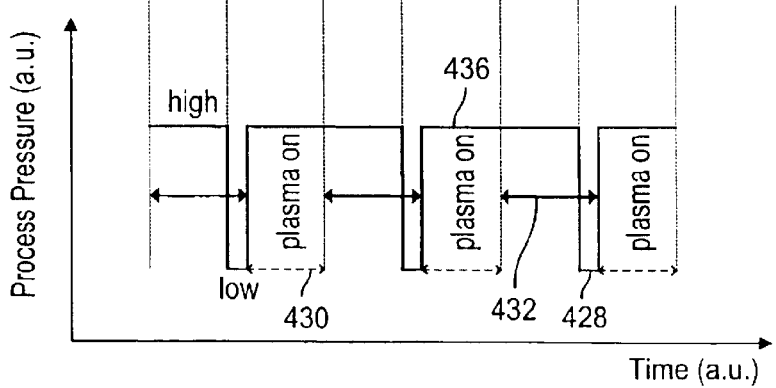

In the ALD process of FIG. 38, shield 14 is lowered only after each precursor pulse 416 to assist in purging excess gaseous precursor 392 and free ligands 398 from chamber 12 (see also FIG. 17 and FIG. 35(b)). The number of high conductance periods 424 in FIG. 38(b), corresponding to low pressure periods 428 in FIG. 38(c), is reduced. Thus, a low conductance period 434 in FIG. 38(b) (corresponding to a high pressure period 436 in FIG. 38(c)) extends from purge gas pulse 418 into the following precursor pulse 416 in FIG. 38(a). In this embodiment, the plasma is ignited by, or synchronized with, the high pressure in chamber 12 (FIG. 13). Plasma on periods 430 occur during each high pressure period 436 during purge gas pulses 418. Plasma 194 (FIG. 13) is terminated for subsequent plasma off periods 432 (during precursor pulses 416) by a means other than pressure change, which may include, for example, disconnecting the RF power using a switch or setting the RF output power to zero. A switch could be located, for example, in RF impedance matching circuit 370 or in RF power supply 380 (FIG. 32 and FIG. 33). Actuation of such a switch would be synchronized with the deposition steps by, for example, a computer.

Novel Chemisorption Technique for ALD Processes

The chemisorption of a gaseous precursor (e.g., precursor 392 in FIG. 35(a)) onto a substrate 8 may be improved by biasing substrate 8 during first precursor pulse 416 (FIG. 36(b)). As discussed previously with reference to FIG. 35(a), when a molecule of gaseous precursor 392 arrives at substrate 8, which is heated, a weakly bonded ligand will cleave off of the molecule, forming free ligand 398. This actually leaves the precursor molecule with a net charge (either positive or negative). An opposite-polarity, low DC bias (e.g., $|50V|<|V_{bias}|<0V$) applied to substrate 8 will attract the charged precursor molecule to substrate 8 and orient it so that the desired atom is bonded to substrate 8 to form chemisorbed precursor 396. The lowest possible bias (e.g., $|10V|<|V_{bias}<0V$) that generates a moment on the charged precursor molecule is desirable to correctly orient the charged precursor molecule with minimal charging of substrate 8.

This novel chemisorption technique for ALD processes promotes uniform and complete (i.e., saturated) chemisorption with a specified orientation on dielectric and metallic surfaces so that high quality, reproducible layer-by-layer growth can be achieved using ALD. The novel chemisorption technique is particularly effective for the first few precursor monolayers, where, in the absence of this technique, precursor molecules may chemisorb with a random orientation. This method is also particularly effective in the case of organometallic precursors such as those mentioned previously.

Figure 39A:
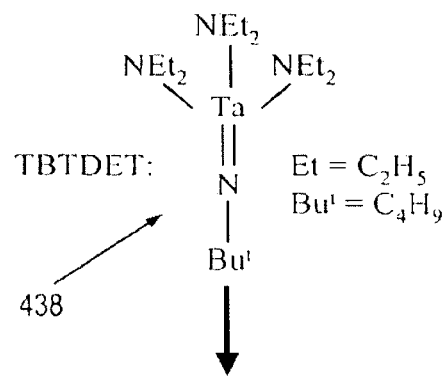
FIG. 39 is a schematic illustration of a novel chemisorption technique for ALD processes.
Figure 39A:
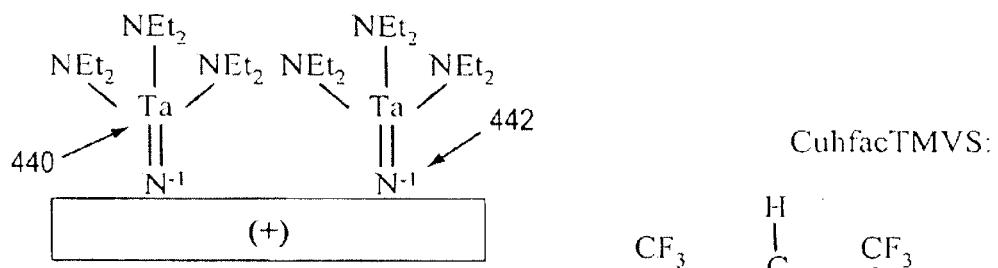

FIG. 39 is a schematic illustration of the novel chemisorption technique for ALD processes to deposit thin films, for example, for copper interconnect technology. Two thin films used in copper interconnect technology are a barrier/adhesion layer and a copper seed layer. FIG. 39(a) illustrates chemisorption of TaN, a typical barrier/adhesion layer material. In the case of a precursor TBTDET 438, the Bu' ligand may cleave. A now negatively charged precursor 440 then orients with a negatively charged nitrogen 442 (e.g., the $N^{-1}$) toward substrate 8, which is positively biased, for chemisorption. If an $NEt_2$ ligand is cleaved instead, then the Ta becomes positively charged and a negative bias applied to substrate 8 would orient the Ta toward substrate 8 for chemisorption.

Figure 39B:
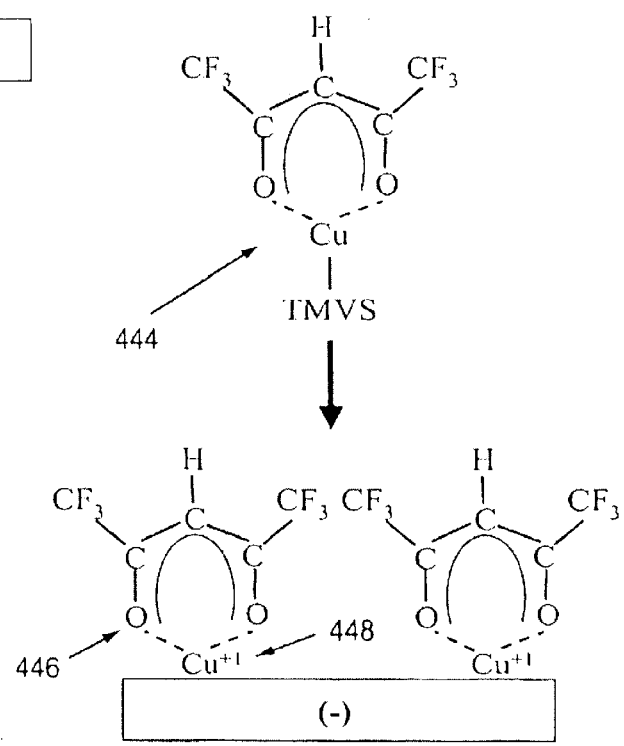

FIG. 39(b) illustrates chemisorption of Cupraselect® (CuhfacTMVS), a typical copper seed layer material. In the case of a precursor CuhfacTMVS 444, the TMVS ligand is cleaved. A now positively charged precursor 446 then orients with a positively charged copper 448 (e.g., the $Cu^{+1}$) toward substrate 8, which is negatively biased, for chemisorption.

In some embodiments, the novel chemisorption technique may include an in-situ clean prior to introduction of the first precursor to promote high quality film deposition. As discussed above in reference to FIG. 36(b), a purge gas pulse 418 (e.g., including Ar, $H_2$ and/or He) can be used as an in-situ clean to remove carbon-containing residues, native oxides, or other impurities (see, for example, application Ser. No. 60/255,812, referenced above). Removing native oxides from metal layers is especially important for low resistance and good mechanical adhesion of the film to substrate 8 (FIG. 39). H atoms can react with carbon and oxygen to form volatile species (e.g., $CH_x$ and $OH_x$ species). $Ar^+$ or $He^+$ ions improve dissociation (e.g., of $H_2$) and add a physical clean (e.g., via sputtering by $Ar^+$ ions generated in the plasma). The gas ratios can be tailored to alter the physical versus chemical components of the in-situ clean.

Figure 40:
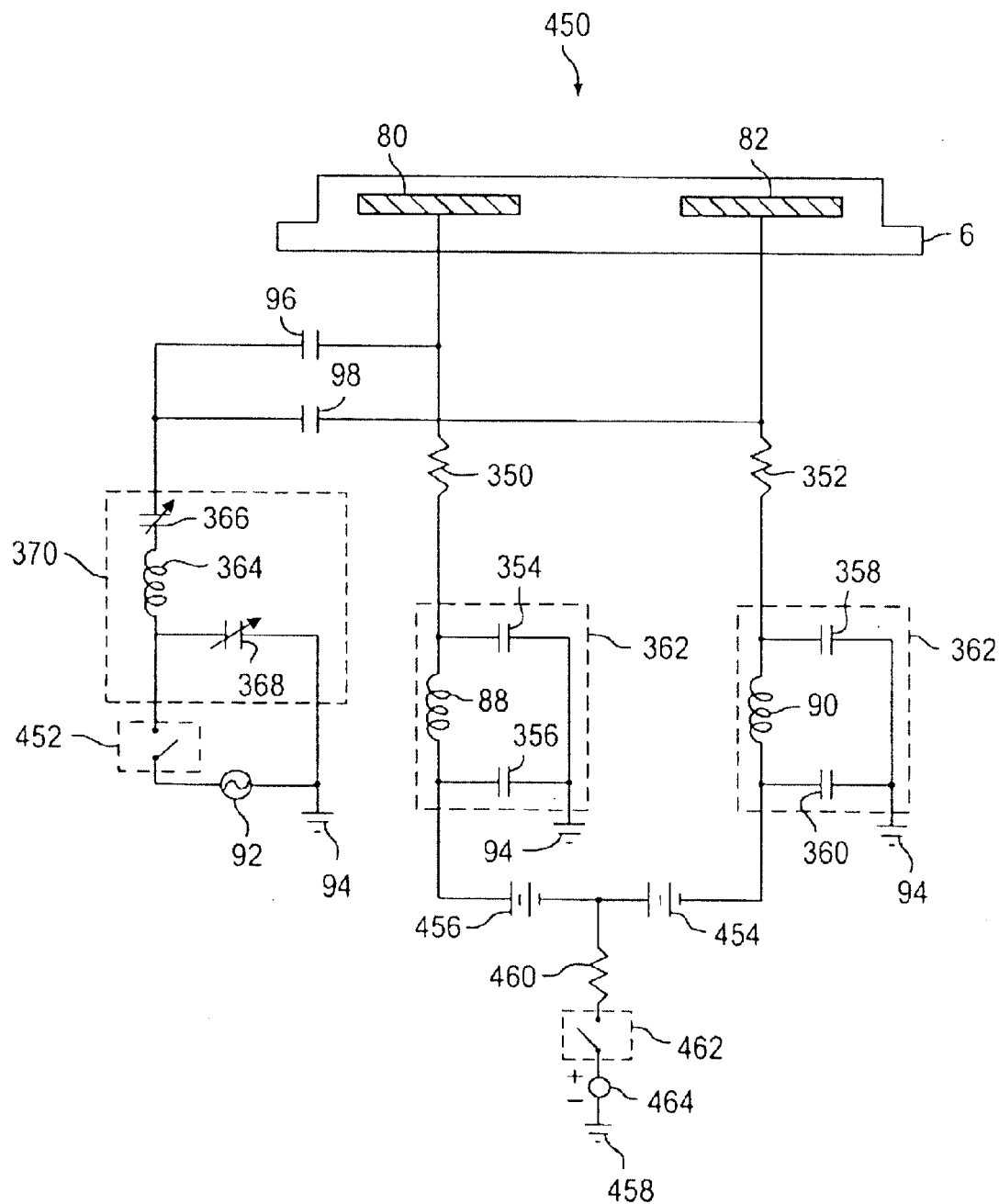
FIG. 40 is a schematic diagram of a circuit for electrical biasing of the electrostatic chuck of the ALD reactor of FIG. 8 for improved chemisorption.

FIG. 40 is a schematic diagram of a circuit 450 for electrical biasing of ESC 6 of ALD reactor 100 (FIG. 12) for the novel chemisorption technique described above. The use of ESC 6 helps provide a uniform bias to substrate 8 (FIG. 39). Circuit 450 of FIG. 40 is similar to circuit 372 of FIG. 32 and circuit 376 of FIG. 33. Accordingly, to avoid redundancy, the discussion will focus on differences between circuit 450 and circuits 372 and 376.

In FIG. 40, with the RF power from RF generator 92 decoupled by opening an RF power switch 452, a first DC power supply 454 and a second DC power supply 456, which are serially coupled matching supplies, perform the function of DC power supply 86 in FIGS. 32 and 33 to maintain the potential difference between electrodes 80 and 82. This potential difference provides the "chucking" action that holds substrate 8 (FIG. 39) to ESC 6. Serially coupled between the common node (labeled A) of DC power supplies 454 and 456 and a ground terminal 458 are a current suppression resistor 460, a DC power switch 462, and a DC reference voltage source 464. Ground terminal 458 may be the same ground reference as ground terminal 94.

With DC power switch 462 closed, the reference voltage of electrodes 80 and 82 (and therefore of substrate 8 during chemisorption as shown in FIG. 39) is established by DC reference voltage source 464. Current suppression resistor 460 limits the current from DC reference voltage source 464. DC reference voltage source 464 is capable of providing a positive or negative voltage, as needed for biasing substrate 8 (FIG. 39). The voltage level provided by DC reference voltage source 464 may additionally reduce the time required to chemisorb a complete monolayer. This may allow a reduction in the duration of first precursor pulse 416 (FIG. 36(b)) and/or a reduction in the precursor partial pressure during first precursor pulse 416.

Once chemisorption is complete, DC power switch 462 is opened to isolate voltage source 464 and to electrically float first and second DC power supplies 454 and 456. RF power switch 452 is closed to reconnect RF generator 92. The remainder of the ALD process continues as described previously.

In some embodiments of ALD processes, it is possible to use a circuit similar to circuit 450 of FIG. 40 to generate plasma 194 above substrate 8 (FIG. 13) by biasing ESC 6 using a high DC voltage (e.g., 500 V or higher). In this case, RF generator 92, RF impedance matching circuit 370, and capacitors 96 and 98 would not be used. DC reference voltage source 464 would supply at least two distinct voltages, or switch 462 would alternate between two distinct voltage sources. The first voltage would be a low DC voltage coupled to electrodes 80 and 82 during plasma off periods 432 (FIG. 37). The low DC voltage might be zero volts, or a non-zero low voltage used to orient precursor molecules for improved chemisorption as discussed above. The second voltage would be a high DC voltage coupled to electrodes 80 and 82 during plasma on periods 430 (FIG. 37) to generate plasma 194.

The novel ALD reactor is particularly suitable for thin film deposition, such as barrier layer and seed layer deposition, but the teachings herein can be applied to many other types of reactors and many other types of thin films (e.g., low-k dielectrics, gate dielectrics, optical films, etc.). The foregoing embodiments of the ALD reactor, and all its constituent parts, as well as the ALD processes disclosed herein are intended to be illustrative and not limiting of the broad principles of this invention. Many additional embodiments will be apparent to persons skilled in the art. The present invention includes all that fits within the literal and equitable scope of the appended claims.

What is claimed is:

1. A method of modulating a pressure in a processing chamber, the process chamber being defined by a process chamber enclosure having a surrounding wall, method comprising the acts of:

creating a pressure differential between the process chamber and a volume exterior to the process chamber;

flowing at least one gas between the process chamber and the volume exterior to the process chamber; and varying at least one conductance path of the at least one gas by moving at least a portion of the surrounding wall of the process chamber enclosure.

2. The method of claim 1 wherein flowing the at least one gas comprises flowing at least one gas in an atomic layer deposition process.

3. The method of claim 1 wherein flowing the at least one gas comprises flowing in a cyclic process a first gas followed by a second gas, the second gas being different from the first gas.

4. The method of claim 1 wherein flowing at least one gas comprises flowing the at least one gas through gas channel openings in the portion of the process chamber enclosure.

5. The method of claim 1 wherein the process chamber comprises a chamber top, and wherein flowing at least one gas comprises flowing the at least one gas through gas channel openings in the chamber top.

6. The method of claim 1 wherein the portion of the process chamber enclosure forms a lateral wall of the process chamber enclosure.

7. The method of claim 1 wherein the at least one conductance path comprises a first variable gas conductance path and a second variable conductance path.

8. The method of claim 1 wherein moving the portion of the process chamber enclosure comprises changing a gap between the portion of the process chamber enclosure and another part of the process chamber enclosure, the gap forming at least part of the conductance path.

9. The method of claim 1 wherein moving the portion of the process chamber enclosure comprises changing a length of a restricted region between the portion of the process chamber enclosure and another part of the process chamber enclosure, the restricted region forming at least part of the conductance path.

10. The method of claim 1 wherein moving the portion of the process chamber enclosure comprises moving the portion of the process chamber enclosure in a direction perpendicular to a surface of a substrate within the process chamber.

11. The method of claim 1 further comprising using an electrostatic chuck to retain a substrate within the process chamber.

12. The method of claim 11 wherein the chuck is located at a bottom of the process chamber.

13. The method of claim 1 further comprising cooling the portion of the process chamber enclosure by flowing a coolant through at least one cooling channel within the portion of the process chamber enclosure.

14. The method of claim 1 further comprising using a linear motor to move the portion of the process chamber enclosure.

15. The method of claim 1 further comprising introducing a substrate into the process chamber through a substrate entry opening, the entry opening allowing access to the process chamber only when the portion of the process chamber enclosure is in a first position.

* * * * *